US012635215B2

(12) United States Patent
Jang et al.

(10) Patent No.: US 12,635,215 B2
(45) Date of Patent: May 19, 2026

(54) SEMICONDUCTOR DEVICE INCLUDING MULTI-BRIDGE CHANNEL FIELD EFFECT TRANSISTOR AND MULTIPLE VIA STRUCTURE

(71) Applicant: SAMSUNG ELECTRONICS CO., LTD., Suwon-si (KR)

(72) Inventors: Sang Shin Jang, Suwon-si (KR); Jong Min Baek, Suwon-si (KR); Sun Ki Min, Suwon-si (KR); Na rae Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 409 days.

(21) Appl. No.: 18/350,614

(22) Filed: Jul. 11, 2023

(65) Prior Publication Data

US 2024/0128332 A1     Apr. 18, 2024

(30) Foreign Application Priority Data

Oct. 12, 2022   (KR) ........................ 10-2022-0130589
Mar. 15, 2023   (KR) ........................ 10-2023-0033947

(51) Int. Cl.
    *H10D 64/23*     (2025.01)
    *H01L 23/48*     (2006.01)
           (Continued)

(52) U.S. Cl.
    CPC ......... *H10D 64/251* (2025.01); *H01L 23/481* (2013.01); *H01L 23/5226* (2013.01); *H10D 84/83* (2025.01)

(58) Field of Classification Search
    CPC .... H10D 64/251; H10D 84/83; H01L 23/481; H01L 23/5226; H01L 23/485
    See application file for complete search history.

(56) References Cited

U.S. PATENT DOCUMENTS 10,770,479 B2   9/2020  Smith et al.
10,872,818 B2   12/2020  Chiang et al.
        (Continued)

FOREIGN PATENT DOCUMENTS

KR     20210120399 A   10/2021
KR     20220093981 A   7/2022

OTHER PUBLICATIONS

Search history using Orbit.*

*Primary Examiner* — Changhyun Yi
(74) *Attorney, Agent, or Firm* — Wolf, Greenfield & Sacks, P.C.

(57) ABSTRACT

A semiconductor device including a lower insulating layer, a field insulating layer on the lower insulating layer, an upper insulating layer on the field insulating layer, a first through via in the upper insulating layer, a second through via in the field insulating layer, and a third through via in the lower insulating layer. The second through via is connected to the first and third through vias, a width of a top surface of the second through via is greater than a width of a bottom surface of the first through via, a width of a bottom surface of the second through via is greater than a width of a top surface of the third through via, and a width of a middle portion of the second through via is greater than the widths of the top surface and the bottom surface of the second through via.

20 Claims, 59 Drawing Sheets

(51) Int. Cl.

| | |
|---|---|
| *H01L 23/522* | (2006.01) |
| *H10D 30/43* | (2025.01) |
| *H10D 30/67* | (2025.01) |
| *H10D 62/10* | (2025.01) |
| *H10D 84/83* | (2025.01) |

(56) References Cited

U.S. PATENT DOCUMENTS

| | | | |
|---|---|---|---|
| 11,177,286 B2 | 11/2021 | Kim et al. | |
| 11,322,401 B2 | 5/2022 | Smith et al. | |
| 11,393,819 B2 | 7/2022 | Li et al. | |
| 11,450,751 B2 * | 9/2022 | Su | H01L 21/76895 |
| 2021/0305130 A1 | 9/2021 | Cho et al. | |
| 2021/0375722 A1 * | 12/2021 | Kim | H10D 84/038 |
| 2021/0408115 A1 | 12/2021 | Lin et al. | |
| 2022/0181258 A1 | 6/2022 | Liebmann et al. | |
| 2022/0208757 A1 | 6/2022 | Do et al. | |

* cited by examiner

SEMICONDUCTOR DEVICE INCLUDING MULTI-BRIDGE CHANNEL FIELD EFFECT TRANSISTOR AND MULTIPLE VIA STRUCTURE

CROSS-REFERENCE TO RELATED APPLICATION

This application claims priority to Korean Patent Applications No. 10-2022-0130589 filed on Oct. 12, 2022 and No. 10-2023-0033947 filed on Mar. 15, 2023 in the Korean Intellectual Property Office, and all the benefits accruing therefrom under 35 U.S.C. 119, the contents of which in its entirety are herein incorporated by reference.

BACKGROUND

The present disclosure relates to semiconductor devices. For example, the present disclosure may relate to semiconductor devices including a Multi-Bridge Channel Field Effect Transistor (MBCFET™).

As a scaling technique for increasing the density of a semiconductor device, a multi-gate transistor has been suggested in which a fin- or nanowire-type silicon body may be formed on a substrate and a gate may be formed on the surface of the silicon body. The fin- or nanowire-type silicon body may be a multi-channel active pattern.

Since the multi-gate transistor may use a three-dimensional (3D) channel, scaling may be facilitated. Also, current control capability may be improved without increasing the length of the gate of the multi-gate transistor. Also, a short channel effect (SCE), i.e., the phenomenon of the electric potential of a channel region being affected by a drain voltage, may be suppressed.

SUMMARY

Aspects of the present disclosure may provide semiconductor devices capable of lowering the difficulty of a process of forming through vias, which may vertically penetrate an upper interlayer insulating layer, and also capable of improving the alignment of a plurality of through vias in the vertical direction.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an exemplary embodiment of the present disclosure, there is provided a semiconductor device, comprising: a first lower interlayer insulating layer; an active pattern that extends in a first horizontal direction on a top surface of the first lower interlayer insulating layer; a field insulating layer that extends around the active pattern on the top surface of the first lower interlayer insulating layer; a gate electrode that extends in a second horizontal direction on the active pattern and the field insulating layer, wherein the first horizontal direction intersects with the second horizontal direction; a source/drain region on the active pattern, wherein the source/drain region is adjacent a side surface of the gate electrode; an upper interlayer insulating layer on the source/drain region and on the field insulating layer; a first through via that extends through the upper interlayer insulating layer in a vertical direction to a top surface of the field insulating layer; a second through via in the field insulating layer, wherein sidewalls of the second through via are in contact with the field insulating layer, and wherein the second through via is connected to the first through via; and a third through via in the first lower interlayer insulating layer, wherein the third through via is connected to the second through via, wherein a width of a top surface of the second through via is greater than a width of a bottom surface of the first through via in the second horizontal direction, wherein a width of a bottom surface of the second through via is greater than a width of a top surface of the third through via in the second horizontal direction, and wherein a width of a middle portion of the second through via between the top surface of the second through via and the bottom surface of the second through via is greater than each of the width of the top surface of the second through via and the width of the bottom surface of the second through via in the second horizontal direction.

According to an exemplary embodiment of the present disclosure, there is provided a semiconductor device, comprising: a first lower interlayer insulating layer; an active pattern that extends in a first horizontal direction on a top surface of the first lower interlayer insulating layer; a field insulating layer that extends around sidewalls of the active pattern on the top surface of the first lower interlayer insulating layer; a gate electrode that extends in a second horizontal direction on the active pattern and the field insulating layer, wherein the first horizontal direction intersects with the second horizontal direction; a source/drain region on the active pattern, wherein the source/drain region is adjacent a side surface of the gate electrode; an upper interlayer insulating layer on the source/drain region and on the field insulating layer; a source/drain contact in the upper interlayer insulating layer, wherein the source/drain contact is adjacent the side surface of the gate electrode, and wherein the source/drain contact is connected to the source/drain region; a first through via that extends through the upper interlayer insulating layer in a vertical direction to a top surface of the field insulating layer, wherein the first through via is connected to the source/drain contact; and a second through via in the field insulating layer, wherein the second through via is spaced apart from the active pattern in the second horizontal direction, and wherein the second through via is connected to the first through via, wherein a width of a top surface of the second through via is greater than a width of a bottom surface of the first through via in the second horizontal direction, wherein a width of a middle portion of the second through via is greater than each of the width of the top surface of the second through via and a width of a bottom surface of the second through via in the second horizontal direction, and wherein the middle portion of the second through via is between the top surface of the second through via and the bottom surface of the second through via.

According to an exemplary embodiment of the present disclosure, there is provided a semiconductor device, comprising: a first lower interlayer insulating layer; an active pattern that extends in a first horizontal direction on a top surface of the first lower interlayer insulating layer; a field insulating layer that extends around sidewalls of the active pattern on the top surface of the first lower interlayer insulating layer; a gate electrode extending in a second horizontal direction on the active pattern and the field insulating layer, wherein the first horizontal direction intersects with the second horizontal direction; a source/drain region on the active pattern and adjacent a side surface of the gate electrode; an upper interlayer insulating layer on the source/drain region and on the field insulating layer; a source/drain contact in the upper interlayer insulating layer, wherein the source/drain contact is adjacent the side surface of the gate electrode, and wherein the source/drain contact is connected to the source/drain region; a first through via that extends through the upper interlayer insulating layer in a vertical direction a top surface of the field insulating layer, wherein the first through via is connected to the source/drain contact, and wherein a top surface of the first through via is on a same plane as a top surface of the upper interlayer insulating layer; a second through via in the field insulating layer, wherein the second through via is spaced apart from the active pattern in the second horizontal direction, and wherein the second through via is connected to the first through via; a third through via in the first lower interlayer insulating layer, wherein the third through via is connected to the second through via; a second lower interlayer insulating layer on a bottom surface of the first lower interlayer insulating layer; and a lower wiring layer in the second lower interlayer insulating layer, wherein the lower wiring layer is connected to the third through via, wherein the first through via and the second through via form a unitary structure, wherein a width of a top surface of the second through via is greater than a width of a bottom surface of the first through via in the second horizontal direction, wherein a width of a bottom surface of the second through via is greater than a width of a top surface of the third through via in the second horizontal direction, wherein a width of a middle portion of the second through via is greater than each of the width of the top surface of the second through via and the width of the bottom surface of the second through via in the second horizontal direction, and wherein the middle portion of the second through via is between the top surface of the second through via and the bottom surface of the second through via.

It should be noted that the embodiments of the present disclosure are not limited to those described above, and other embodiments of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIGS. 6 through 45 are cross-sectional views illustrating intermediate steps of a method of fabricating a semiconductor device according to some embodiments of the present disclosure;

4

Figure 48:
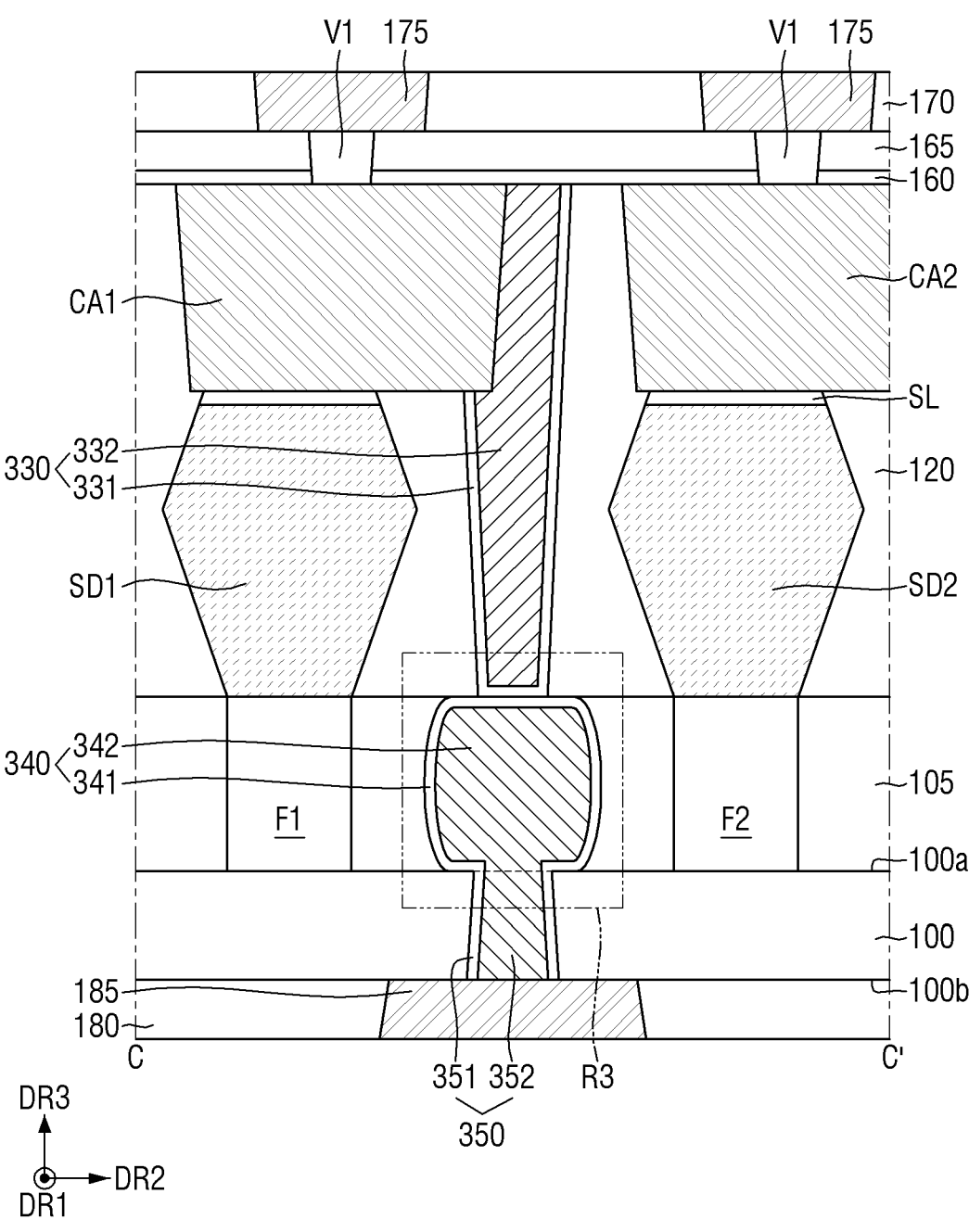
FIG. 48 is a cross-sectional view of a semiconductor device according to some embodiments of the present disclosure.
Figure 49:
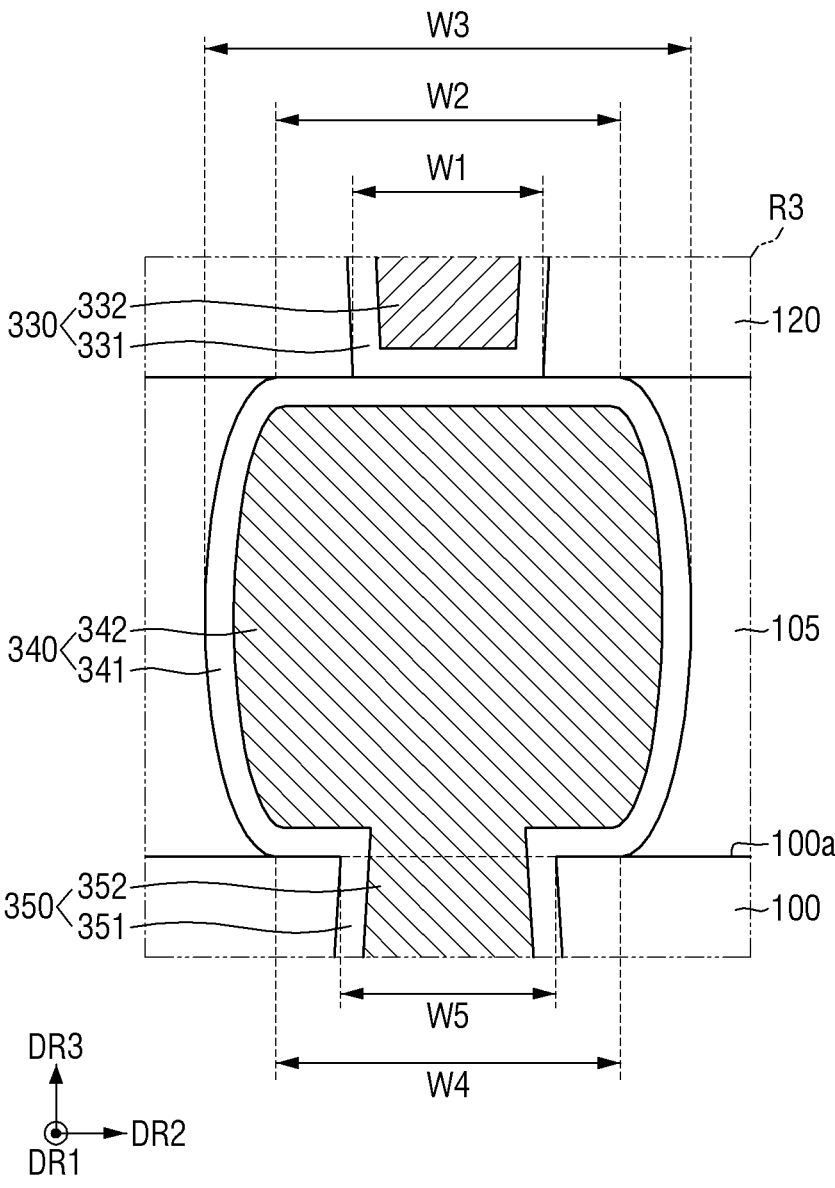
Figure 55:
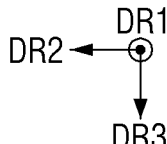
Figure 56:
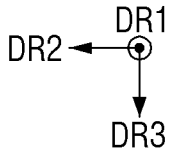
Figure 57:
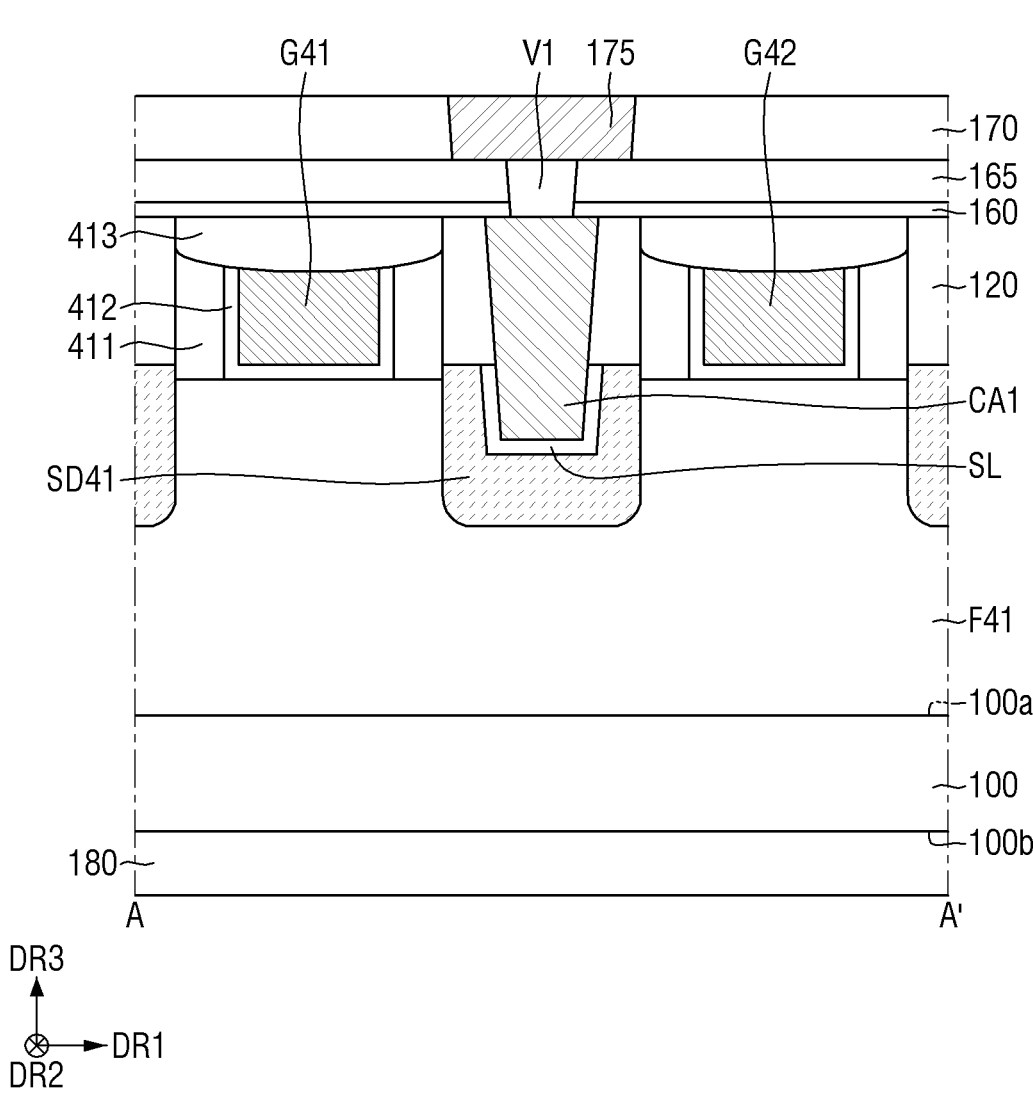
Figure 58:
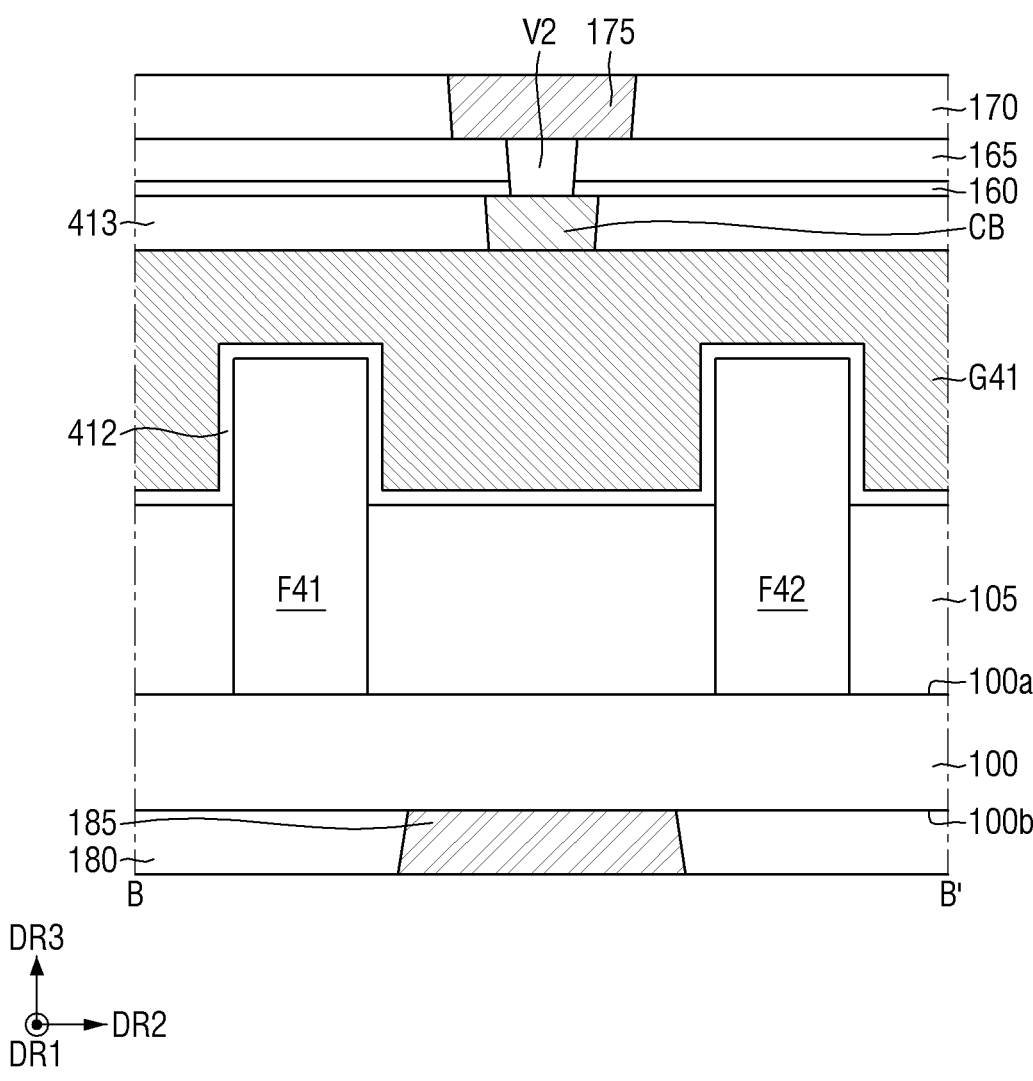
Figure 59:
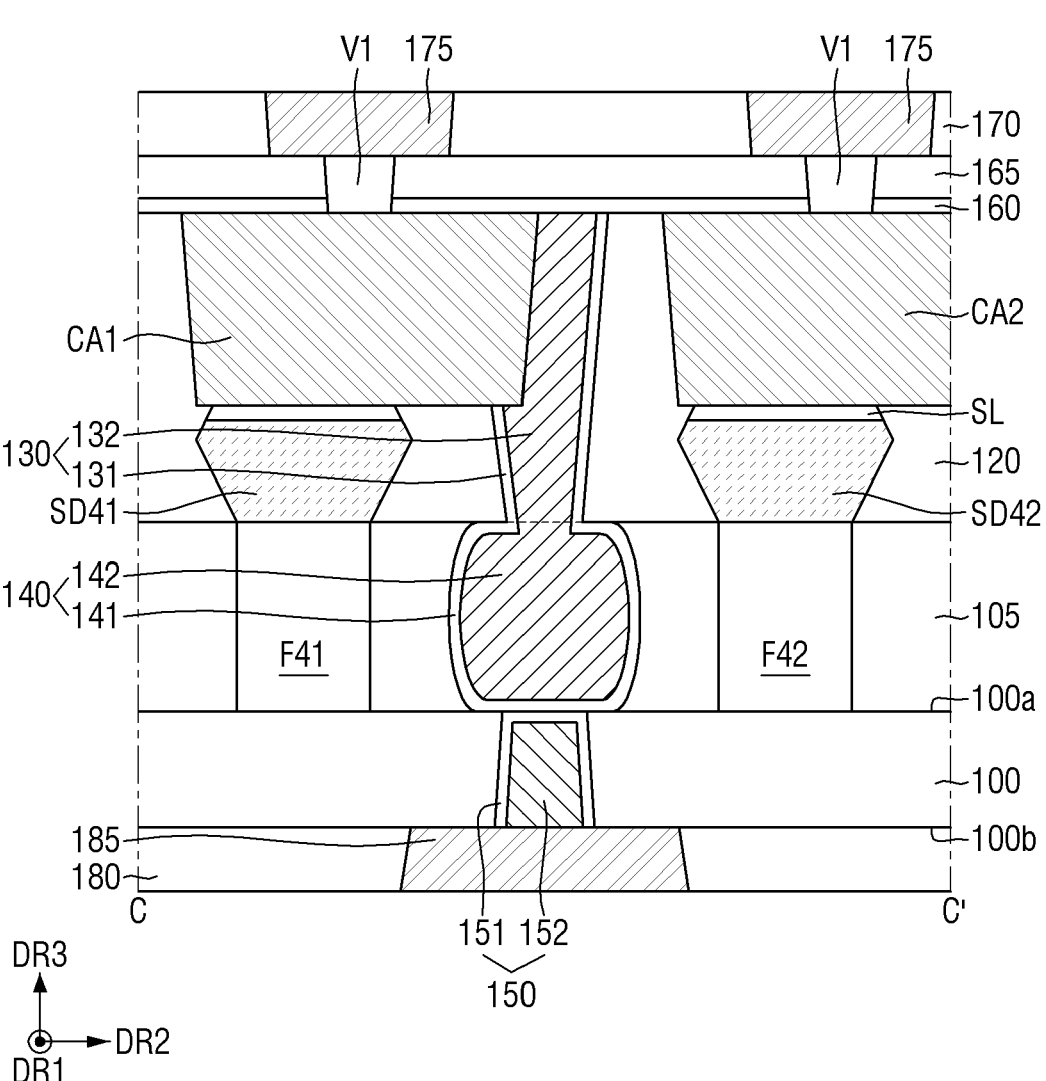

FIG. 49 is an enlarged cross-sectional view of a region R3 of FIG. 48;

FIGS. 50 through 56 are cross-sectional views illustrating intermediate steps of a method of fabricating a semiconductor device according to some embodiments of the present disclosure; and FIGS. 57 through 59 are cross-sectional views illustrating intermediate steps of a method of fabricating a semiconductor device according to some embodiments of the present disclosure.

DETAILED DESCRIPTION

A semiconductor device according to some embodiments of the present disclosure will hereinafter be described as including a Multi-Bridge Channel Field Effect Transistor (MBCFET™) including nanosheets or a fin field-effect transistor (FinFET) including fin-type channel regions, but the present disclosure is not limited thereto. A semiconductor device according to some embodiments of the present disclosure may include a tunneling field-effect transistor (FET) or a three-dimensional (3D) transistor. A semiconductor device according to some embodiments of the present disclosure may include a bipolar junction transistor or a lateral double-diffused metal-oxide-semiconductor field-effect transistor (LDMOS).

A semiconductor device according to some embodiments of the present disclosure will hereinafter be described with reference to FIGS. 1 through 5.

Figure 1:
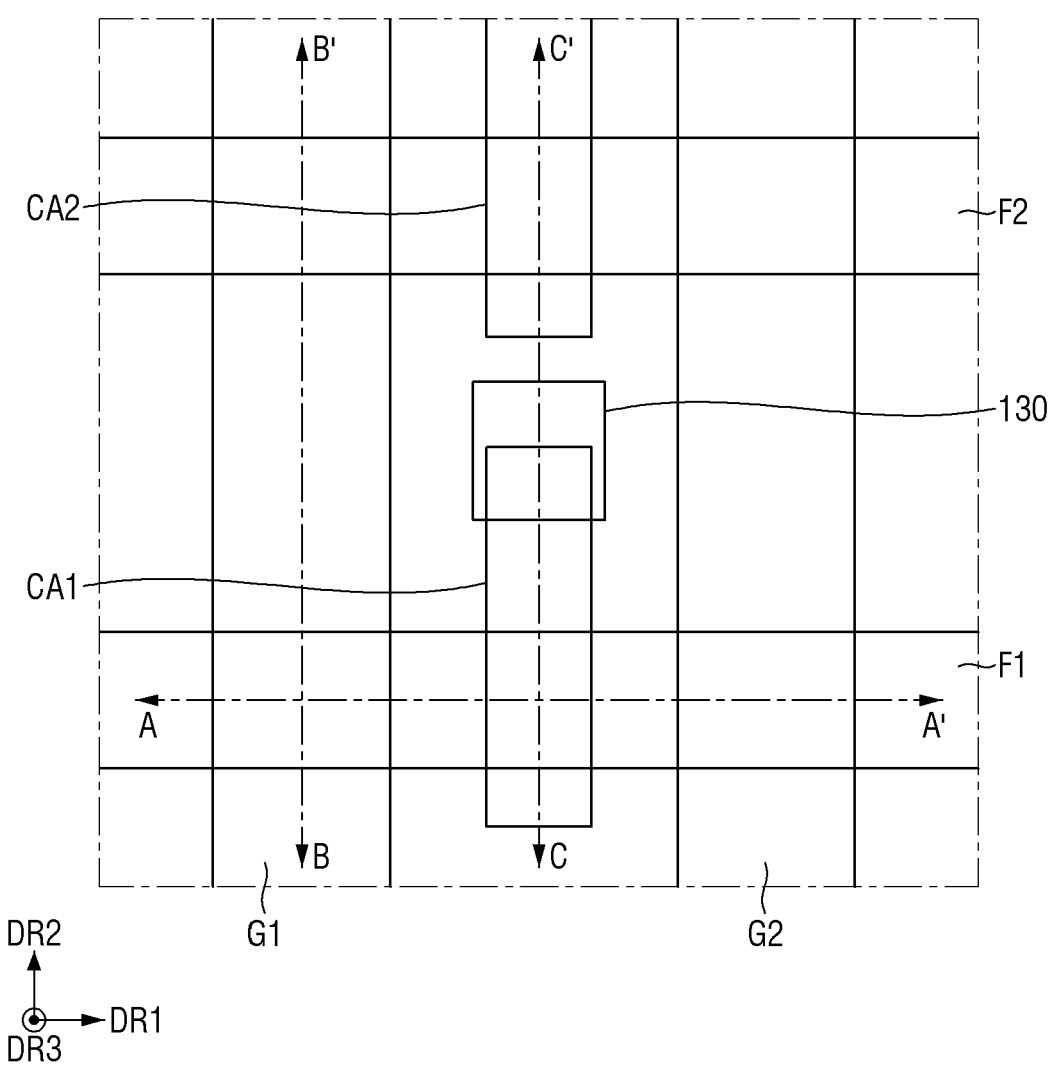
FIG. 1 is a plan view of a layout of a semiconductor device according to some embodiments of the present disclosure.
Figure 2:
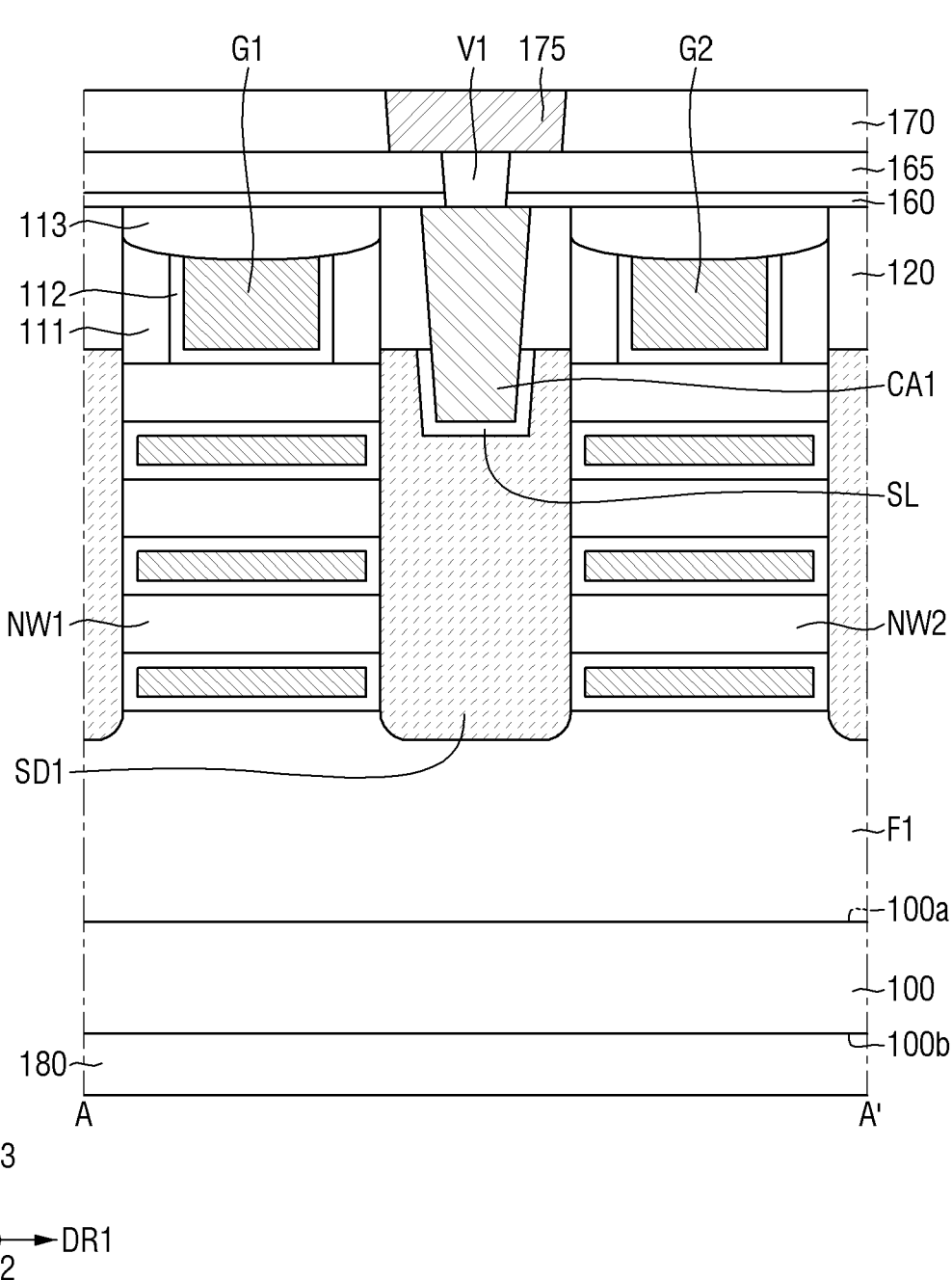
FIG. 2 is a cross-sectional view taken along line A-A' of FIG. 1.
Figure 3:
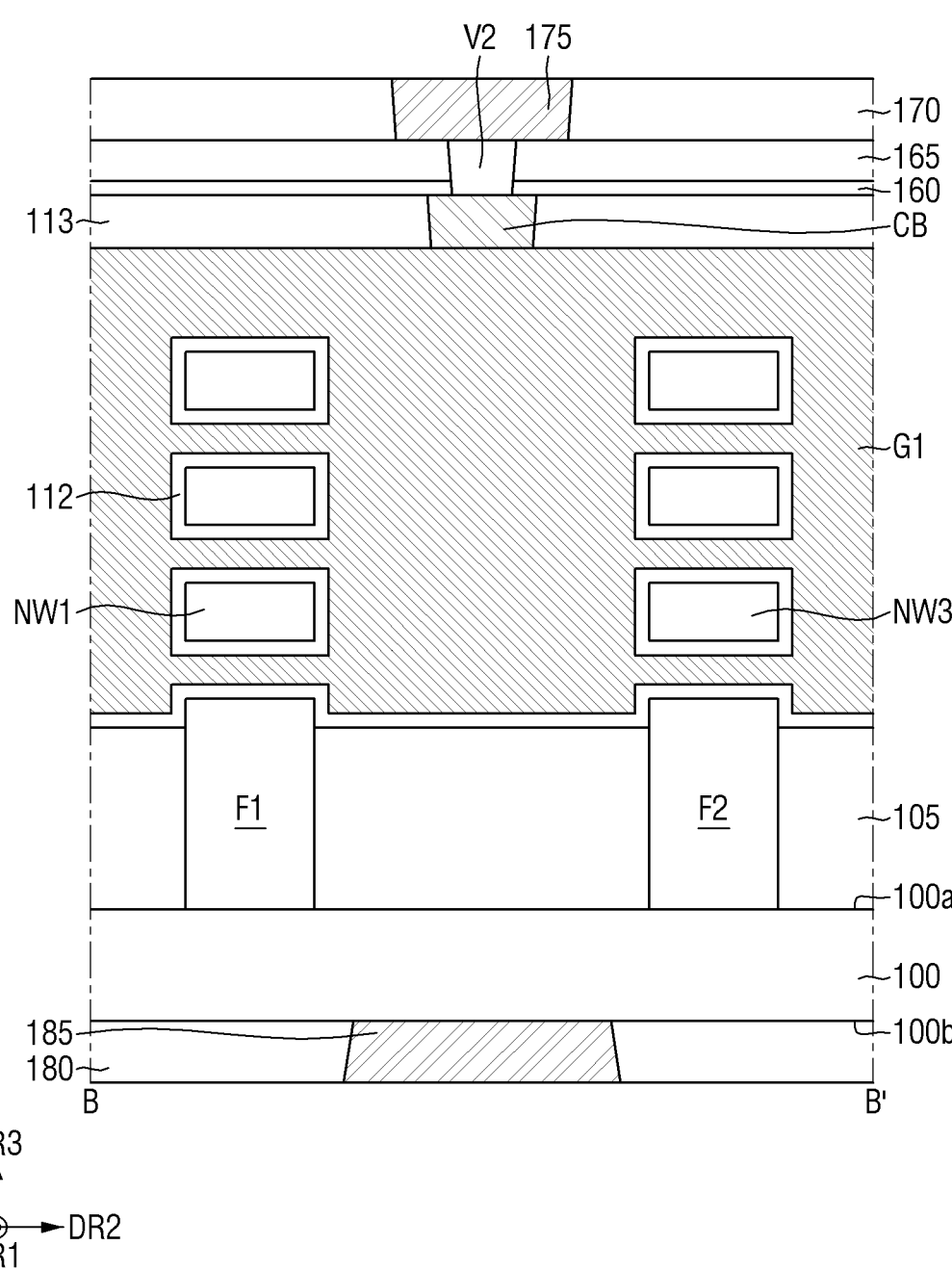
FIG. 3 is a cross-sectional view taken along line B-B' of FIG. 1.
Figure 4:
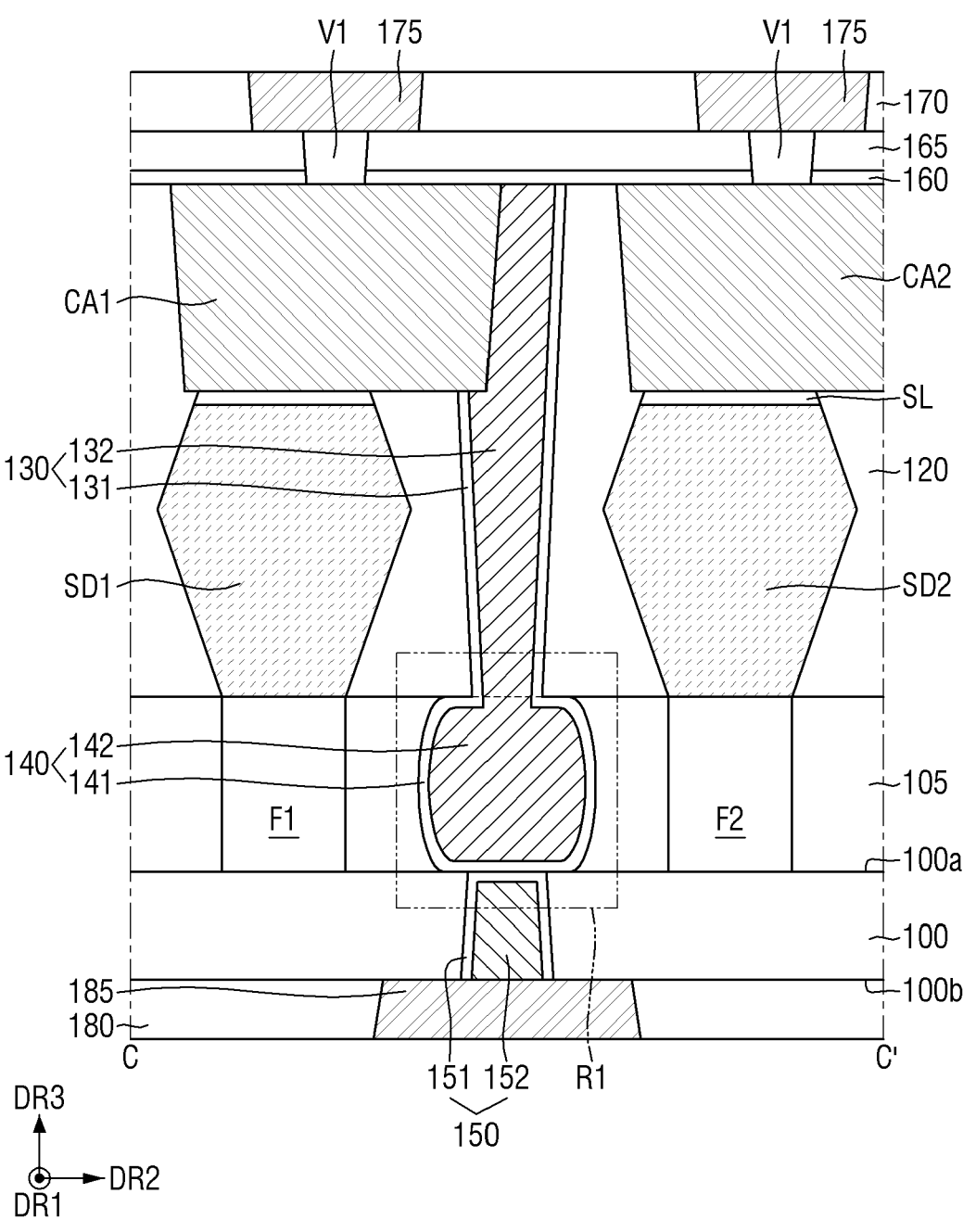
FIG. 4 is a cross-sectional view taken along line C-C' of FIG. 1.
Figure 5:
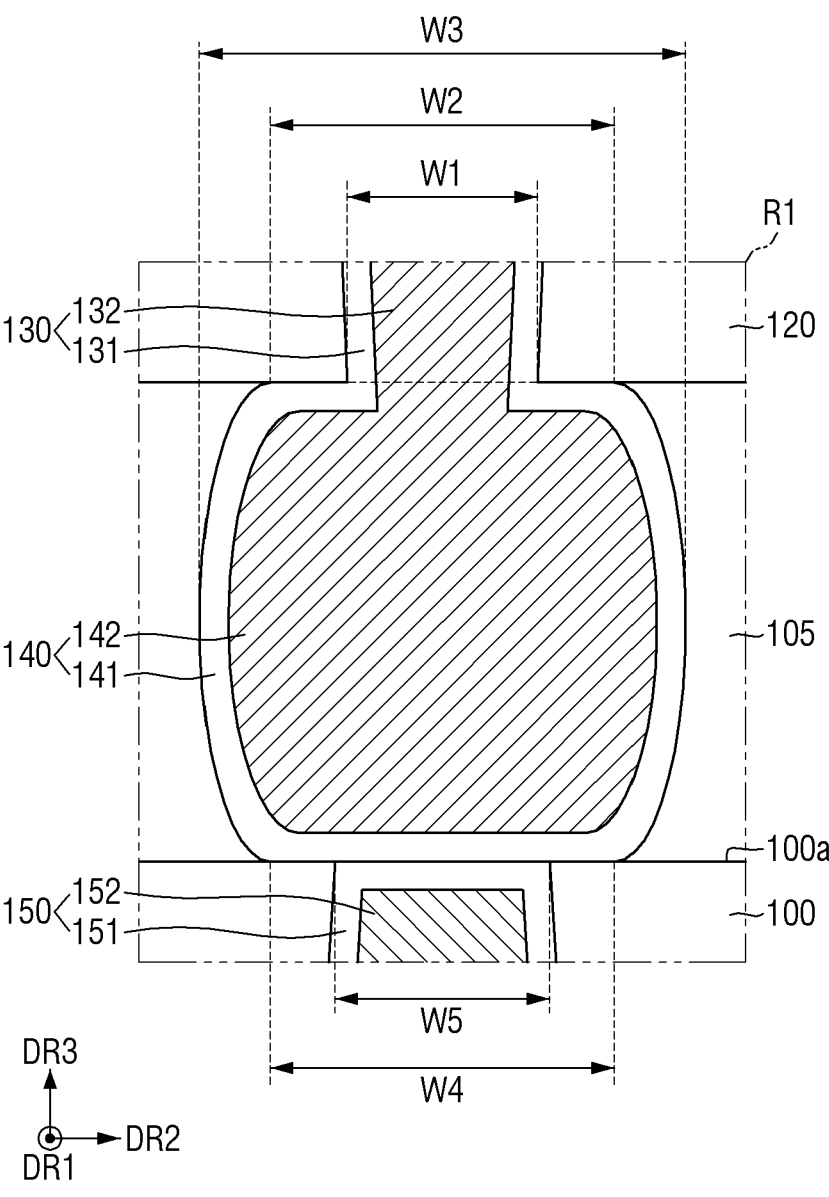
FIG. 5 is an enlarged cross-sectional view of a region R1 of FIG. 4.

FIG. 1 is a plan view of a layout of a semiconductor device according to some embodiments of the present disclosure. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is an enlarged cross-sectional view of a region R1 of FIG. 4.

Referring to FIGS. 1 through 5, the semiconductor device according to some embodiments of the present disclosure may include a first lower interlayer insulating layer 100, first and second active patterns F1 and F2, a field insulating layer 105, first plurality of nanosheets NW1, second plurality of nanosheets NW2, third plurality of nanosheets NW3, first and second gate electrodes G1 and G2, gate spacers 111, a gate insulating layer 112, capping patterns 113, first and second source/drain regions SD1 and SD2, first, second, and third through vias 130, 140, and 150, first and second source/drain contacts CA1 and CA2, a gate contact CB, a silicide layer SL, an etch stopper layer 160, a second upper interlayer insulating layer 165, first and second vias V1 and V2, a third upper interlayer insulating layer 170, an upper wiring layer 175, a second lower interlayer insulating layer 180, and a lower wiring layer 185.

The first lower interlayer insulating layer 100 may include, for example, silicon oxide, silicon nitride, silicon oxynitride, and/or a low-k material. The low-k material may include, for example, fluorinated tetraethyl orthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazen (TOSZ), fluoride silicate glass (FSG), polyimide nanofoam (such as polypropylene oxide), carbon doped silicon oxide (CDO), organo silicate glass (OSG), SiLK, amorphous fluorinated carbon, silica aerogel, silica xerogel, mesoporous silica, and/or a combination thereof, but the present disclosure is not limited thereto.

First and second horizontal directions DR1 and DR2 may be defined as directions parallel to a top surface 100a of the first lower interlayer insulating layer 100. The second horizontal direction DR2 may be defined as a different direction from the first horizontal direction DR1. For example, the second horizontal direction DR2 may intersect with the first horizontal direction DR1. A vertical direction DR3 may be defined as a direction perpendicular to the first and second horizontal directions DR1 and DR2. That is, the vertical direction DR3 may be defined as being perpendicular to the top surface 100a of the first lower interlayer insulating layer 100. The vertical direction DR3 may be referred to as a third direction DR3.

The first and second active patterns F1 and F2 may extend in the first horizontal direction DR1 on the top surface 100a of the first lower interlayer insulating layer 100. The second active pattern F2 may be spaced apart from the first active pattern F1 in the second horizontal direction DR2. The first and second active patterns F1 and F2 may protrude in the vertical direction DR3 from the top surface 100a of the first lower interlayer insulating layer 100.

The field insulating layer 105 may be disposed on the top surface 100a of the first lower interlayer insulating layer 100. The field insulating layer 105 may extend around (e.g., surround) the sidewalls of each of the first and second active patterns F1 and F2. For example, top surfaces of the first and second active patterns F1 and F2 may be exposed from (e.g., protruded beyond) a top surface of the field insulating layer 105 in the vertical direction DR3, but the present disclosure is not limited thereto. The top surfaces of the first and second active patterns F1 and F2 may be disposed on the same plane as the top surface of the field insulating layer 105. The field insulating layer 105 may include a different material from the first lower interlayer insulating layer 100. The field insulating layer 105 may include a material having an etch selectivity with respect to the first lower interlayer insulating layer 100. The field insulating layer 105 may include, for example, a silicon oxide film, a silicon nitride film, a silicon oxynitride film, or a combination thereof.

A first plurality of nanosheets NW1 may be disposed on the first active pattern F1. The first plurality of nanosheets NW1 may be disposed at the intersection between the first active pattern F1 and the first gate electrode G1 in a plan view. A second plurality of nanosheets NW2 may be disposed on the first active pattern F1. The second plurality of nanosheets NW2 may be disposed at the intersection between the first active pattern F1 and the second gate electrode G2 in the plan view. The second plurality of nanosheets NW2 may be spaced apart from the first plurality of nanosheets NW1 in the first horizontal direction DR1. A third plurality of nanosheets NW3 may be disposed on the second active pattern F2. The third plurality of nanosheets NW3 may be disposed at the intersection between the second active pattern F2 and the first gate electrode G1 in the plan view. The third plurality of nanosheets NW3 may be spaced apart from the first plurality of nanosheets NW1 in the second horizontal direction DR2.

The first plurality of nanosheets NW1, the second plurality of nanosheets NW2, and the third plurality of nanosheets NW3 may include stacks of a plurality of nanosheets that are spaced apart from one another in the vertical direction DR3. FIGS. 2 and 3 illustrate that the first plurality of nanosheets NW1, the second plurality of nanosheets NW2, and the third plurality of nanosheets NW3 include stacks of three nanosheets that are spaced apart from one another in the vertical direction DR3, but the present disclosure is not limited thereto. In some embodiments, for example, each of the first plurality of nanosheets NW1, the second plurality of nanosheets NW2, and the third plurality of nanosheets NW3 may include stacks of four or more nanosheets that are spaced apart from one another in the vertical direction DR3. Each of the first, second, and third plurality of nanosheets NW1, NW2, and NW3 may include one or two nanosheets.

For example, the first plurality of nanosheets NW1, the second plurality of nanosheets NW2, and the third plurality of nanosheets NW2 may include Si, but the present disclosure is not limited thereto. In some embodiments, for example, the first plurality of nanosheets NW1, the second plurality of nanosheets NW2, and the third plurality of nanosheets NW2 may include SiGe.

The first gate electrode G1 may extend in the second horizontal direction DR2 on the first active pattern F1, the second active pattern F2, and the field insulating layer 105. The first gate electrode G1 may extend around (e.g., surround) the first plurality of nanosheets NW1 and the third plurality of nanosheets NW3. For example, the first gate electrode G1 may extend around (e.g., surround) each nanosheet of the first plurality of nanosheets NW1 and/or each nanosheet of the third plurality of nanosheets NW3. The second gate electrode G2 may extend in the second horizontal direction DR2 on the first active pattern F1, the second active pattern F2, and the field insulating layer 105. The second gate electrode G2 may be spaced apart from the first gate electrode G1 in the first horizontal direction DR1. The second gate electrode G2 may extend around (e.g., surround) the second plurality of nanosheets NW2. For example, the second gate electrode G2 may extend around (e.g., surround) each nanosheet of the second plurality of nanosheets NW2.

The first and second gate electrodes G1 and G2 may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and/or a combination thereof, but the present disclosure is not limited thereto. The first and second gate electrodes G1 and G2 may include a conductive metal oxide or a conductive metal oxynitride and may include oxidized forms of the aforementioned materials.

The gate spacers 111 may extend in the second horizontal direction DR2 along a sidewall of the first gate electrode G1, on the top surface of the uppermost first plurality of nanosheet NW1, the top surface of the uppermost third plurality of nanosheet NW3, and/or the field insulating layer 105. The gate spacers 111 may extend in the second horizontal direction DR2 along a sidewall of the second gate electrode G2, on the top surface of the uppermost second plurality of nanosheet NW2 and/or the field insulating layer 105.

The gate spacers 111 may include, for example, silicon nitride (SiN), silicon oxynitride (SiON), silicon oxide (SiO$_2$), silicon oxycarbonitride (SiOCN), silicon boron nitride (SiBN), silicon oxyboronitride (SiOBN), and/or silicon oxycarbide (SiOC), but the present disclosure is not limited thereto.

The gate insulating layer 112 may be disposed between the gate spacers 111 and the first and second gate electrodes G1 and G2. The gate insulating layer 112 may be disposed on the sidewalls, in the first horizontal direction DR1, of each of the first and second gate electrodes G1 and G2. The gate insulating layer 112 may be disposed between the first and second gate electrodes G1 and G2 and the first and second active patterns F1 and F2. The gate insulating layer 112 may be disposed between the field insulating layer 105 and the first and second gate electrodes G1 and G2. The gate insulating layer 112 may be disposed between the first gate electrode G1 and (e.g., each nanosheet of) the first plurality of nanosheets NW1. The gate insulating layer 112 may be disposed between the first gate electrode G1 and (e.g., each nanosheet of) the third plurality of nanosheets NW3. The gate insulating layer 112 may be disposed between the second gate electrode G2 and (e.g., each nanosheet of) the second plurality of nanosheets NW2.

The gate insulating layer 112 may include, for example, silicon oxide, silicon oxynitride, silicon nitride, and/or a high-k material having a greater dielectric constant than silicon oxide, but is not limited thereto. The high-k material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The semiconductor device according to some embodiments of the present disclosure may include a negative capacitance (NC) FET using a negative capacitor. For example, each gate insulating layer 112 may include a ferroelectric material film having ferroelectric properties and a paraelectric material film having paraelectric properties.

The ferroelectric material film may have a negative capacitance, and the paraelectric material film may have a positive capacitance. If two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors in a serial connection may have a positive value and may be greater than the absolute value of the capacitance of each of the two or more capacitors.

If the ferroelectric material film having a negative capacitance and the paraelectric material film having a positive capacitance are connected in series, the total capacitance of the ferroelectric material film and the paraelectric material film may increase. Accordingly, a transistor having the ferroelectric material film can have a sub-threshold swing (SS) of less than 60 mV/decade at room temperature.

The ferroelectric material film may have ferroelectric properties. The ferroelectric material film may include, for example, hafnium oxide, hafnium zirconium oxide, barium strontium titanium oxide, barium titanium oxide, and/or lead zirconium titanium oxide. For example, the hafnium zirconium oxide may be a material obtained by doping hafnium oxide with zirconium (Zr). The hafnium zirconium oxide may be a compound of hafnium (Hf), Zr, and oxygen (O).

The ferroelectric material film may further include a dopant. For example, the dopant may include aluminum (Al), titanium (Ti), niobium (Nb), lanthanum (La), yttrium (Y), magnesium (Mg), silicon, calcium (Ca), cerium (Ce), dysprosium (Dy), erbium (Er), gadolinium (Gd), germanium (Ge), scandium (Sc), strontium (Sr), and/or tin (Sn). The type of dopant may vary depending on the type of material of the ferroelectric material film.

If the ferroelectric material film includes hafnium oxide, the dopant of the ferroelectric material film may include, for example, Gd, Si, Zr, Al, and/or Y.

If the dopant of the ferroelectric material film is Al, the ferroelectric material film may include 3 atomic % (at %) to 8 at % of Al. Here, the ratio of the dopant in the ferroelectric material film may refer to the ratio of the sum of the amounts of Hf and Al to the amount of Al in the ferroelectric material film.

If the dopant of the ferroelectric material film is Si, the ferroelectric material film may include 2 at % to 10 at % of Si. If the dopant of the ferroelectric material film is Y, the ferroelectric material film may include 2 at % to 10 at % of Y. If the dopant of the ferroelectric material film is Gd, the ferroelectric material film may include 1 at % to 7 at % of Gd. If the dopant of the ferroelectric material film is Zr, the ferroelectric material film may include 50 at % to 80 at % of Zr.

The paraelectric material film may have paraelectric properties. The paraelectric material film may include, for example, silicon oxide and/or a high-k metal oxide. The high-k metal oxide may include, for example, hafnium oxide, zirconium oxide, and/or aluminum oxide, but the present disclosure is not limited thereto.

The ferroelectric material film and the paraelectric material film may include a same material. The material included in the ferroelectric material film may have ferroelectric properties, but the same material included in the paraelectric material film may not have ferroelectric properties. For example, if the ferroelectric material film and the paraelectric material film include hafnium oxide, the hafnium oxide included in the ferroelectric material film may have a different crystalline structure from the hafnium oxide included in the paraelectric material film.

The ferroelectric material film may be thick enough to exhibit ferroelectric properties. The ferroelectric material film may have a thickness of, for example, 0.5 nm to 10 nm, but the present disclosure is not limited thereto. A critical thickness that can exhibit ferroelectric properties may vary depending on the type of ferroelectric material, and thus, the thickness of the ferroelectric material film may vary depending on the type of ferroelectric material included in the ferroelectric material film.

For example, the gate insulating layer 112 may include a single ferroelectric material film. In another example, the gate insulating layer 112 may include a plurality of ferroelectric material films that are spaced apart from one another. The gate insulating layer 112 may have a structure in which a plurality of ferroelectric material films and a plurality of paraelectric material films are alternately stacked.

The capping patterns 113 may extend in the second horizontal direction DR2 on the first and second gate electrodes G1 and G2, the gate insulating layer 112, and the gate spacers 111. For example, the capping patterns 113 may be in contact with the top surfaces of the gate spacers 111, but the present disclosure is not limited thereto. In some embodiments, the capping patterns 113 may be disposed between the gate spacers 111. The capping patterns 113 may include, for example, SiN, SiON, $SiO_2$, SiCN, SiOCN, and/or a combination thereof, but the present disclosure is not limited thereto.

The first source/drain region SD1 may be disposed on (e.g., adjacent) at least one side (e.g., a side surface) of each of the first and second gate electrodes G1 and G2, on the first active pattern F1. For example, the first source/drain region SD1 may be disposed on both sides of each of the first and second gate electrodes G1 and G2, on the first active pattern F1. The second source/drain region SD2 may be disposed on at least one side of each of the first and second gate electrodes G1 and G2, on the second active pattern F2. For example, the second source/drain region SD2 may be disposed on both sides of each of the first and second gate electrodes G1 and G2, on the second active pattern F2.

For example, the first source/drain region SD1 may be in contact with sidewalls, in the first horizontal direction DR1, of the first plurality of nanosheets NW1 and with sidewalls, in the first horizontal direction DR1, of the second plurality of nanosheets NW2, and the second source/drain region SD2 may be in contact with sidewalls, in the first horizontal direction DR1, of the third plurality of nanosheets NW3. For example, the first and second source/drain regions SD1 and SD2 may be in contact with the gate insulating layer 112, but the present disclosure is not limited thereto. Alternatively, in some embodiments, inner spacers may be disposed between the gate insulating layer 112 and the first and second source/drain regions SD1 and SD2. The inner spacers may include, for example, SiN, SiON, $SiO_2$, SiOCN, SiBN, SiOBN, SiOC, and/or a combination thereof.

The first upper interlayer insulating layer 120 may be disposed on the field insulating layer 105. FIG. 3 illustrates that the first upper interlayer insulating layer 120 is in contact with the top surface of the field insulating layer 105, but the present disclosure is not limited thereto. In some embodiments, an etch stopper layer may be disposed between the top surface of the field insulating layer 105 and the first upper interlayer insulating layer 120. The first upper interlayer insulating layer 120 may be on (e.g., cover a portion of) the first and second source/drain regions SD1 and SD2. For example, the first upper interlayer insulating layer 120 may extend around (e.g., surround) the first and second source/drain regions SD1 and SD2. The first upper interlayer insulating layer 120 may extend around (e.g., surround) the sidewalls of each of the gate spacers 111 and the sidewalls of each of the capping patterns 113. For example, a top surface of the first upper interlayer insulating layer 120 may be disposed on the same plane as a top surfaces of the capping patterns 113, but the present disclosure is not limited thereto. In some embodiments, the first upper interlayer insulating layer 120 may be on (e.g., cover) the top surfaces of the capping patterns 113.

The first upper interlayer insulating layer 120 may include a different material from the field insulating layer 105. The first upper interlayer insulating layer 120 may include a material with an etch selectivity with respect to the field insulating layer 105. The first upper interlayer insulating layer 120 may include, for example, silicon oxide, silicon nitride, silicon oxynitride, and/or a low-k material. The low-k material may include, for example, FTEOS, HSQ, BCB, TMOS, OMCTS, HMDS, TMSB, DADBS, TMSP, PTFE, TOSZ, FSG, polyimide nanofoam (such as polypropylene oxide), CDO, OSG, SiLK, amorphous fluorinated carbon, silica aerogel, silica xerogel, mesoporous silica, and/or a combination thereof, but the present disclosure is not limited thereto.

A first through via 130 may be disposed between the first and second gate electrodes G1 and G2. The first through via 130 may be spaced apart from the first and second gate electrodes G1 and G2 in the first horizontal direction DR1. The first through via 130 may be disposed between the first and second source/drain regions SD1 and SD2. The first through via 130 may be spaced apart from the first and second source/drain regions SD1 and SD2 in the second horizontal direction DR2.

The first through via 130 may extend in (e.g., penetrate) the first upper interlayer insulating layer 120 in the vertical direction DR3. For example, the first through via 130 may extend from the top surface of the field insulating layer 105 to the top surface of the first upper interlayer insulating layer 120. The first through via 130 may be in the first upper interlayer insulating layer 120. For example, a top surface of the first through via 130 may be disposed on the same plane as the top surface of the first upper interlayer insulating layer 120. A bottom surface of the first through via 130 may be disposed on the same plane as a bottom surface of the first upper interlayer insulating layer 120. For example, the width, in the second horizontal direction DR2, of the first through via 130 may gradually decrease closer to the top surface of the field insulating layer 105. For example, the longer the distance of the first through via 130 is from the top surface of the first upper interlayer insulating layer 120, the shorter the width of the first through via 130 in the second horizontal direction DR2 may be.

For example, the first through via 130 may include a first barrier layer 131 and a first filling layer 132. The first through via 130 may include the first barrier layer along sidewalls of the first through via 130. The first barrier layer 131 may include (e.g., constitute) the sidewalls (e.g., outer sidewalls) of the first through via 130. For example, a sidewall of the first barrier layer 131 may be the sidewall of the first through via 130. For example, the first barrier layer 131 may be conformally formed. For example, the first barrier layer 131 may have a uniform thickness in a cross-sectional view in the second direction DR2. The first barrier layer 131 may be in contact with the first upper interlayer insulating layer 120. For example, a top surface (e.g., uppermost surface) of the first barrier layer 131 may be disposed on the same plane as the top surface of the first upper interlayer insulating layer 120. The first filling layer 132 may be disposed between portions of the first barrier layer 131. For example, the first filling layer 132 may be disposed between inner sidewalls of the first barrier layer 131. The first filling layer 132 may include all the first through via 130 but the first barrier layer 131. For example, a top surface of the first filling layer 132 may be disposed on the same plane as the top surface (e.g., uppermost surface) of the first barrier layer 131 and the top surface of the first upper interlayer insulating layer 120. The first barrier layer 131 may extend around (e.g., surround) sidewalls of the first filling layer 132. For example, the first filling layer 132 may be spaced apart from the first upper interlayer insulating layer 120.

The first barrier layer 131 and the first filling layer 132 may include a conductive material. The first barrier layer 131 may include, for example, Ta, TaN, Ti, TiN, Ru, Co, Ni, nickel boron (NiB), W, WN, tungsten carbonitride (WCN), Zr, zirconium nitride (ZrN), V, vanadium nitride (VN), Nb, NbN, Pt, Ir, and/or Rh. The first filling layer 132 may include, for example, Al, W, Co, Ru, and/or Mo.

The second through via 140 may be disposed between the first and second active patterns F1 and F2. The second through via 140 may be spaced apart from the first and second active patterns F1 and F2 in the second horizontal direction DR2. The second through via 140 may be disposed in the field insulating layer 105. Sidewalls of the second through via 140 may be in contact with the field insulating layer 105. The second through via 140 may be connected to the first through via 130. The second through via 140 may overlap with the first through via 130 in the vertical direction DR3.

For example, a top surface of the second through via 140 may be formed on the same plane as the top surface of the field insulating layer 105. For example, at least part of the top surface of the second through via 140 may overlap with the first upper interlayer insulating layer 120 in the vertical direction DR3. For example, a bottom surface of the second through via 140 may be formed on the same plane as a bottom surface of the field insulating layer 105. For example, at least a portion of the bottom surface of the second through via 140 may be in contact with the top surface 100*a* of the first lower interlayer insulating layer 100. For example, the second through via 140 may be connected to the first through via 130. The second through via 140 and the first through via 130 may form a unitary structure. A unitary structure herein may refer to a structure without a visible boundary between two sub-elements thereof. For example, the second through via 140 may include a second barrier layer 141 and a second filling layer 142. The second through via 140 may include the second barrier layer 141 along sidewalls and a bottom surface of the second through via 140. The second through via 140 may include the second barrier layer 141 along a portion of the top surface of the second through via 140.

The second barrier layer 141 may include (e.g., constitute) a portion of the top surface, the sidewalls, and the bottom surface of the second through via 140. For example, a portion of a top surface of the second barrier layer 141 may be a portion of the top surface of the second through via 140. Sidewalls (e.g., outer sidewalls) of the second barrier layer 141 may be the sidewalls (e.g., outer sidewalls) of the second through via 140. A bottom surface of the second barrier layer 141 may be the bottom surface of the second through via 140. For example, the second barrier layer 141 may be conformally formed. For example, the second barrier layer 141 may have a uniform thickness in a cross-sectional view in the second direction DR2. The second barrier layer 141 may be in contact with the field insulating layer 105. The top surface (e.g., uppermost surface) of the second barrier layer 141 may be disposed on the same plane as the top surface of the field insulating layer 105. The bottom surface of the second barrier layer 141 may be disposed on the same plane as the bottom surface of the field insulating layer 105. The bottom surface of the second barrier layer 141 may be in contact with the top surface 100*a* of the first lower interlayer insulating layer 100. For example, the second barrier layer 141 may be in contact with the first barrier layer 131. The second barrier layer 141 and the first barrier layer 131 may be connected to each other continuously. The second barrier layer 141 and the first barrier layer 131 may form a unitary structure. The second filling layer 142 may be disposed between portions of the second barrier layer 141. The second filling layer 142 may include all the second through via 140 but the second barrier layer 141. For example, the second barrier layer 141 may extend around the second filling layer 142. The second barrier layer 141 may not entirely enclose the second filling layer 142. For example, a top surface (e.g., uppermost surface) of the second filling layer 142 may be in contact with a bottom surface of the first filling layer 132. The second filling layer 142 and the first filling layer 132 may be connected continuously. The second filling layer 142 and the first filling layer 132 may form a unitary structure. For example, the second filling layer 142 may not be in contact with the first lower interlayer insulating layer 100, the field insulating layer 105, and the first upper interlayer insulating layer 120. The second barrier layer 141 may be disposed between the second filling layer 142 and each of the first lower interlayer insulating layer 100, the field insulating layer 105, and the first upper interlayer insulating layer 120.

The second barrier layer 141 and the second filling layer 142 may include a conductive material. For example, the second barrier layer 141 may include the same material as the first barrier layer 131, and the second filling layer 142 may include the same material as the first filling layer 132. For example, a width W2, in the second horizontal direction DR2, of the top surface of the second through via 140 may be greater than a width W1, in the second horizontal direction DR2, of the bottom surface of the first through via 130. For example, the second through via 140 may have a jar shape in a cross-sectional view in the second horizontal direction DR2. For example, a width W3, in the second horizontal direction DR2, of a middle portion of the second through via 140 may be greater than the width W2, in the second horizontal direction DR2, of the top surface of the second through via 140. The width W3, in the second horizontal direction DR2, of the middle portion of the second through via 140 may be greater than a width W4, in the second horizontal direction DR2, of the bottom surface of the second through via 140. The middle portion of the second through via 140 may refer to a portion between the top surface of the second through via 140 and the bottom surface of the second through via 140 in the vertical direction DR3. For example, the sidewalls of the second through via 140 may be curved. The second through via 140 may have a convex shape having the longest width in the middle portion in a cross-sectional view in the second horizontal direction DR2.

The third through via 150 may be disposed in the first lower interlayer insulating layer 100. Sidewalls of the third through via 150 may be in contact with the first lower interlayer insulating layer 100. The third through via 150 may be connected to the second through via 140. For example, a top surface of the third through via 150 may be in contact with the bottom surface of the second through via 140. The third through via 150 may overlap with the second through via 140 in the vertical direction DR3. That is, the first, second, and third through vias 130, 140, and 150 may overlap with one another in the vertical direction DR3. For example, the top surface of the third through via 150 may be disposed on the same plane as the top surface 100*a* of the first lower interlayer insulating layer 100. For example, a bottom surface of the third through via 150 may be formed on the same plane as a bottom surface 100*b* of the first lower interlayer insulating layer 100. For example, the width, in the second horizontal direction DR2, of the third through via 150 may gradually decrease closer to the top surface 100*a* of the first lower interlayer insulating layer 100. For example, the longer the distance of the third through via 150 is from the top surface 100*a* of the first lower interlayer insulating layer 100, the longer the width of the third through via 150 in the second horizontal direction DR2 may be.

For example, the third through via 150 may include a third barrier layer 151 and a third filling layer 152. The third through via 150 may include the third barrier layer 151 along sidewalls and a top surface of the third through via 150. The third barrier layer 151 may include (e.g., constitute) the sidewalls and the top surface of the third through via 150. For example, a top surface of the third barrier layer 151 may be the top surface of the third through via 150. Sidewalls (e.g., outer sidewalls) of the third barrier layer 151 may be the sidewalls (e.g., outer sidewalls) of the third through via 150. For example, the third barrier layer 151 may be conformally formed. For example, the third barrier layer 151 may have a uniform thickness in a cross-sectional view in the second direction DR2. For example, the top surface (e.g., uppermost surface) of the third barrier layer 151 may be disposed on the same plane as the top surface 100a of the first lower interlayer insulating layer 100. The top surface of the third barrier layer 151 may be in contact with the second barrier layer 141. For example, the bottom surface of the third barrier layer 151 may be disposed on the same plane as the bottom surface 100b of the first lower interlayer insulating layer 100.

For example, the third filling layer 152 may be disposed between portions of the third barrier layer 151. For example, the third filling layer 152 may be disposed between inner sidewalls of the third barrier layer 151. The third barrier layer 151 may extend around the third filling layer 152. The third barrier layer 151 may not entirely enclose the third filling layer 152. For example, the third filling layer 152 may be spaced apart from the second through via 140. The second barrier layer 141 and the third barrier layer 151 may be disposed between the top surface of the third filling layer 152 and the bottom surface of the second filling layer 142. For example, the third barrier layer 151 may be in contact with the second barrier layer 141. The third filling layer 152 may be insulated from the first lower interlayer insulating layer 100. That is, the third filling layer 152 may not be in contact with the first lower interlayer insulating layer 100.

The third barrier layer 151 may include a conductive material. The third barrier layer 151 may include, for example, Ta, TaN, Ti, TiN, Ru, Co, Ni, NiB, W, WN, WCN, Zr, ZrN, V, VN, Nb, NbN, Pt, Ir, and/or Rh. The first filling layer 132 may include, for example, Al, W, Co, Ru, and/or Mo. The third filling layer 152 may include a conductive material. For example, the third filling layer 152 may include the same material as the first and second filling layers 132 and 142. In some embodiments, the third filling layer 152 may include a different conductive material from the first and second filling layers 132 and 142. For example, the width W4, in the second horizontal direction DR2, of the bottom surface of the second through via 140 may be greater than a width W5, in the second horizontal direction DR2, of the top surface of the third through via 150.

The first source/drain contact CA1 may extend in the second horizontal direction DR2 between the first and second gate electrodes G1 and G2. The first source/drain contact CA1 may be adjacent a side surface of the first gate electrode G1 and/or a side surface of the second gate electrode G2. The first source/drain contact CA1 may be disposed in the first upper interlayer insulating layer 120. The first source/drain contact CA1 may be connected to the first source/drain region SD1 and the first through via 130. The first source/drain contact CA1 may connect the first source/drain region SD1 and the first through via 130.

The second source/drain contact CA2 may extend in the second horizontal direction DR2 between the first and second gate electrodes G1 and G2. The second source/drain contact CA2 may be adjacent a side surface of the first gate electrode G1 and/or a side surface of the second gate electrode G2. The second source/drain contact CA2 may be spaced apart from the first source/drain contact CA1 in the second horizontal direction DR2. The second source/drain contact CA2 may be spaced apart from the first through via 130 in the second horizontal direction DR2. The second source/drain contact CA2 may be disposed in the first upper interlayer insulating layer 120. The second source/drain contact CA2 may be connected to the second source/drain region SD2.

For example, the top surfaces of the first and second source/drain contacts CA1 and CA2 may be disposed on the same plane as the top surface of the first upper interlayer insulating layer 120. For example, the top surfaces of the first and second source/drain contacts CA1 and CA2 may be disposed on the same plane as the top surface of the first through via 130. FIGS. 2 and 4 illustrate that the first and second source/drain contacts CA1 and CA2 are formed as single layers, but the present disclosure is not limited thereto. In some embodiments, the first and second source/drain contacts CA1 and CA2 may include multiple layers. The first and second source/drain contacts CA1 and CA2 may include a conductive material.

A silicide layer SL may be disposed between the first source/drain contact CA1 and the first source/drain region SD1. Also, the silicide layer SL may be disposed between the second source/drain contact CA2 and the second source/drain region SD2. The silicide layer SL may include, for example, a metal silicide material.

For example, a gate contact CB may extend through (e.g., penetrate) the capping patterns 113 in the vertical direction DR3 and may thus be connected to the first gate electrode G1. For example, the top surface of the gate contact CB may be disposed on the same plane as the top surfaces of the first upper interlayer insulating layer 120 and the capping patterns 113. FIG. 3 illustrates that the gate contact CB is formed as a single layer, but the present disclosure is not limited thereto. That is, the gate contact CB may include multiple layers. The gate contact CB may include a conductive material.

The etch stopper layer 160 may be disposed on the top surfaces of the first upper interlayer insulating layer 120, the capping patterns 113, the gate contact CB, the first and second source/drain contacts CA1 and CA2, and the first through via 130. FIGS. 2 through 4 illustrate that the etch stopper layer 160 is formed as a single layer, but the present disclosure is not limited thereto. In some embodiments, the etch stopper layer 160 may include multiple layers. The etch stopper layer 160 may include, for example, aluminum oxide, aluminum nitride, hafnium oxide, zirconium oxide, silicon oxide, silicon nitride, silicon oxynitride, and/or a low-k material. The second upper interlayer insulating layer 165 may be disposed on the etch stopper layer 160. The second upper interlayer insulating layer 165 may include, for example, silicon oxide, silicon nitride, silicon oxynitride, and/or a low-k material.

The first via V1 may extend through (e.g., penetrate) the second upper interlayer insulating layer 165 and the etch stopper layer 160 in the vertical direction DR3 and may thus be connected to the first and second source/drain contacts CA1 and CA2. The second via V2 may extend through (e.g., penetrate) the second upper interlayer insulating layer 165 and the etch stopper layer 160 in the vertical direction DR3 and may thus be connected to the gate contact CB. FIGS. 2 and 3 illustrate the first via V1 and the second via V2 are formed as single layers, but the present disclosure is not limited thereto. In some embodiments, the first via V1 and the second via V2 may include multiple layers. respectively. The first via V1 and the second via V2 may include a conductive material.

The third upper interlayer insulating layer 170 may be disposed on the second upper interlayer insulating layer 165. The third upper interlayer insulating layer 170 may include, for example, silicon oxide, silicon nitride, silicon oxynitride, and/or a low-k material. An upper wiring layer 175 may be disposed in the third upper interlayer insulating layer 170. The upper wiring layer 175 may be connected to one of the first and second vias V1 and V2. FIGS. 2 through 4 illustrate that the upper wiring layer 175 is formed as a single layer, but the present disclosure is not limited thereto. In some embodiments, the upper wiring layer 175 may include multiple layers. The upper wiring layer 175 may include a conductive material.

A second lower interlayer insulating layer 180 may be disposed on the bottom surface 100b of the first lower interlayer insulating layer 100. The second lower interlayer insulating layer 180 may include, for example, silicon oxide, silicon nitride, silicon oxynitride, and/or a low-k material. A lower wiring layer 185 may be disposed in the second lower interlayer insulating layer 180. For example, the lower wiring layer 185 may extend in the first horizontal direction DR1, but the present disclosure is not limited thereto. For example, the lower wiring layer 185 may be a power rail or a ground rail.

The lower wiring layer 185 may be connected to the third through via 150. The lower wiring layer 185 may be in contact with the bottom surface of the third through via 150. For example, the lower wiring layer 185 may be in contact with the bottom surfaces of the third barrier layer 151 and the third filling layer 152. FIGS. 3 and 4 illustrate that the lower wiring layer 185 is formed as a single layer, but the present disclosure is not limited thereto. In some embodiments, the lower wiring layer 185 may include multiple layers. The lower wiring layer 185 may include a conductive material.

In the semiconductor device according to some embodiments of the present disclosure, the second through via 140 may be formed in the field insulating layer 105 to have a greater width than those of the first and third through vias 130 and 150, which are disposed in the first upper interlayer insulating layer 120 and the first lower interlayer insulating layer 100, respectively. Accordingly, the difficulty of forming the first through via 130, which penetrates the first upper interlayer insulating layer 120 in the vertical direction DR3, can be reduced. Also, the alignment of the first and third through vias 130 and 150 with the second through via 140 may be improved.

A method of fabricating a semiconductor device according to some embodiments of the present disclosure will hereinafter be described with reference to FIGS. 2 through 45.

FIGS. 6 through 45 are cross-sectional views illustrating intermediate steps of a method of fabricating a semiconductor device according to some embodiments of the present disclosure.

Figure 6:
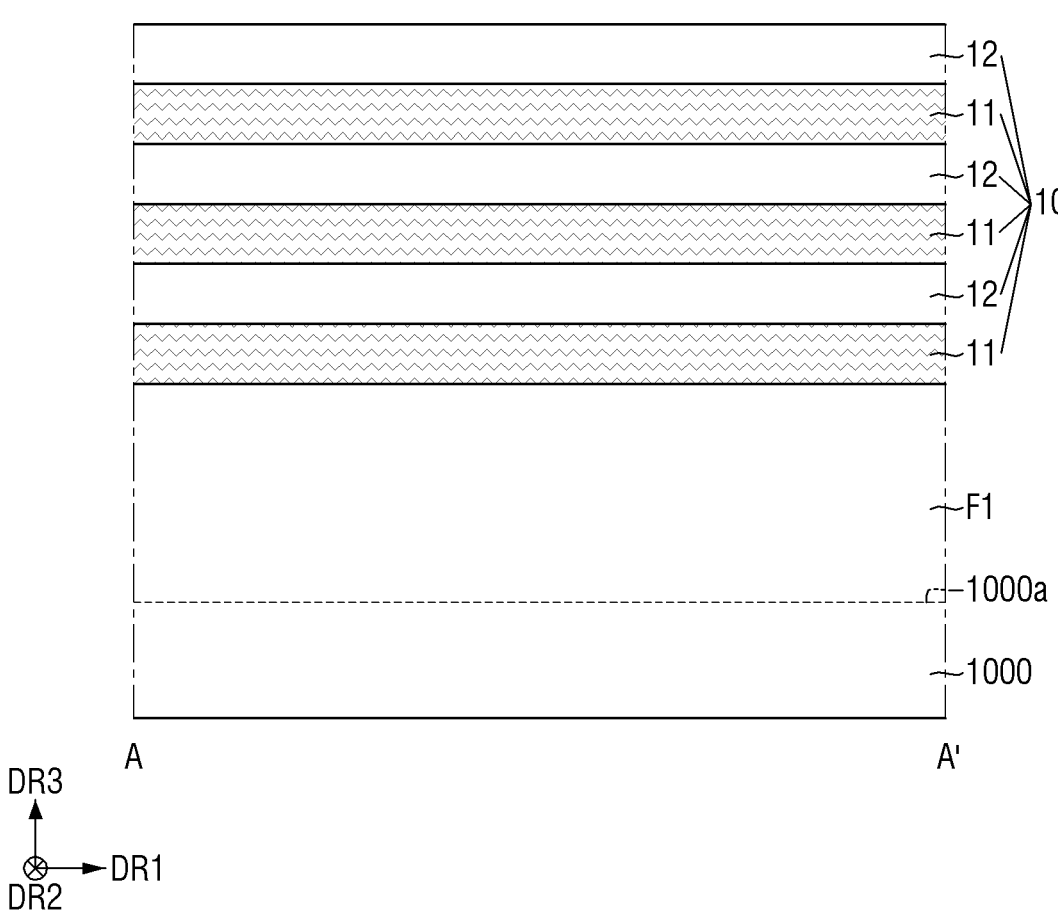
Figure 7:
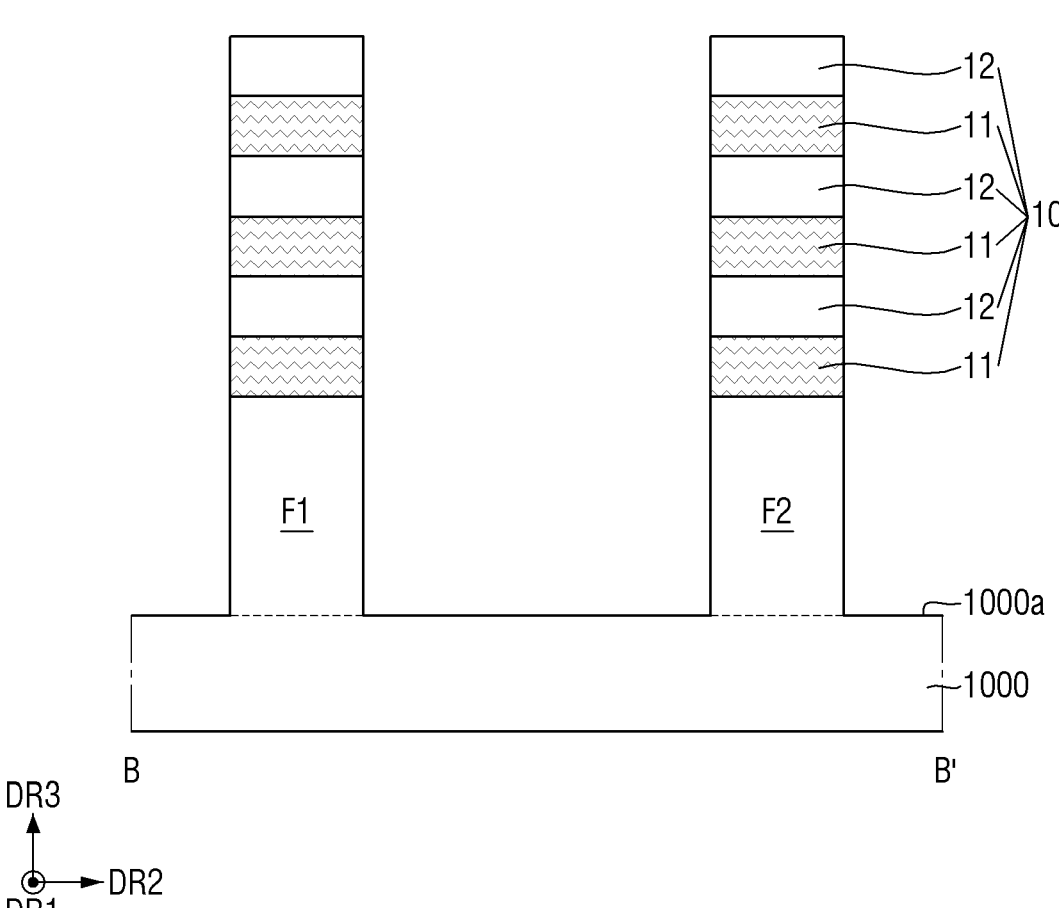

Referring to FIGS. 6 and 7, a stack structure 10 may be formed on the top surface of a substrate 1000. The substrate 1000 may be a silicon (Si) substrate or a silicon-on-insulator (SOI) substrate. In some embodiments, the substrate 1000 may include silicon-germanium (SiGe), silicon-germanium-on insulator (SGOI), indium antimonide, lead tellurium compound, indium arsenide, indium phosphide, gallium arsenide, or gallium antimonide, but the present disclosure is limited thereto.

The stack structure 10 may include first semiconductor layers 11 and second semiconductor layers 12, and the first semiconductor layers 11 and the second semiconductor layers 12 may be alternately stacked on the substrate 1000. For example, one of the first semiconductor layers 11 may be formed as a lowermost layer of the stack structure 10, and one of the second semiconductor layers 12 may be formed as an uppermost layer of the stack structure 10. However, the present disclosure is not limited to this example. In another example, a first semiconductor layer 11 may be formed as the uppermost layer of the stack structure 10. The first semiconductor layers 11 may include, for example, SiGe. The second semiconductor layers 12 may include, for example, Si.

Thereafter, a portion of the stack structure 10 may be etched. A portion of the substrate 1000 may also be etched while the portion of the stack structure 10 is being etched. As a result, first and second active patterns F1 and F2 may be defined below the stack structure 10, on a top surface 1000a of the substrate 1000. The first and second active patterns F1 and F2 may extend in a first horizontal direction DR1. The second active pattern F2 may be spaced apart from the first active pattern F1 in a second horizontal direction DR2.

Figure 8:
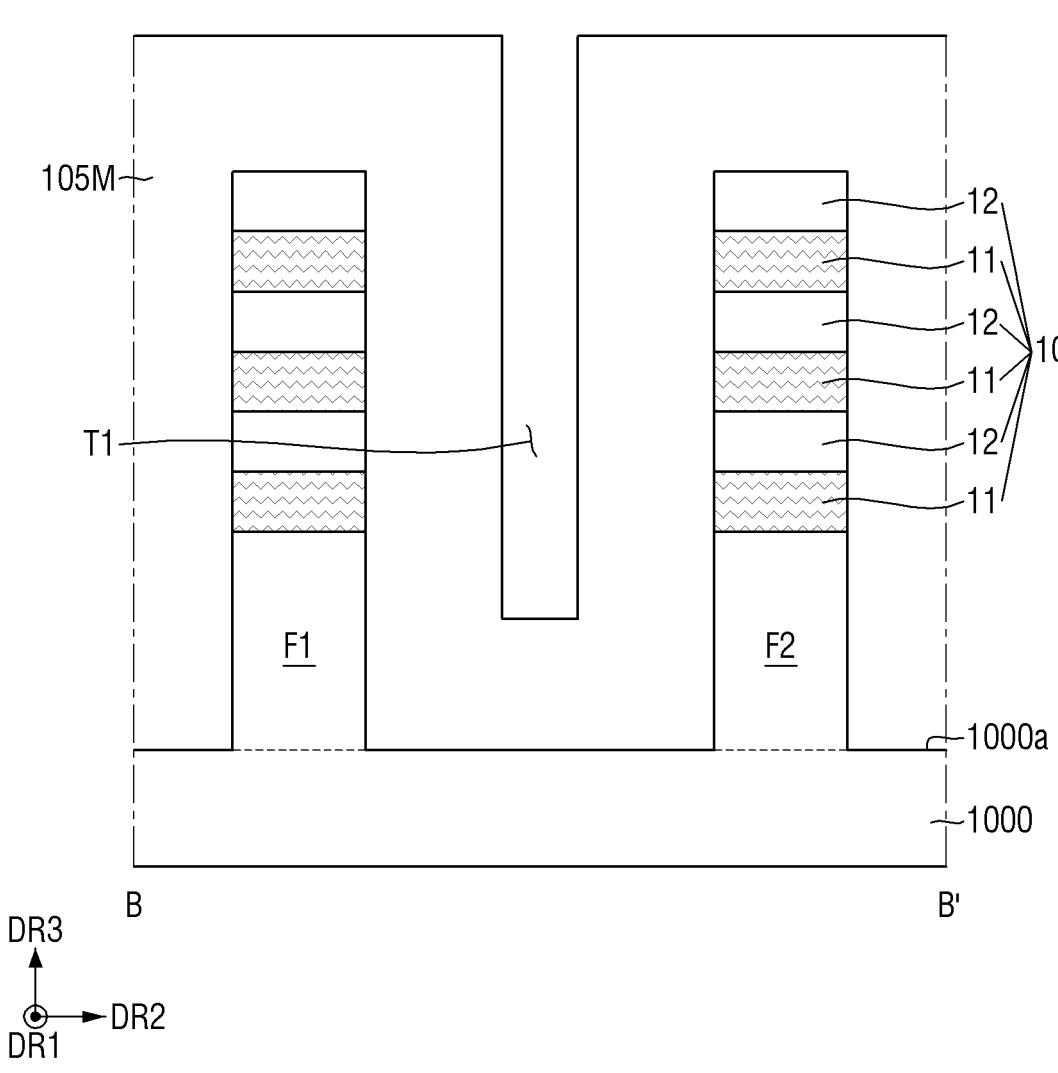

Referring to FIG. 8, a field material layer 105M may be formed on the top surface 1000a of the substrate 1000, sidewalls of the first active pattern F1, sidewalls of the second active pattern F2, and sidewalls and the top surface of the stack structure 10. For example, the field material layer 105M may be conformally formed. The field material layer 105M may include, for example, a silicon oxide film, a silicon nitride film, a silicon oxynitride film, or a combination thereof. A first trench T1 may be defined between the first and second active patterns F1 and F2 by the field material layer 105M.

Figure 9:
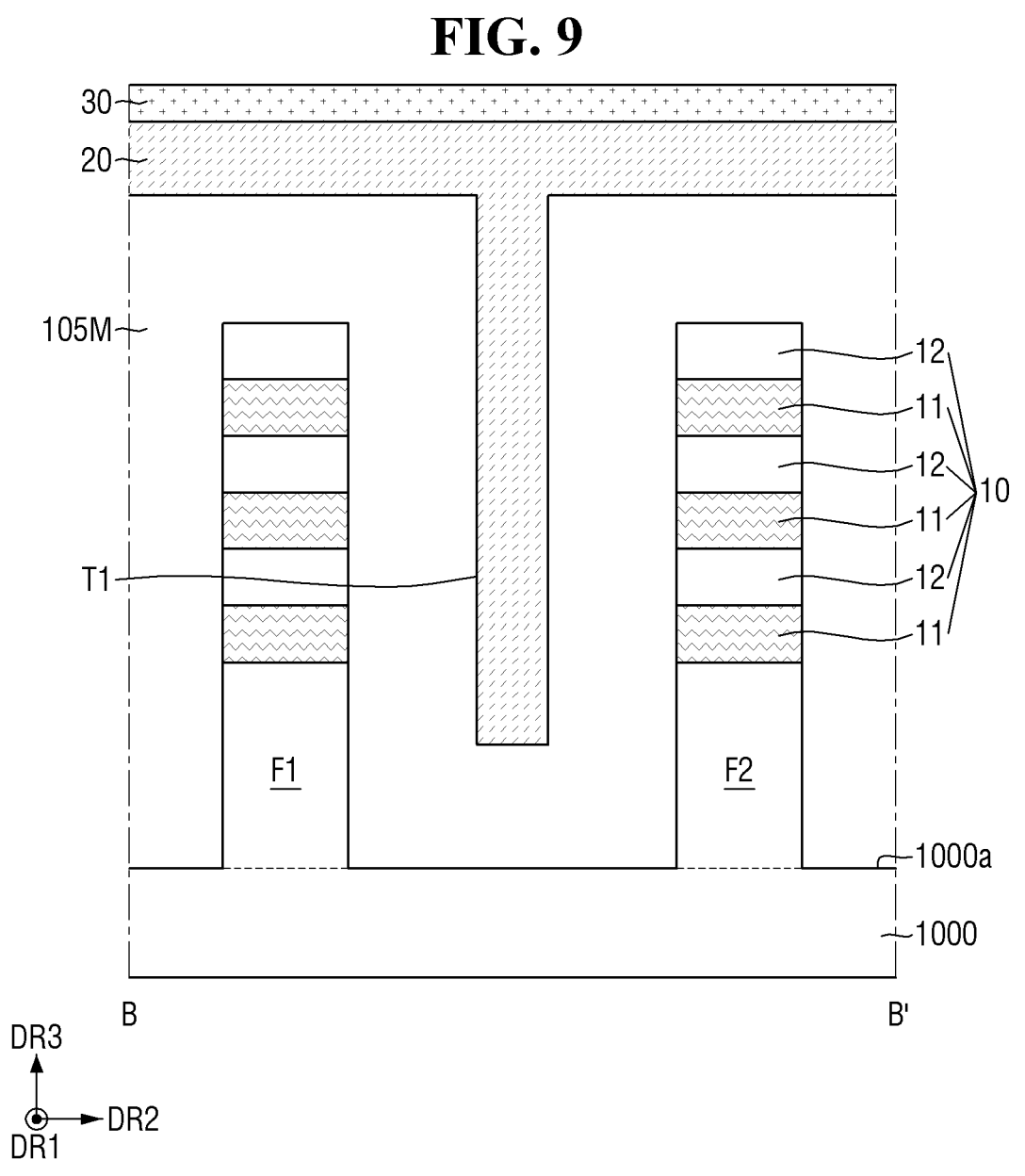
Figure 10:
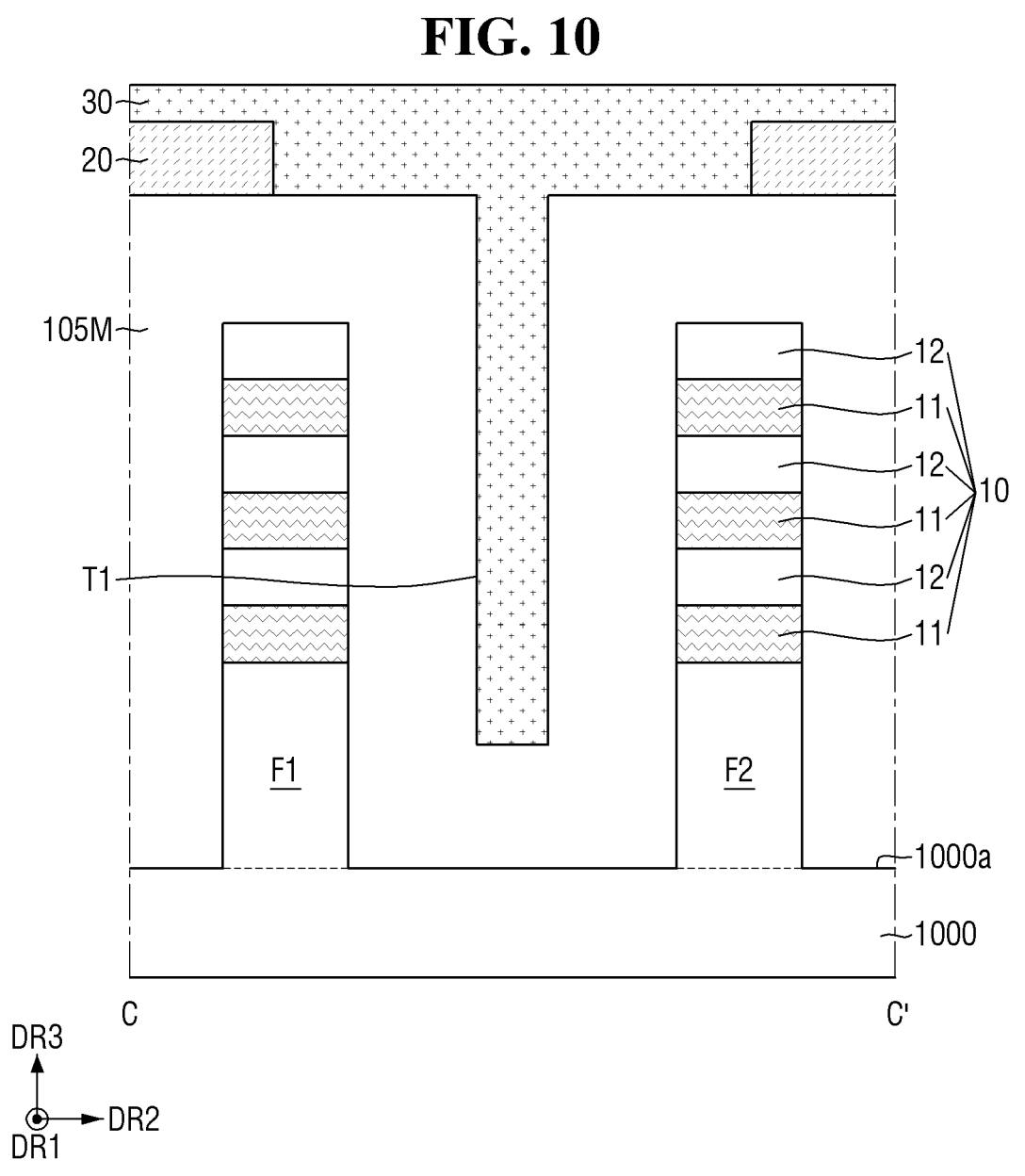

Referring to FIGS. 9 and 10, a passivation layer 20 may be formed on the field material layer 105M. For example, the passivation layer 20 may not be formed on a portion of the first trench T1. That is, a portion of the first trench T1 may be exposed after the formation of the passivation layer 20. A portion of the field material layer 105M adjacent the exposed portion of the first trench T1 may also be exposed after the formation of the passivation layer 20. For example, the exposed portion of the first trench T1 may be the portion of the first trench T1 where the first through via 130 of FIG. 4 is formed. The passivation layer 20 may include, for example, a spin-on-hard mask (SOH).

Thereafter, a sacrificial layer 30 may be formed in the exposed portion of the first trench T1. The sacrificial layer 30 may completely fill the exposed portion of the first trench T1. For example, the sacrificial layer 30 may be formed even on the top surface of the exposed portion of the field material layer 105M and on the passivation layer 20. The sacrificial layer 30 may include, for example, aluminum oxide ($Al_2O_3$), TiN, or titanium oxide ($TiO_2$).

Figure 11:
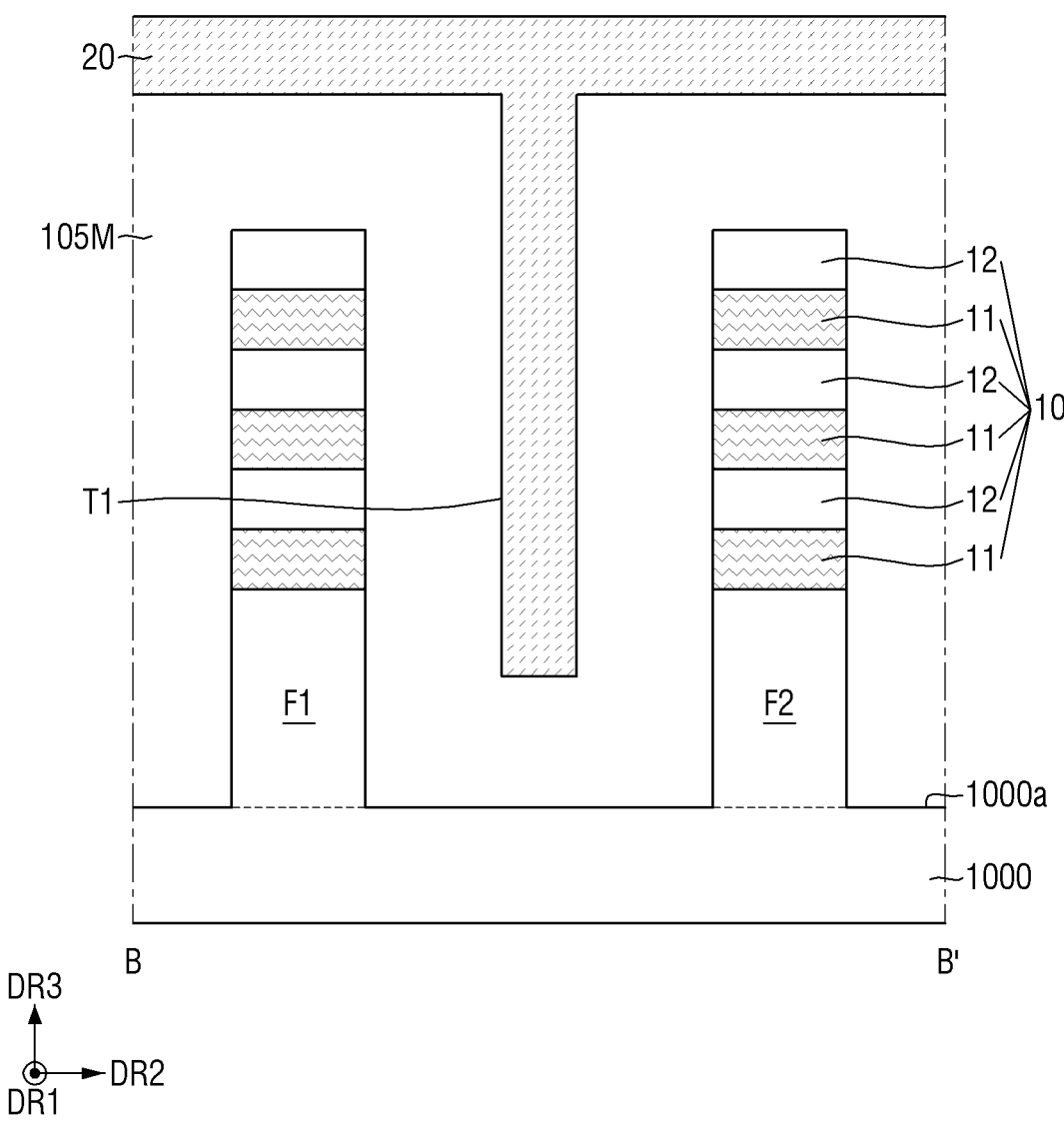
Figure 12:
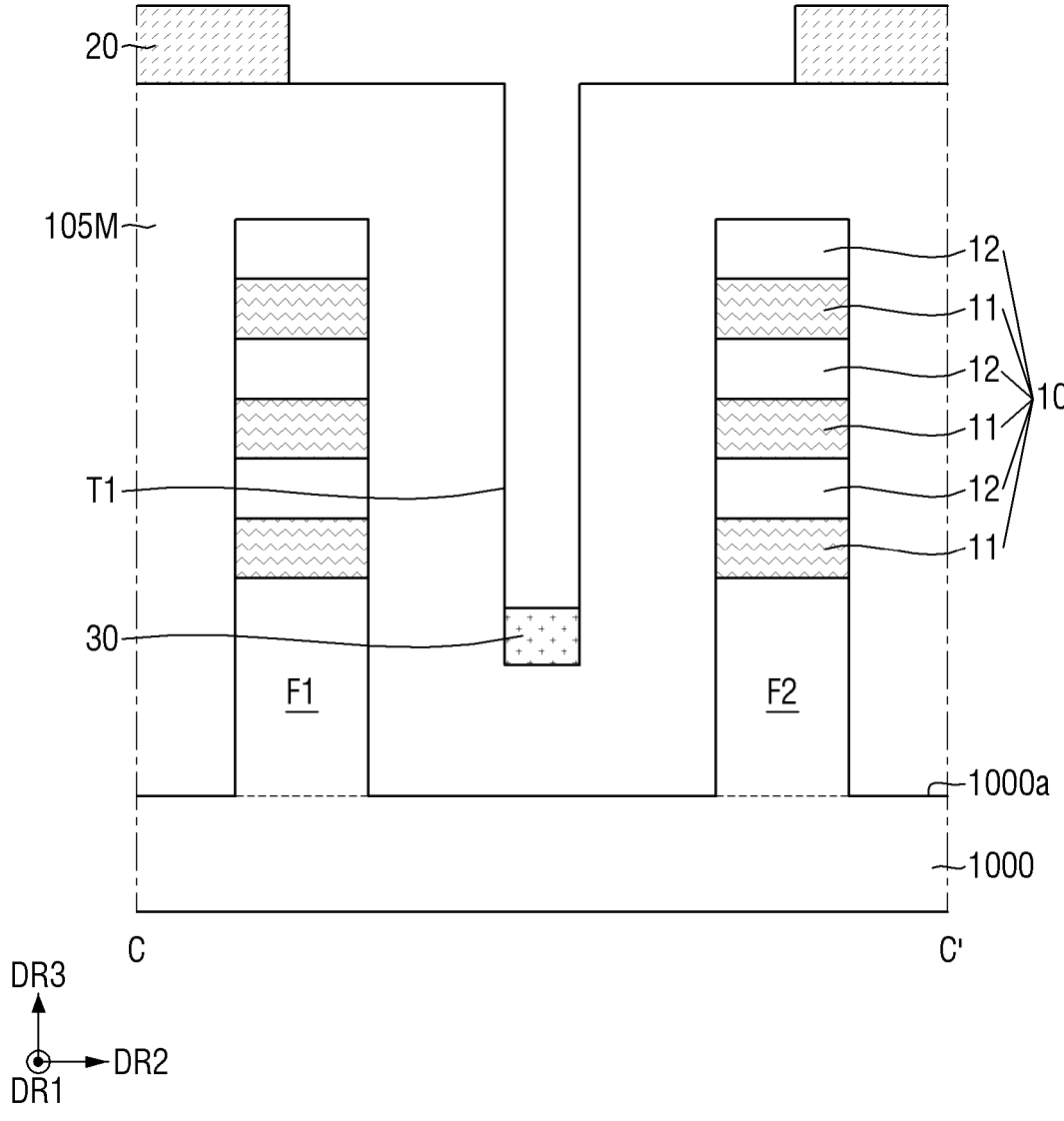

Referring to FIGS. 11 and 12, a portion of the sacrificial layer 30 may be etched by an etch-back process. After the etch-back process, the sacrificial layer 30 may be etched away from the top surface of the field material layer 105M and from the passivation layer 20. A portion of the sacrificial layer 30 may remain on a bottom surface of the first trench T1 after the etch-back process. The sacrificial layer 30 may partially fill the first trench T1.

Figure 13:
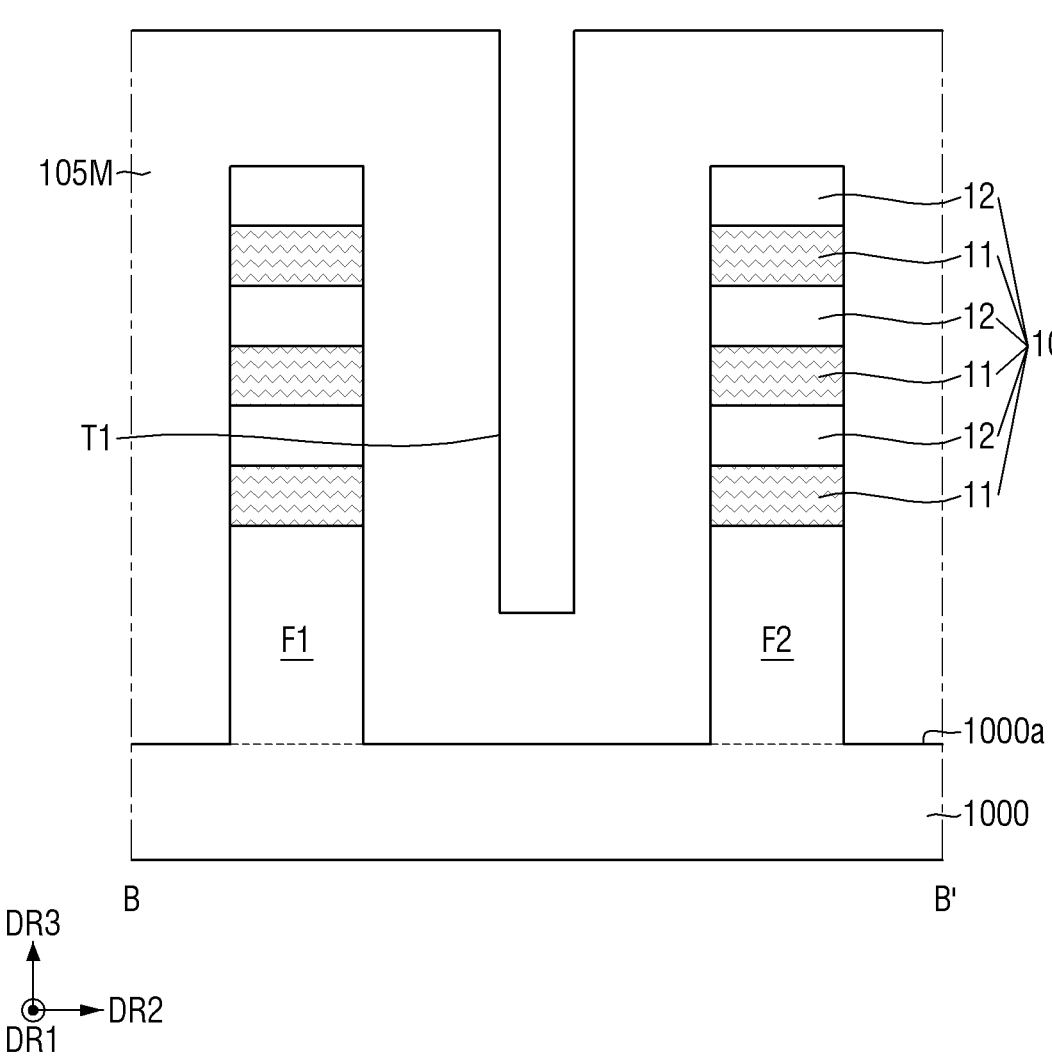
Figure 14:
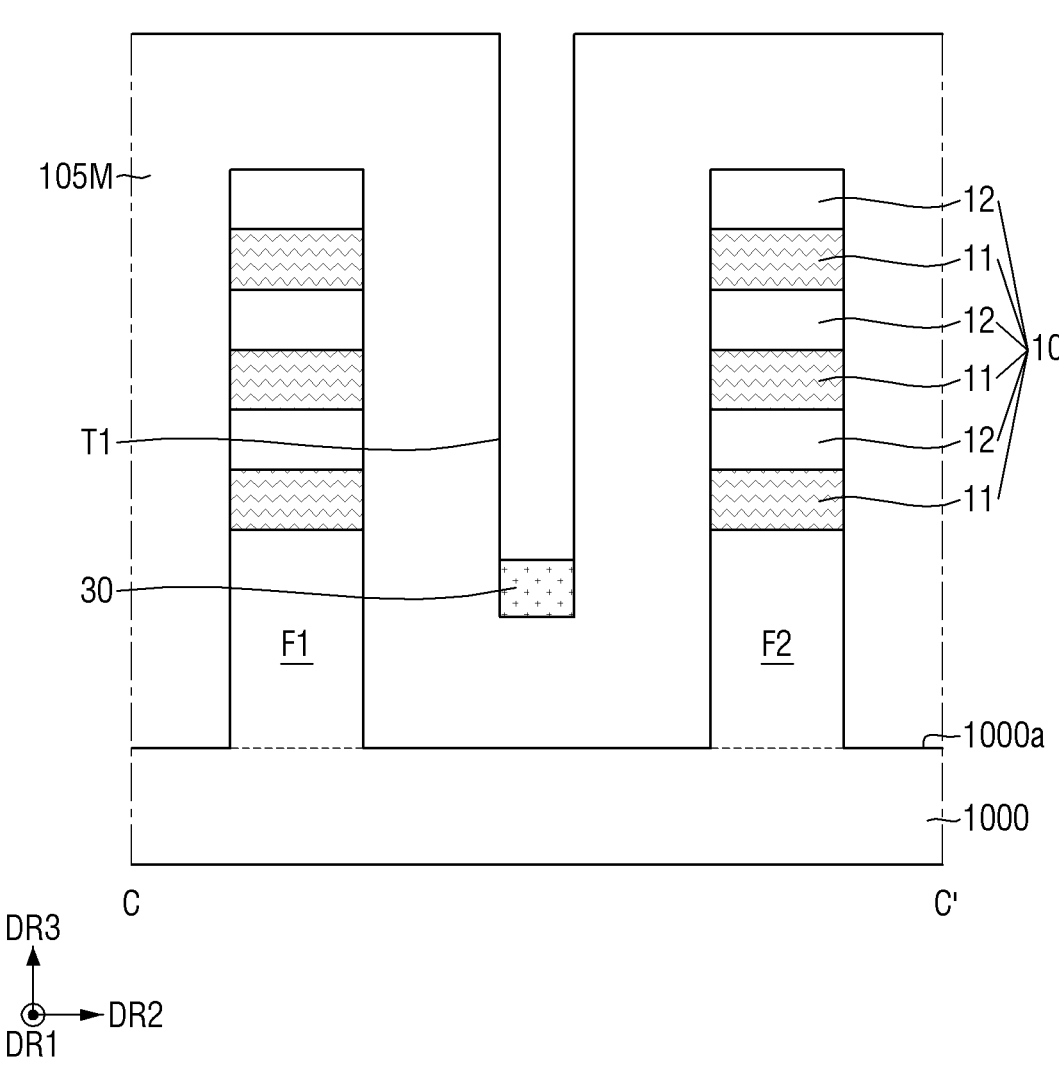

Referring to FIGS. 13 and 14, the passivation layer 20 may be removed.

Figure 15:
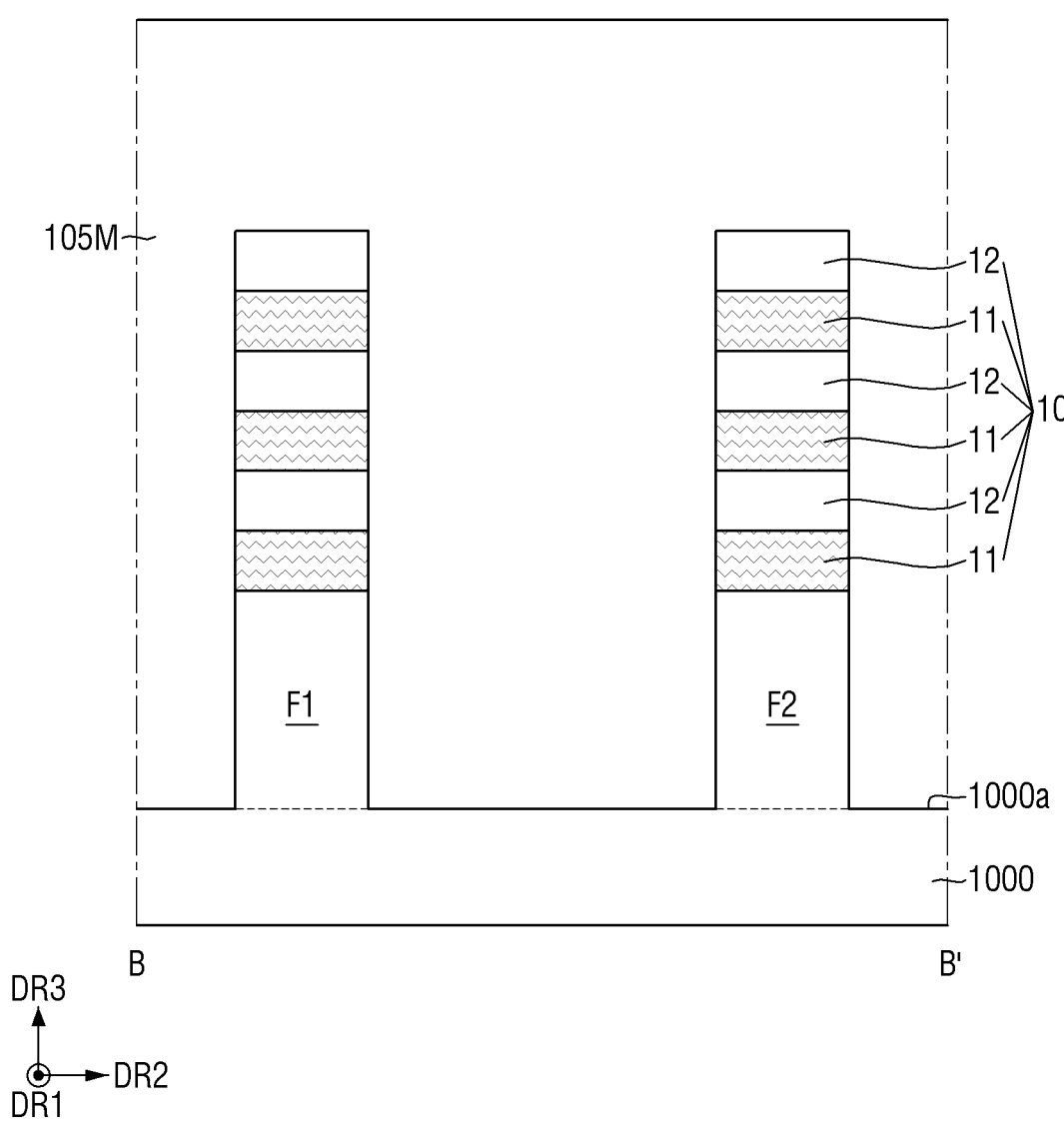
Figure 16:
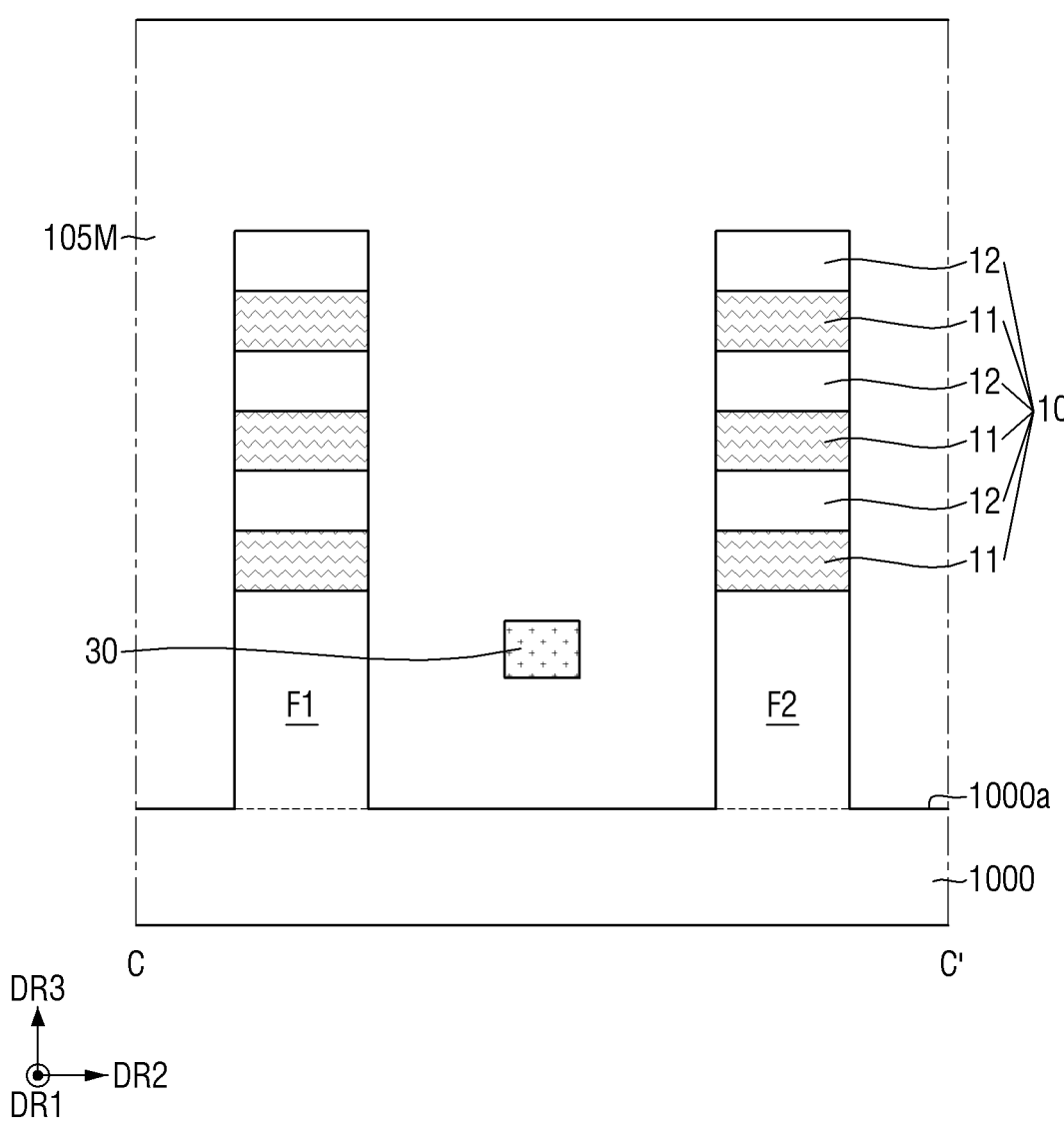

Referring to FIGS. 15 and 16, an additional field material layer 105M may be formed on the (remaining) sacrificial layer 30 to fill the first trench T1. The additional field material layer 105M may be formed even on the existing field material layer 105M.

Figure 17:
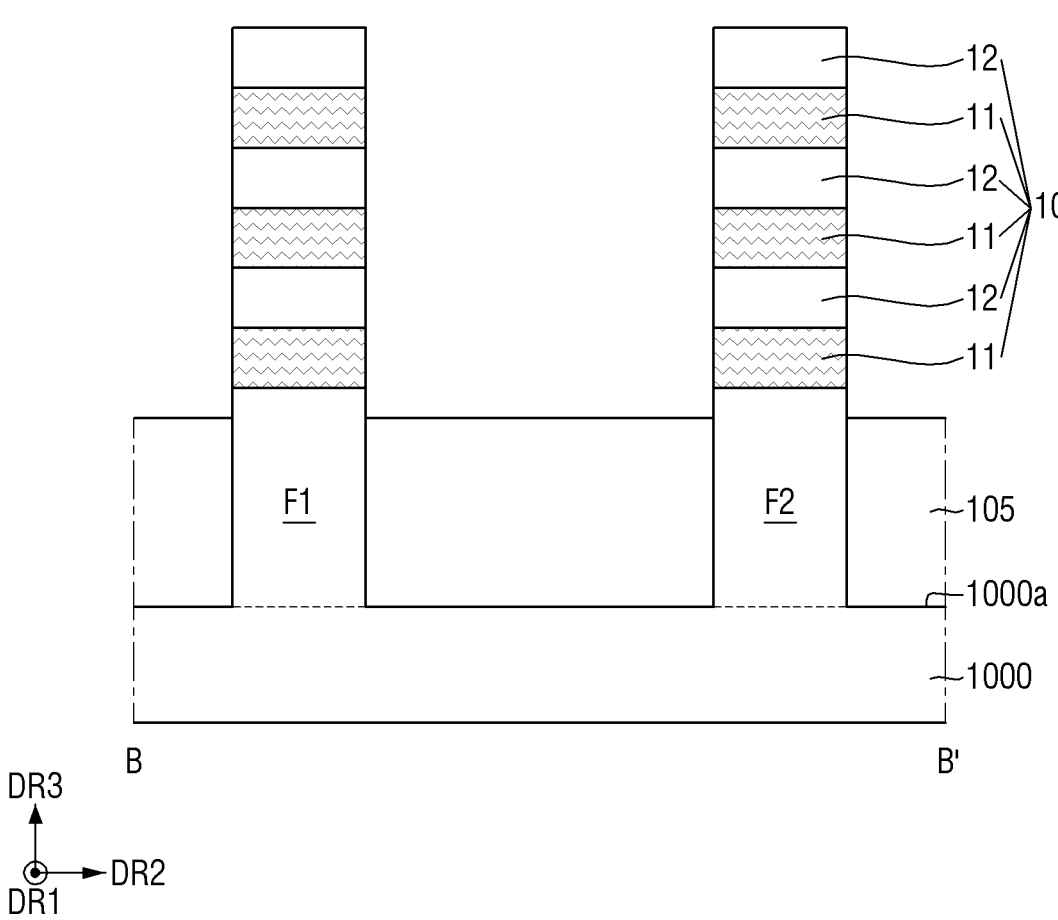
Figure 18:
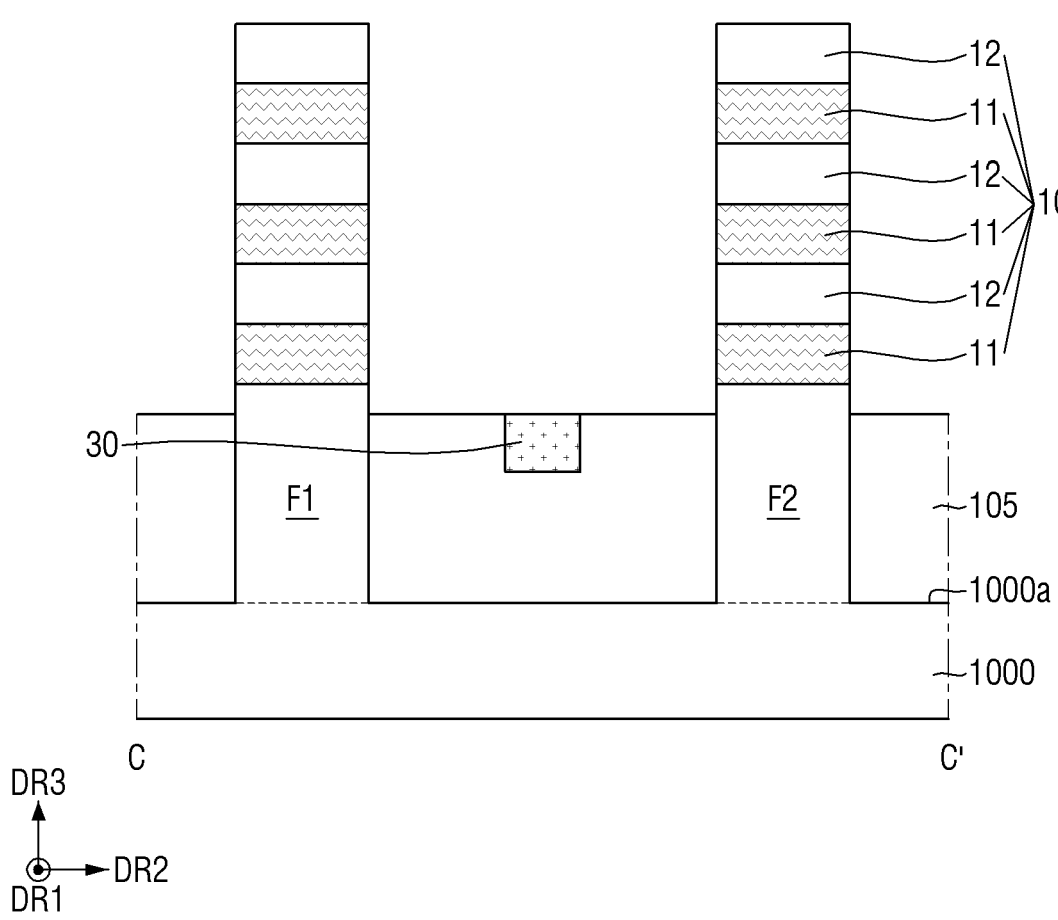

Referring to FIGS. 17 and 18, a field insulating layer 105 may be formed by partially etching the field material layer 105M (including the additional field material layer 105M). For example, the top surface of the field insulating layer 105 may be formed to be lower than the top surfaces of the first and second active patterns F1 and F2. After the etching of the field material layer 105M, the top surface of the (remaining) sacrificial layer 30 may be exposed.

Figure 19:
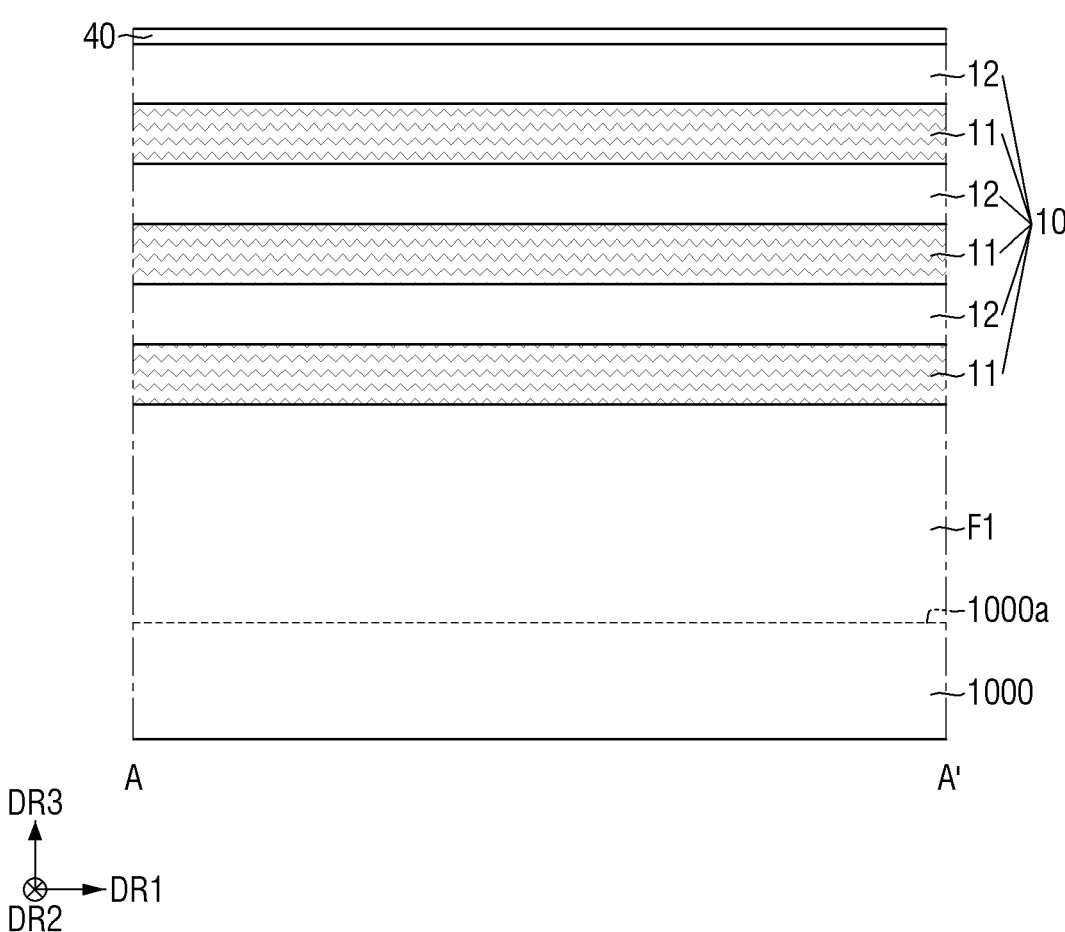
Figure 20:
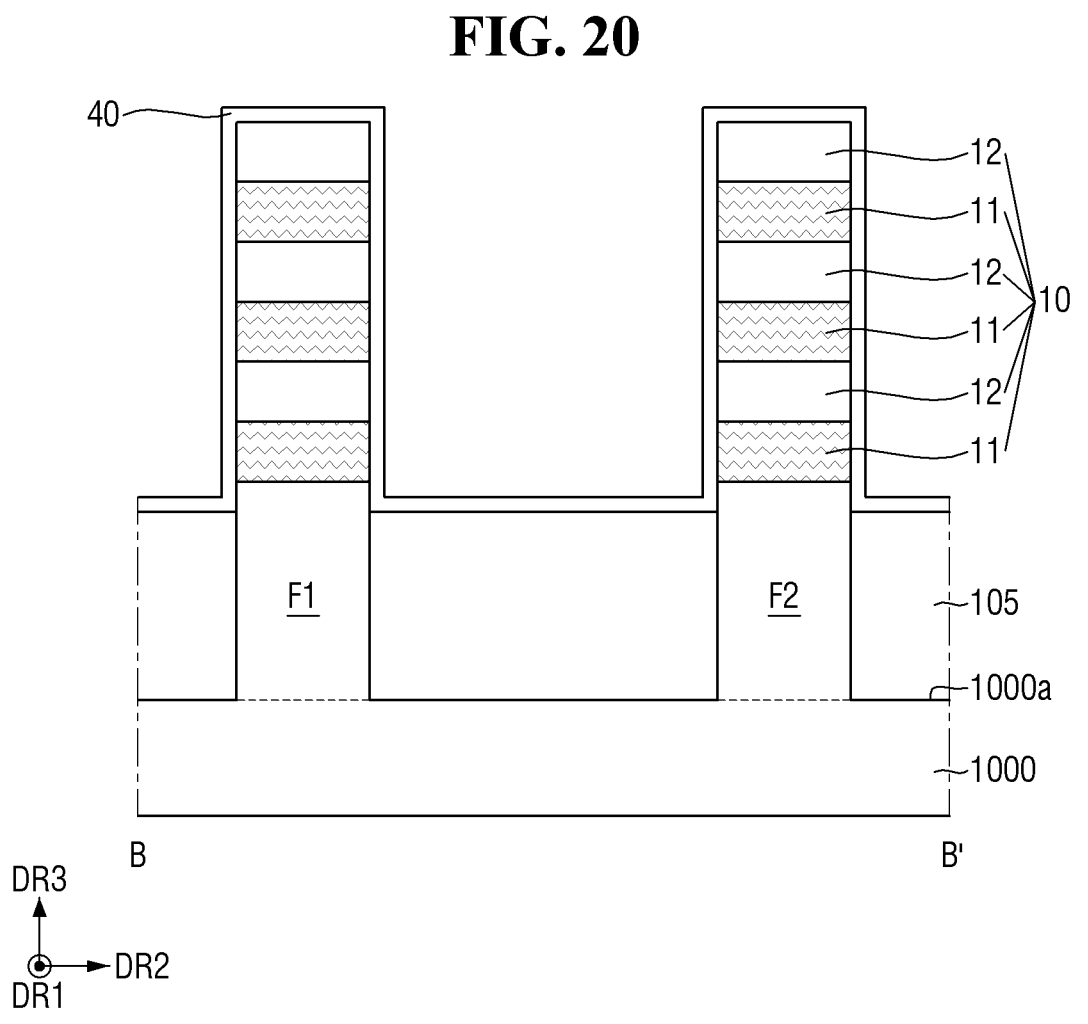
Figure 21:
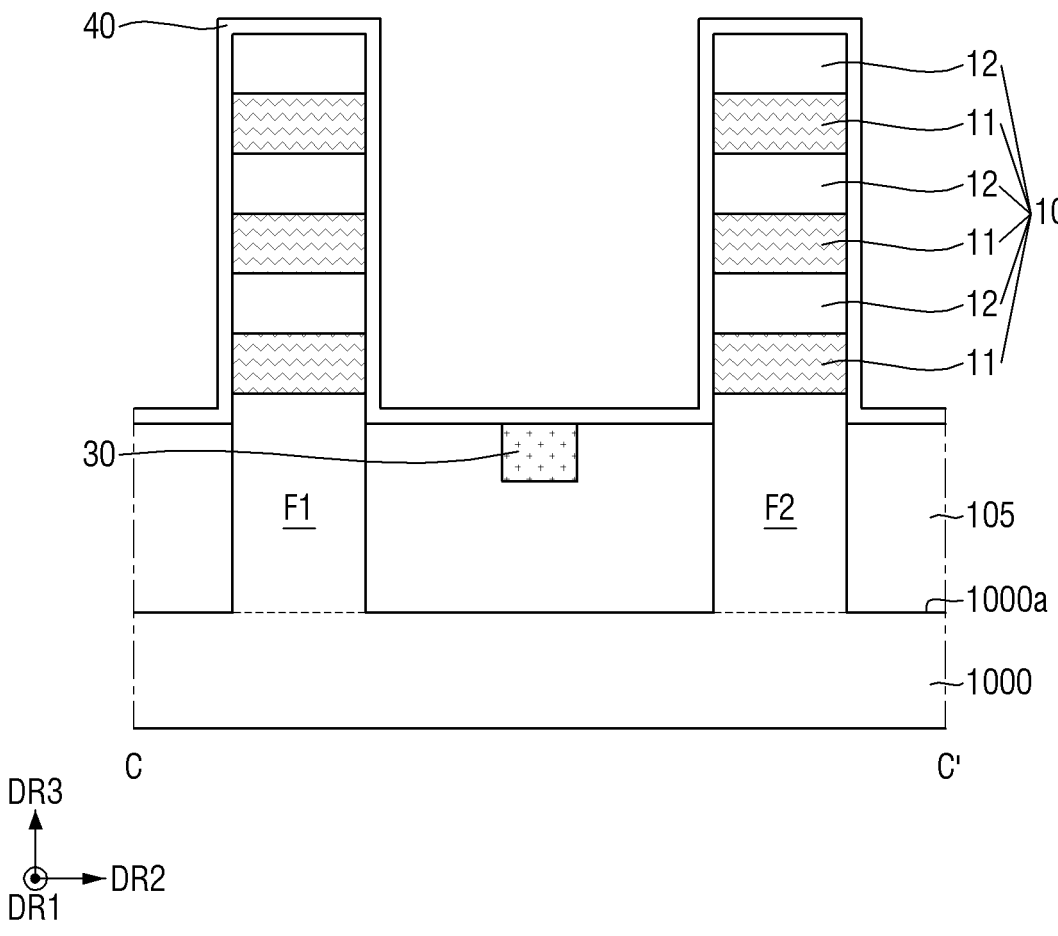

Referring to FIGS. 19 through 21, a pad oxide layer 40 may be formed on (e.g., cover) the top surface of the field insulating layer 105, the top surface of the (remaining) sacrificial layer 30, exposed sidewalls of each of the first and second active patterns F1 and F2, and the sidewalls and the top surface of the stack structure 10. For example, the pad oxide layer 40 may be conformally formed. The pad oxide layer 40 may include, for example, $SiO_2$.

Figure 22:
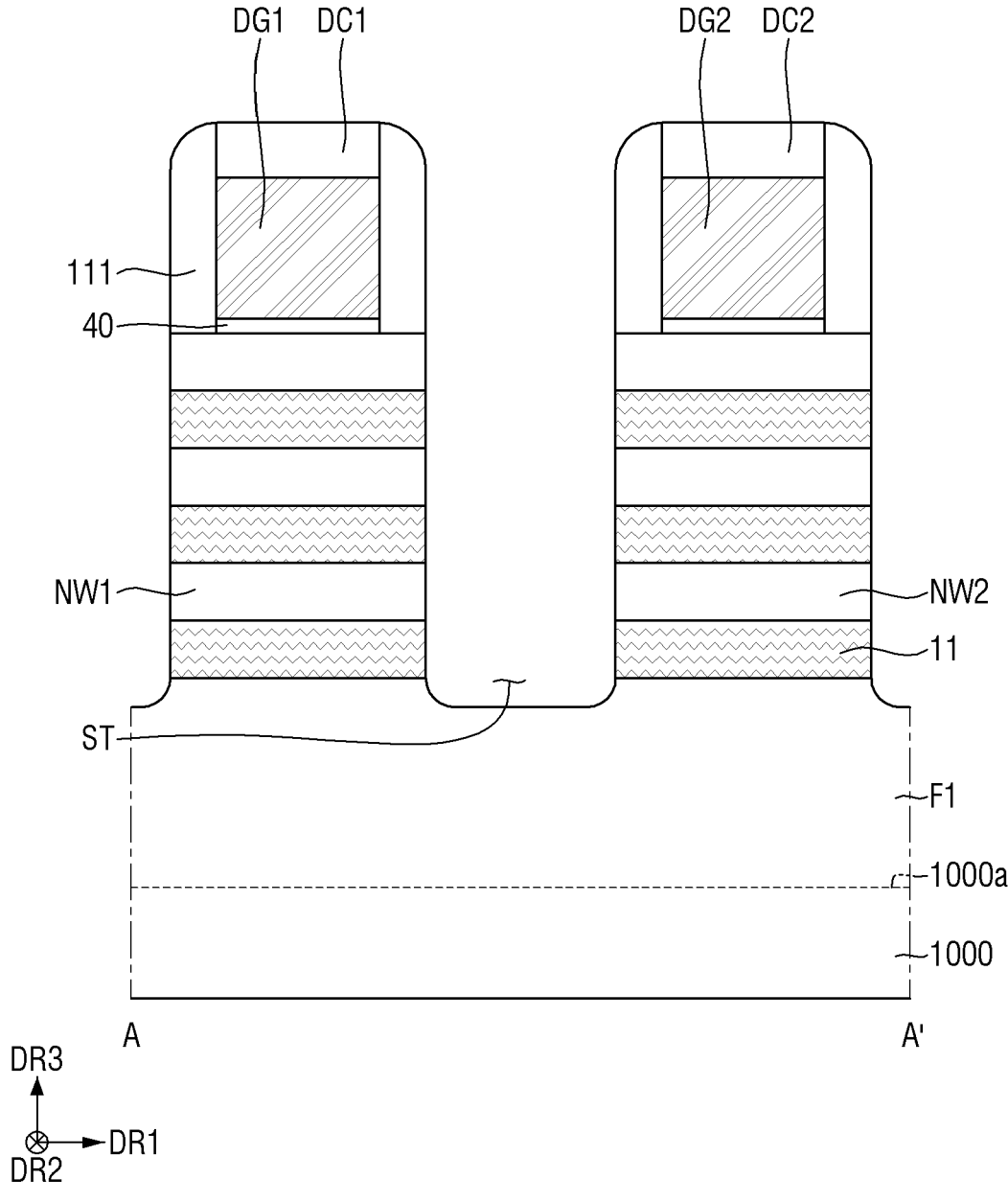
Figure 23:
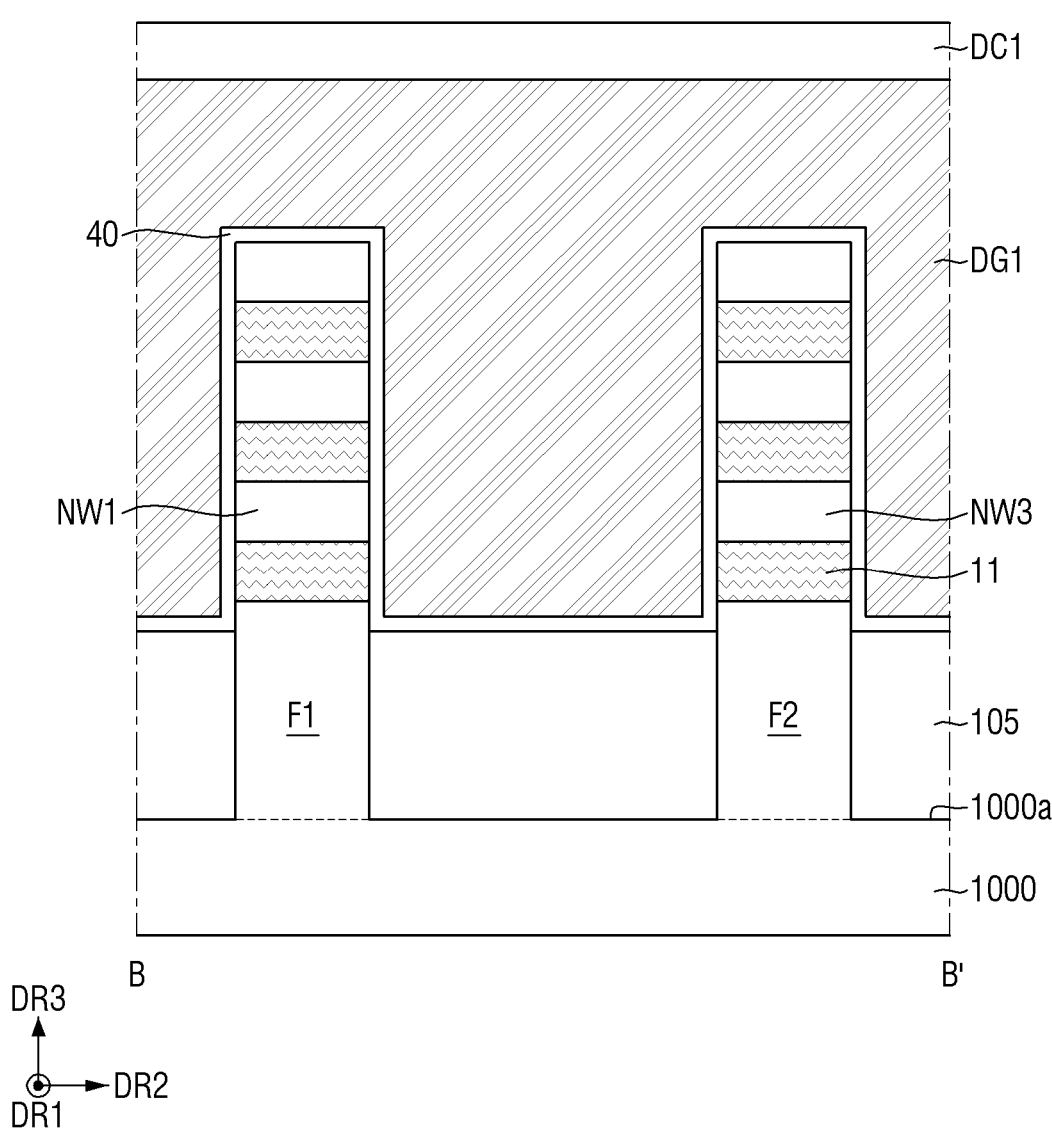
Figure 24:
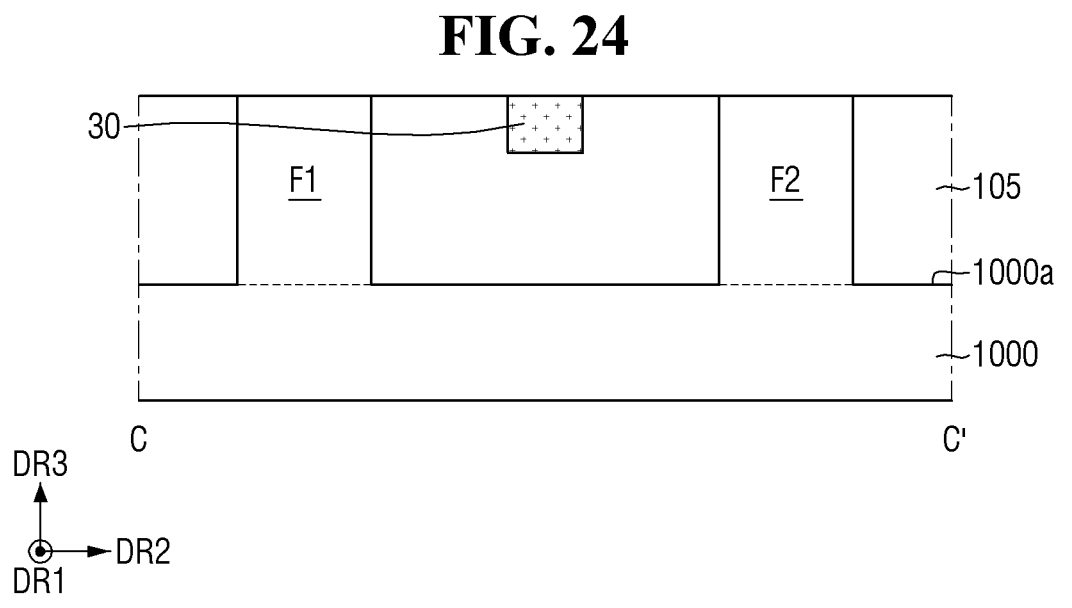

Referring to FIGS. 22 through 24, first and second dummy gates DG1 and DG2 and first and second dummy capping patterns DC1 and DC2 may be formed on the stack structure 10 and the field insulating layer 105 to extend in the second horizontal direction DR2 on the pad oxide layer 40. Specifically, the second dummy gate DG2 may be spaced apart from the first dummy gate DG1 in the first horizontal direction DR1. The first dummy capping pattern DC1 may be disposed on the first dummy gate DG1. The second dummy capping pattern DC2 may be disposed on the second dummy gate DG2. During the formation of the first and second dummy gates DG1 and DG2 and the first and second dummy capping patterns DC1 and DC2, the entire pad oxide layer 40 except for portions overlapping vertically (e.g., in the vertical direction DR3) with the first and second dummy gates DG1 and DG2 may be removed.

Thereafter, a spacer material layer may be formed on (e.g., cover) the sidewalls of each of the first and second dummy gates DG1 and DG2, the sidewalls and the top surface of each of the first and second dummy capping patterns DC1 and DC2, the sidewalls and the top surface of the stack structure 10, and the top surface of the field insulating layer 105. For example, the spacer material layer may be conformally formed. The spacer material layer may include, for example, SiN, SiOCN, SiBCN, SiCN, SiON, and/or a combination thereof.

The stack structure 10 may be etched using the first and second dummy gates DG1 and DG2 and the first and second dummy capping patterns DC1 and DC2 as a mask, and as a result, a source/drain trench ST may be formed. For example, the source/drain trench ST may extend into the first active pattern F1.

During the formation of the source/drain trench ST, portions of the spacer material layer on the top surfaces of the first and second dummy capping patterns DC1 and DC2 and parts of the first and second dummy capping patterns DC1 and DC2 may be removed. Portions of the spacer material layer that remain on the sidewalls of each of the first and second dummy capping patterns DC1 and DC2 and on the sidewalls of each of the first and second dummy gates DG1 and DG2 may be defined as gate spacers 111.

For example, after the formation of the source/drain trench ST, the top surface of the sacrificial layer 30 may be exposed. For example, after the formation of the source/drain trench ST, second semiconductor layers 12 that remain below the first dummy gate DG1, on the first active pattern F1, may be defined as a first plurality of nanosheets NW1, second semiconductor layers 12 that remain below the second dummy gate DG2, on the first active pattern F1, may be defined as a second plurality of nanosheets NW2, and second semiconductor layers 12 that remain below the first dummy gate DG1, on the second active pattern F2, may be defined as a third plurality of nanosheets NW3.

Figure 25:
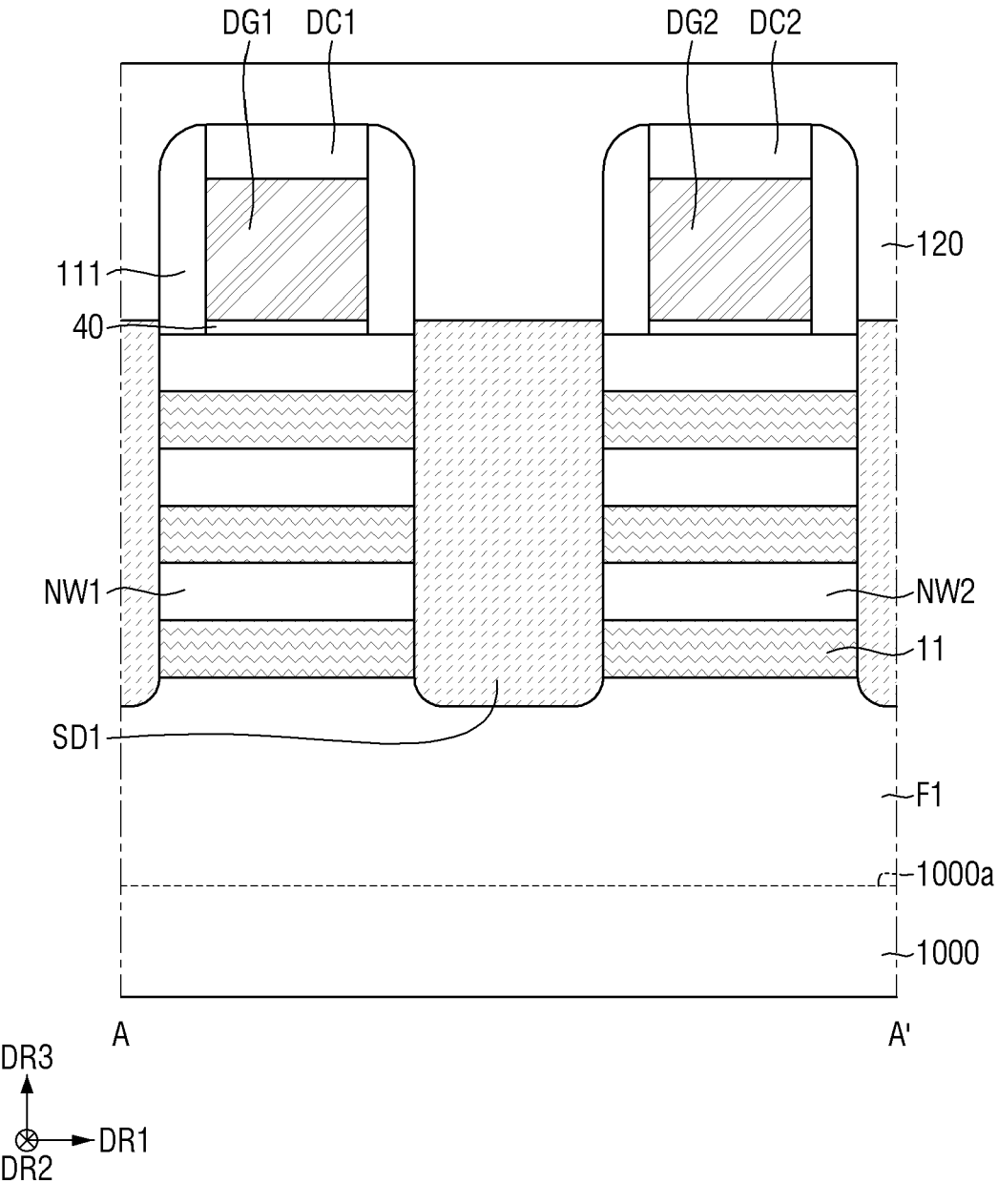
Figure 26:
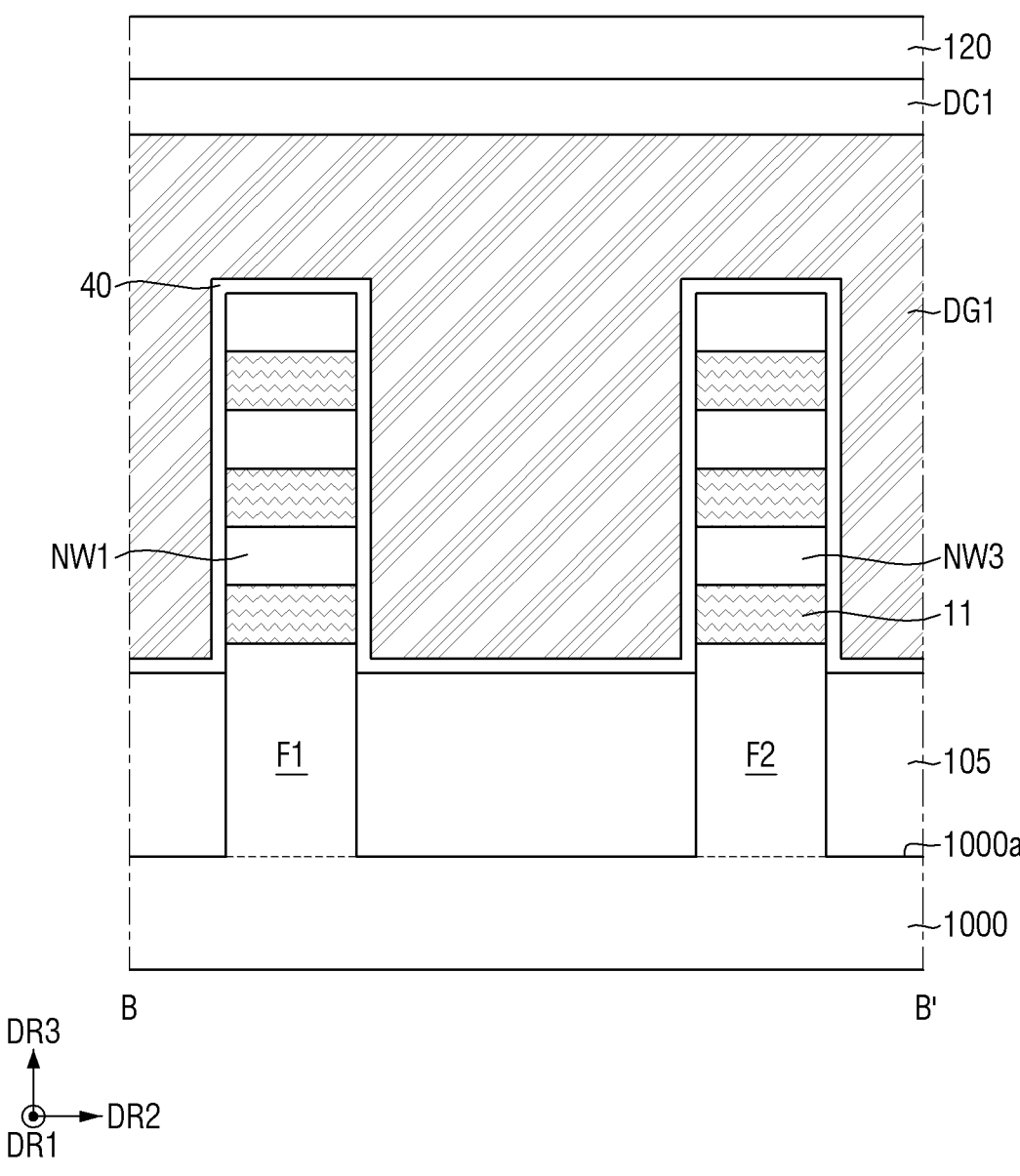
Figure 27:
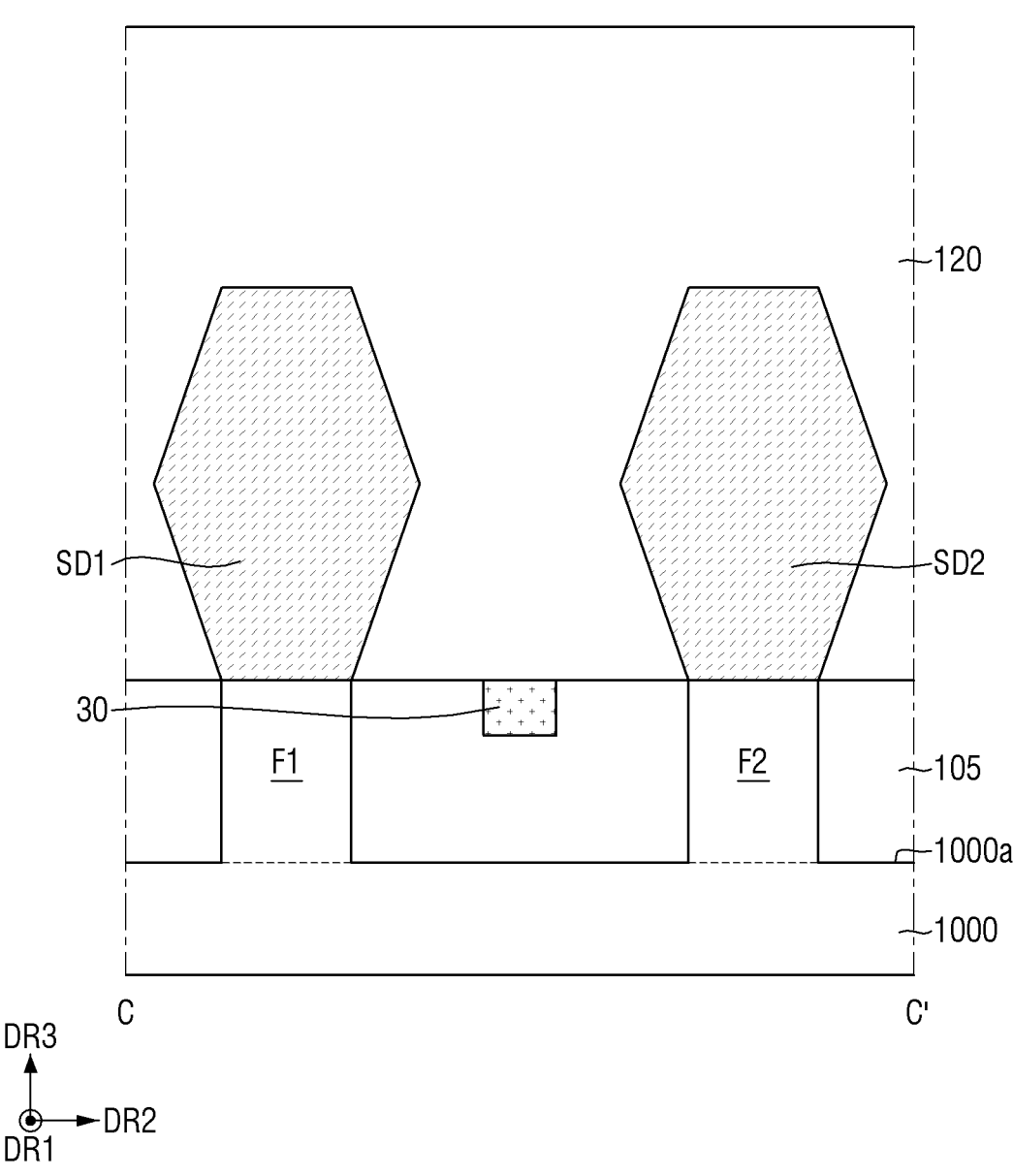

Referring to FIGS. 25 through 27, first and second source/drain regions SD1 and SD2 may be formed in the source/drain trench ST. For example, the first source/drain region SD1 may be formed on the first active pattern F1, between the first and second dummy gates DG1 and DG2, and the second source/drain region SD2 may be formed on the second active pattern F2, between the first and second dummy gates DG1 and DG2.

Thereafter, a first upper interlayer insulating layer 120 may be formed on (e.g., cover) the field insulating layer 105 and the first and second source/drain regions SD1 and SD2. The first upper interlayer insulating layer 120 may be on (e.g., cover) the gate spacers 111, the first dummy capping pattern DC1, and the second dummy capping pattern DC2.

Figure 28:
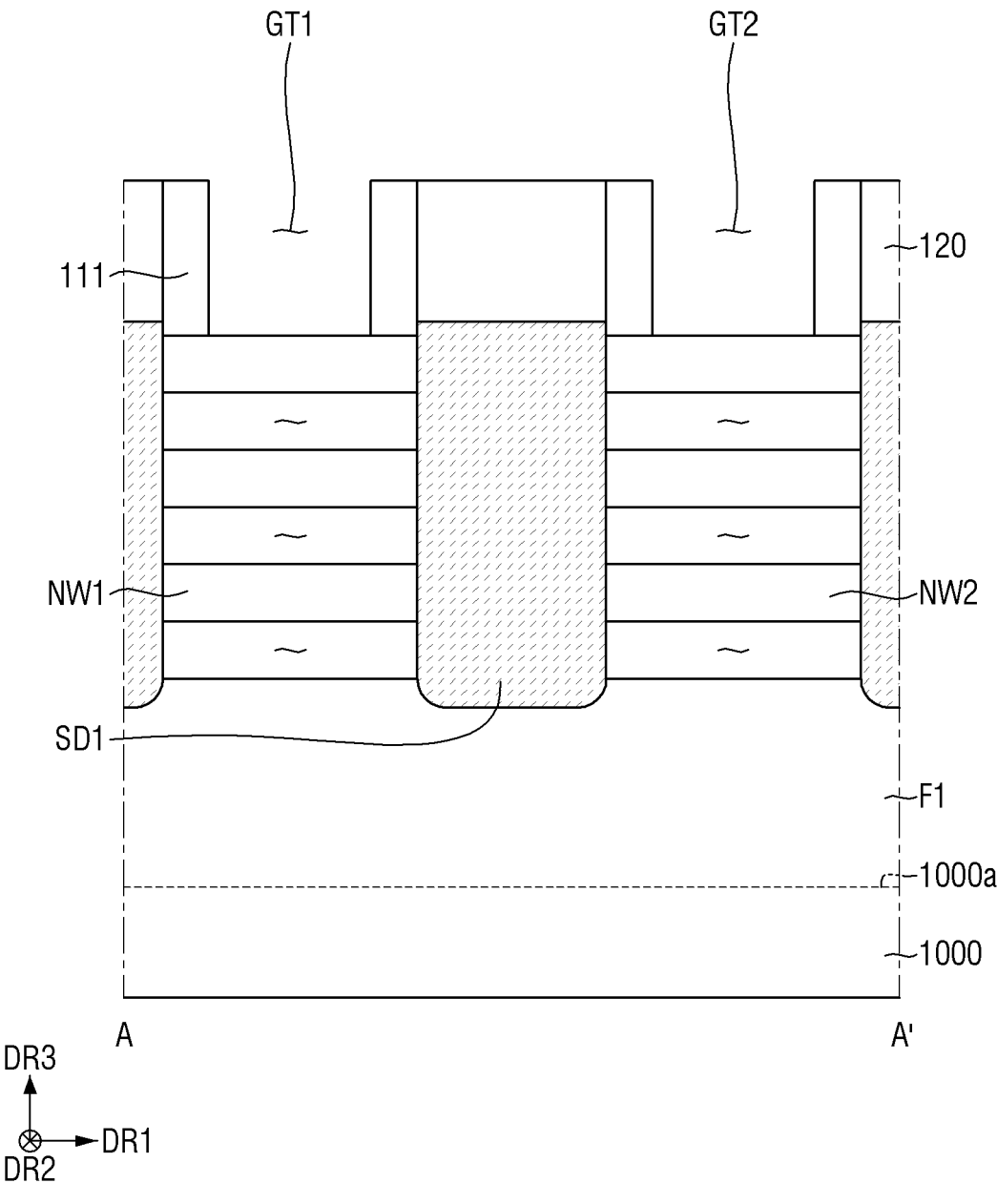
Figure 29:
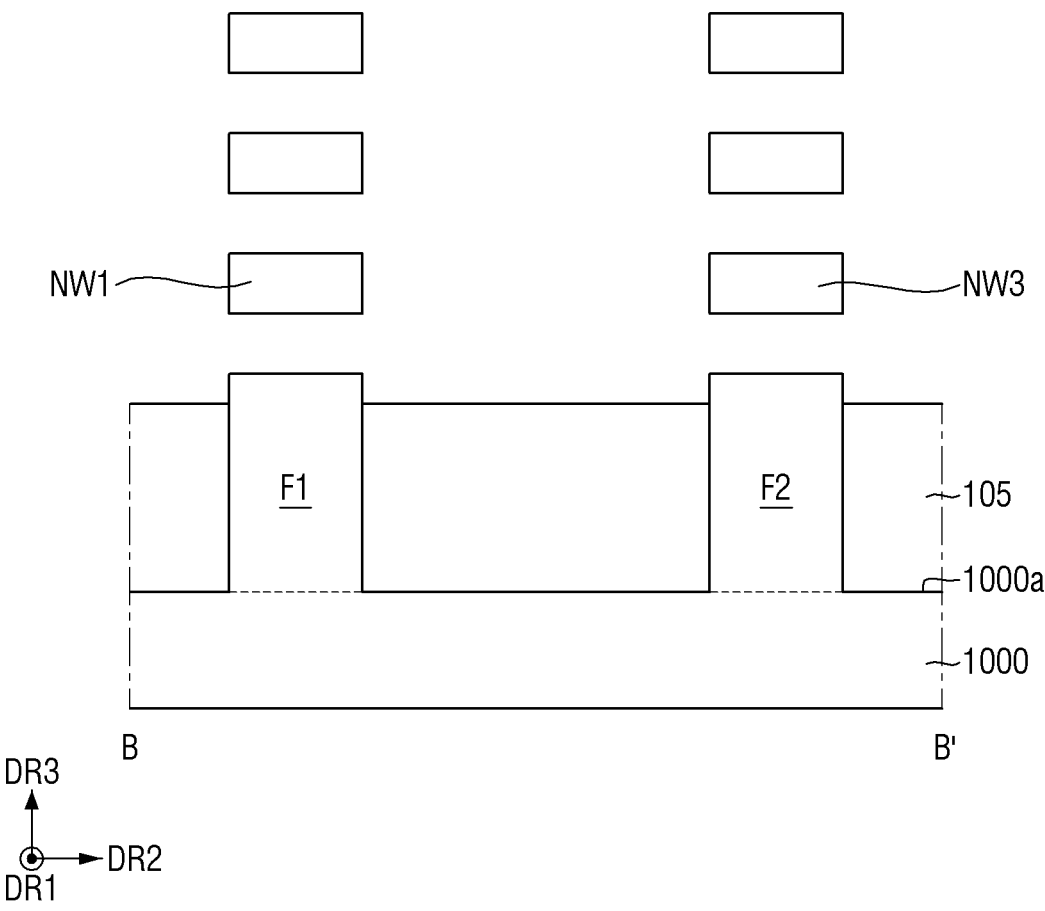
Figure 30:
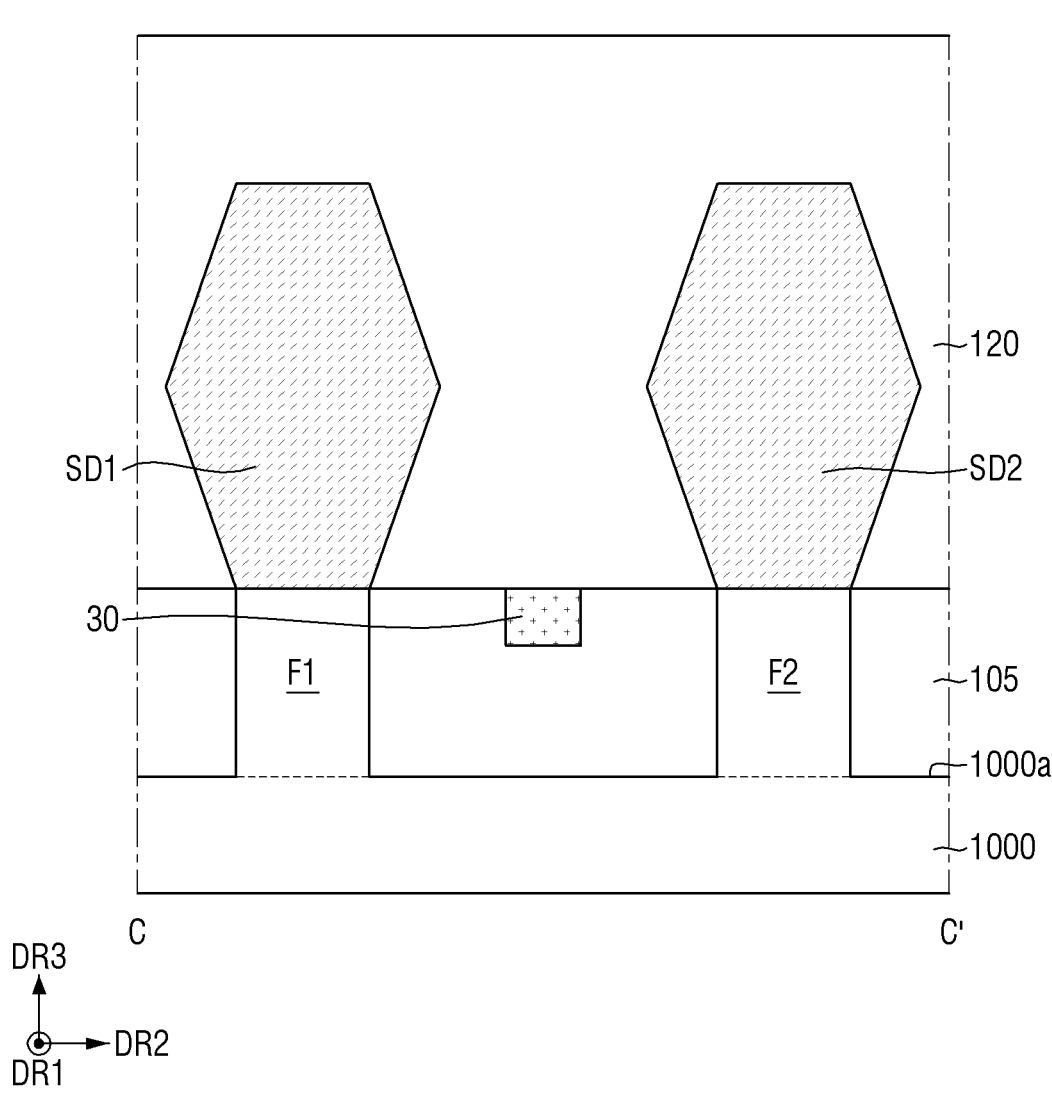

Referring to FIGS. 28 through 30, the top surfaces of the first and second dummy gates DG1 and DG2 may be exposed by a planarization process. Thereafter, the first and second dummy gates DG1 and DG2, the pad oxide layer 40, and the first semiconductor layers 11 may be removed. A region from which the first dummy gate DG1 is removed may be defined as a first gate trench GT1, and a region from which the second dummy gate DG2 is removed may be defined as a second gate trench GT2.

Figure 31:
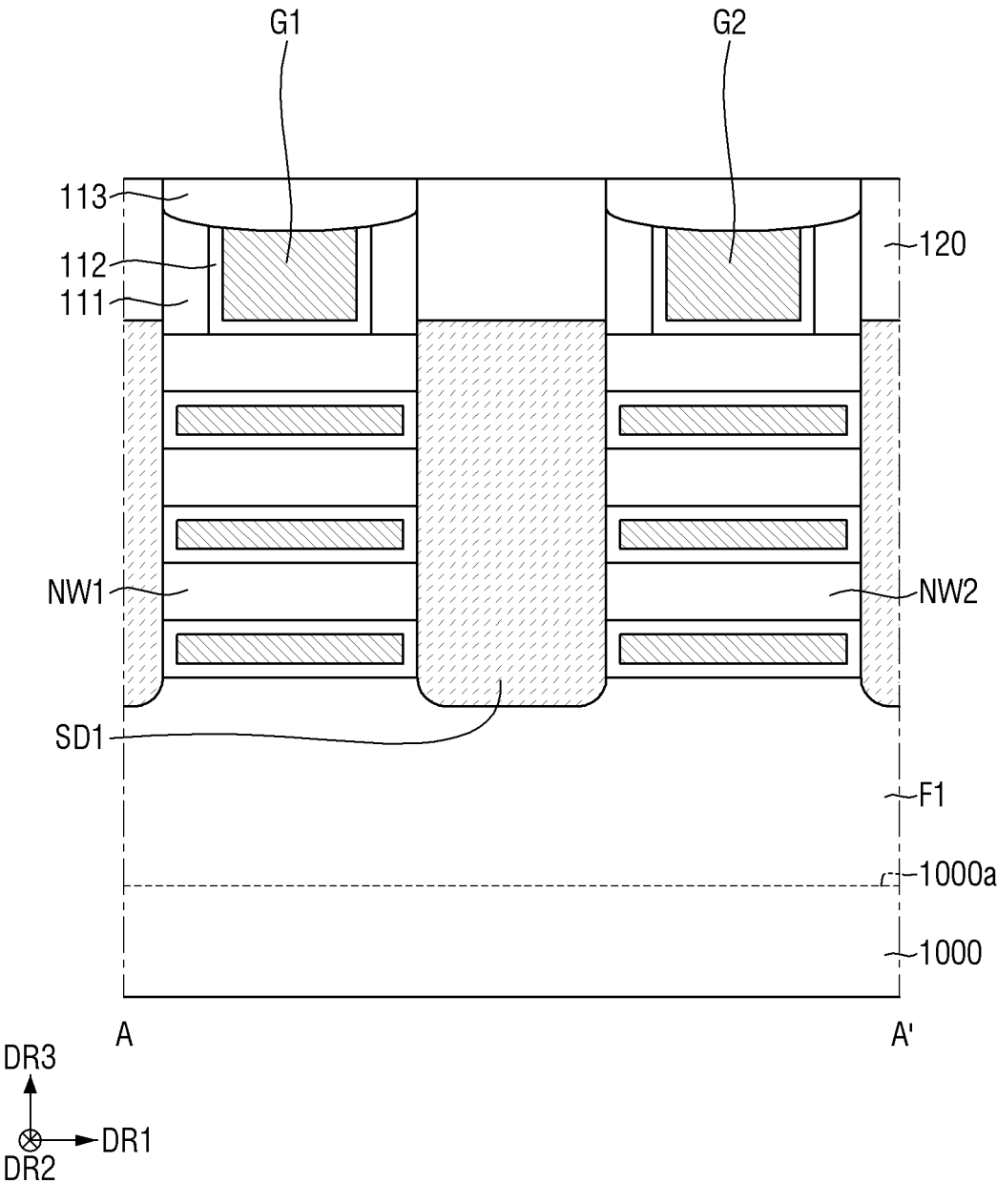
Figure 32:
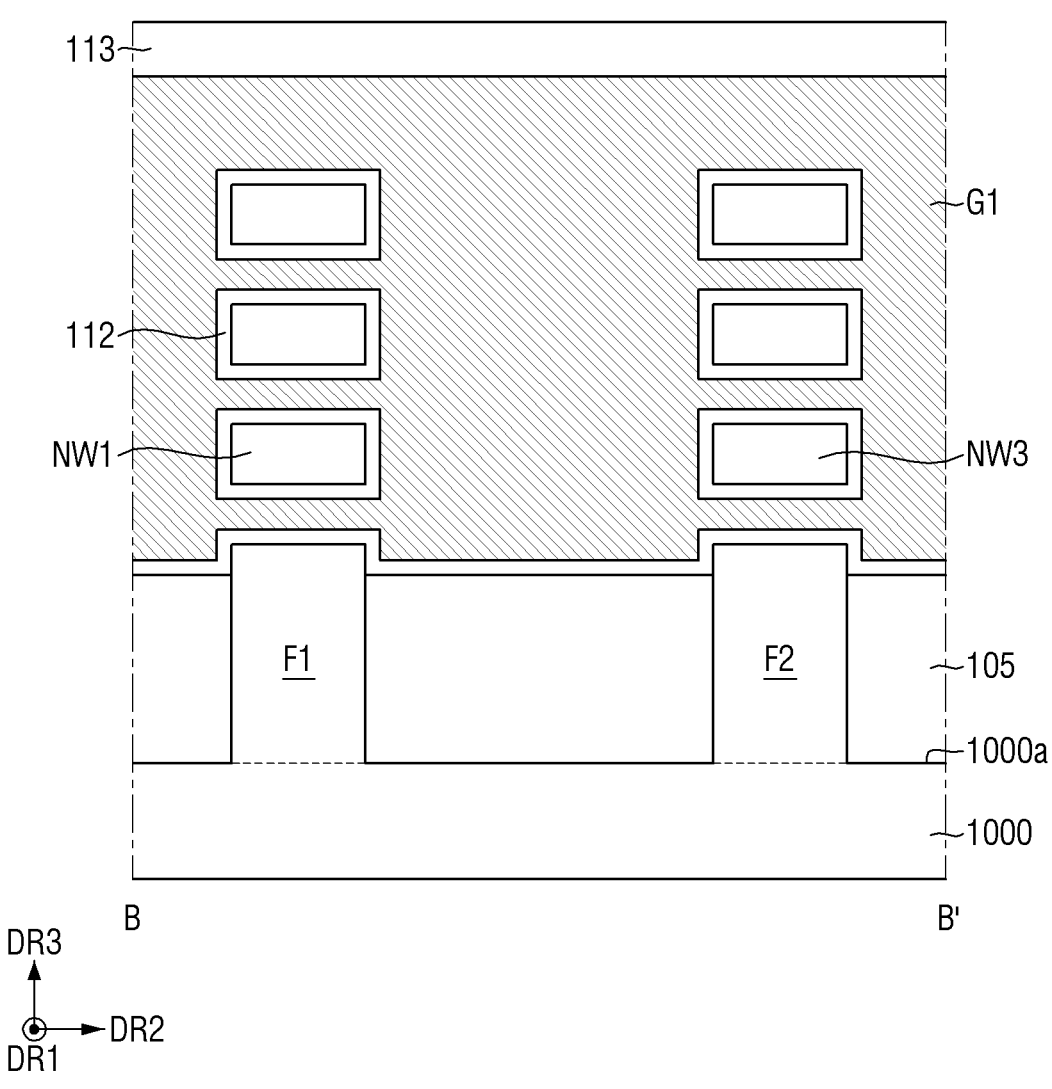

Referring to FIGS. 31 and 32, a gate insulating layer 112 and a first gate electrode G1 may be formed in the first gate trench GT1. The gate insulating layer 112 and a second gate electrode G2 may be formed in the second gate trench GT2. Thereafter, capping patterns 113 may be formed on the gate spacers 111, the gate insulating layer 112, the first gate electrode G1, and the second gate electrode G2.

Figure 33:
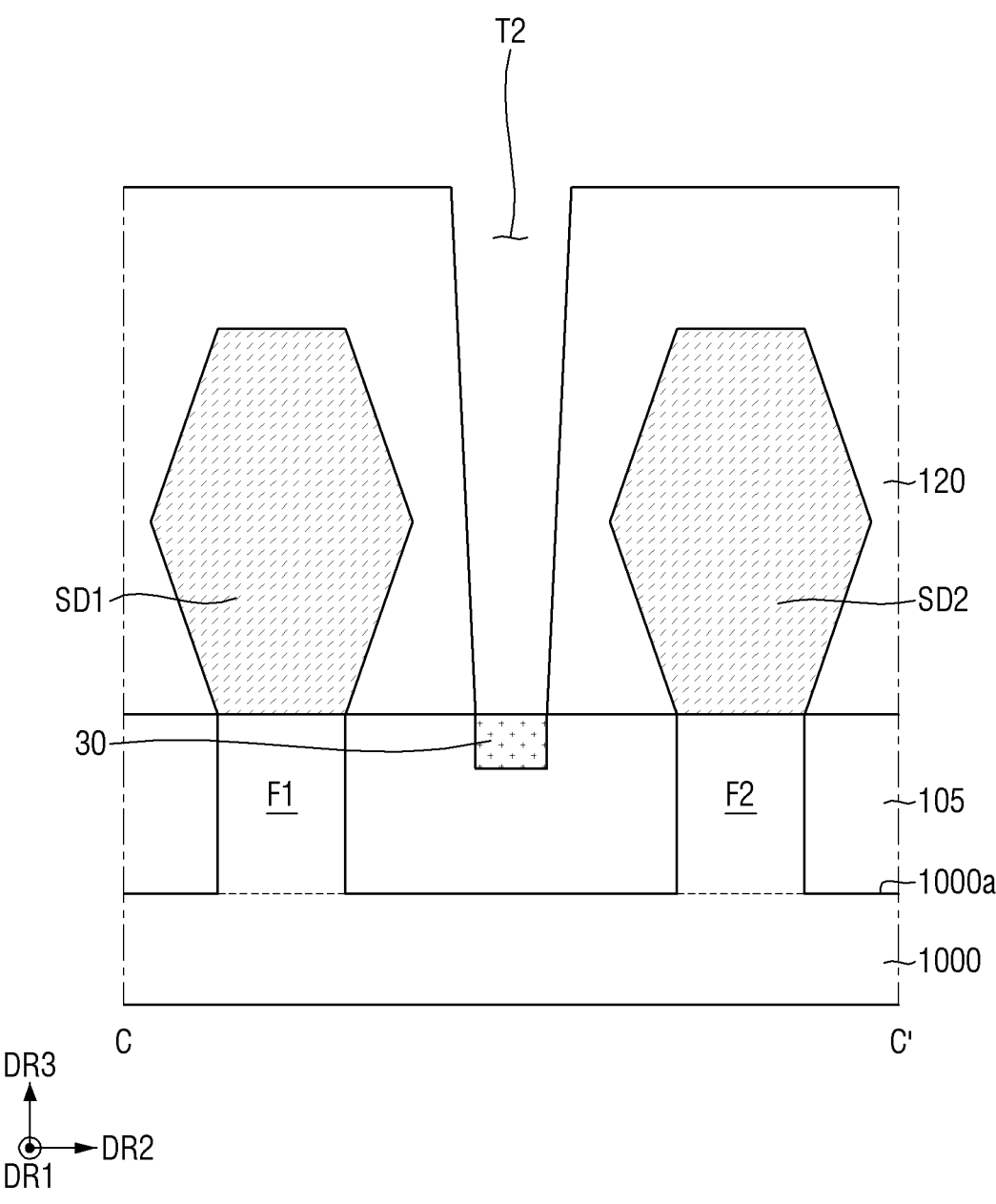

Referring to FIG. 33, a second trench T2, which extends through (e.g., penetrates) the first upper interlayer insulating layer 120 in a vertical direction DR3, may be formed. The second trench T2 may be formed between the first and second source/drain regions SD1 and SD2. The top surface of the sacrificial layer 30 may be exposed through the second trench T2.

Figure 34:
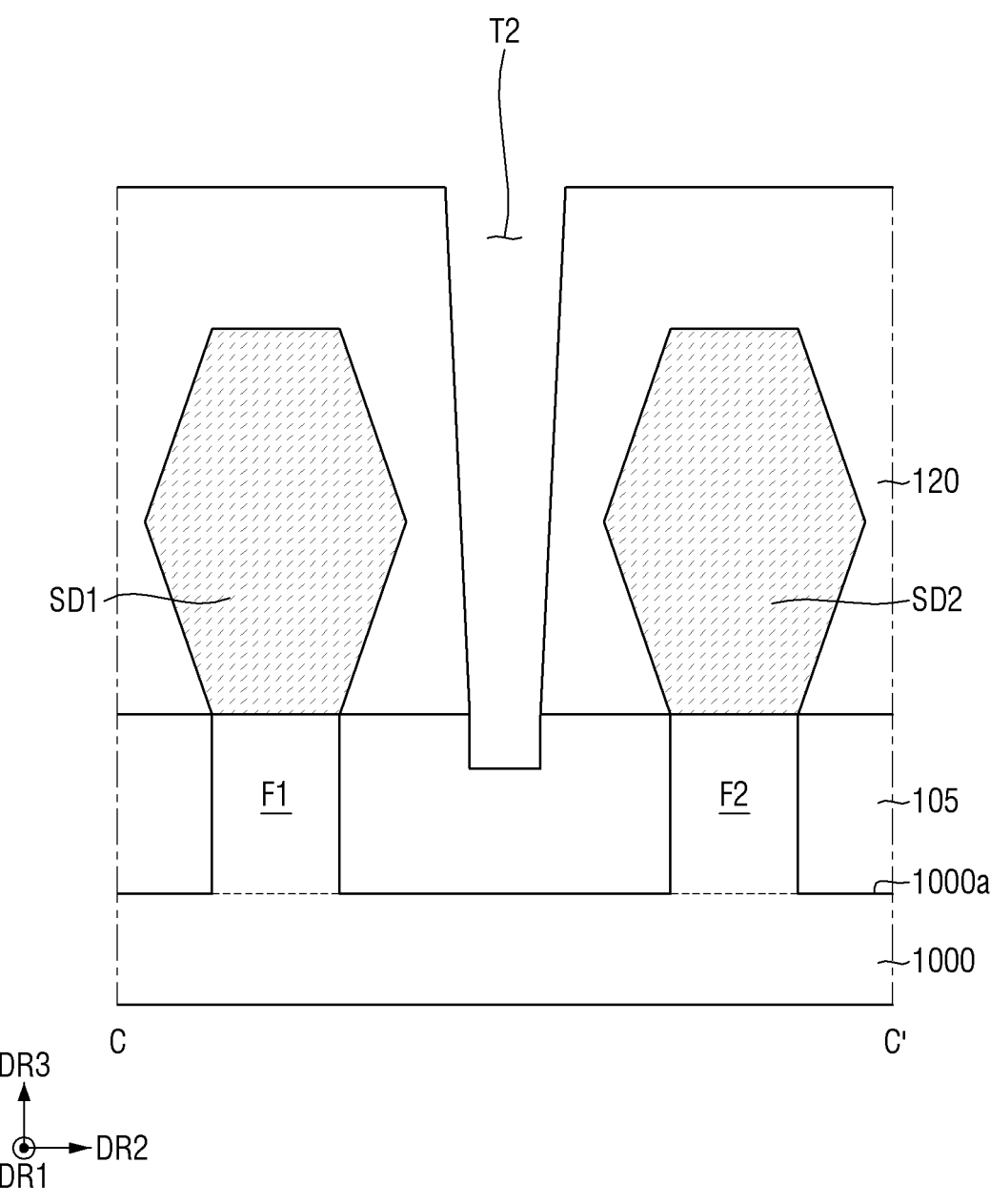

Referring to FIG. 34, the sacrificial layer 30 may be removed through the second trench T2.

Figure 35:
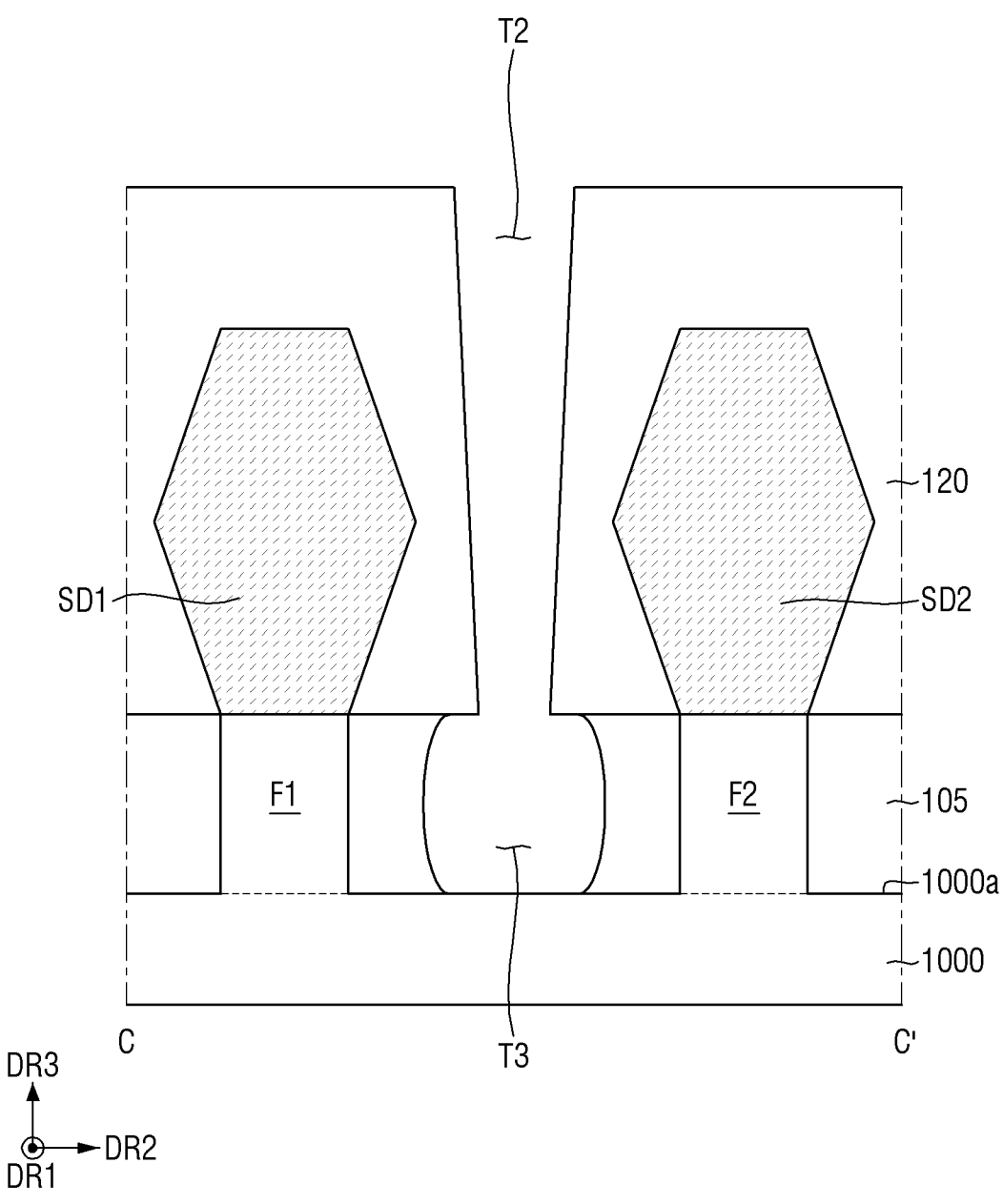

Referring to FIG. 35, a third trench T3 may be formed in the field insulating layer 105 by etching the field insulating layer 105 through the second trench T2 and a region from which the sacrificial layer 30 has been removed. That is, the third trench T3 may be formed below the second trench T2. As the third trench T3 is formed through the second trench T2, the third trench T3 may be aligned with the second trench T2 in the vertical direction DR3. For example, the third trench T3 may be overlapped with the second trench T2 in the vertical direction DR3. The third trench T3 may be formed by a wet etching process, but is not limited thereto.

For example, a portion of the top surface 1000a of the substrate 1000 may be exposed through the third trench T3. Also, a portion of the bottom surface of the first upper interlayer insulating layer 120 may be exposed through the third trench T3. The third trench T3 may have a jar shape in a cross-sectional view. For example, the width, in the second horizontal direction DR2, of a middle portion of the third trench T3 may be greater than the widths, in the second horizontal direction DR2, of the top and bottom surfaces of the third trench T3. The middle portion of the third trench T3 may refer to a portion between the top and bottom surfaces of the third trench T3 in the vertical direction DR3.

Figure 36:
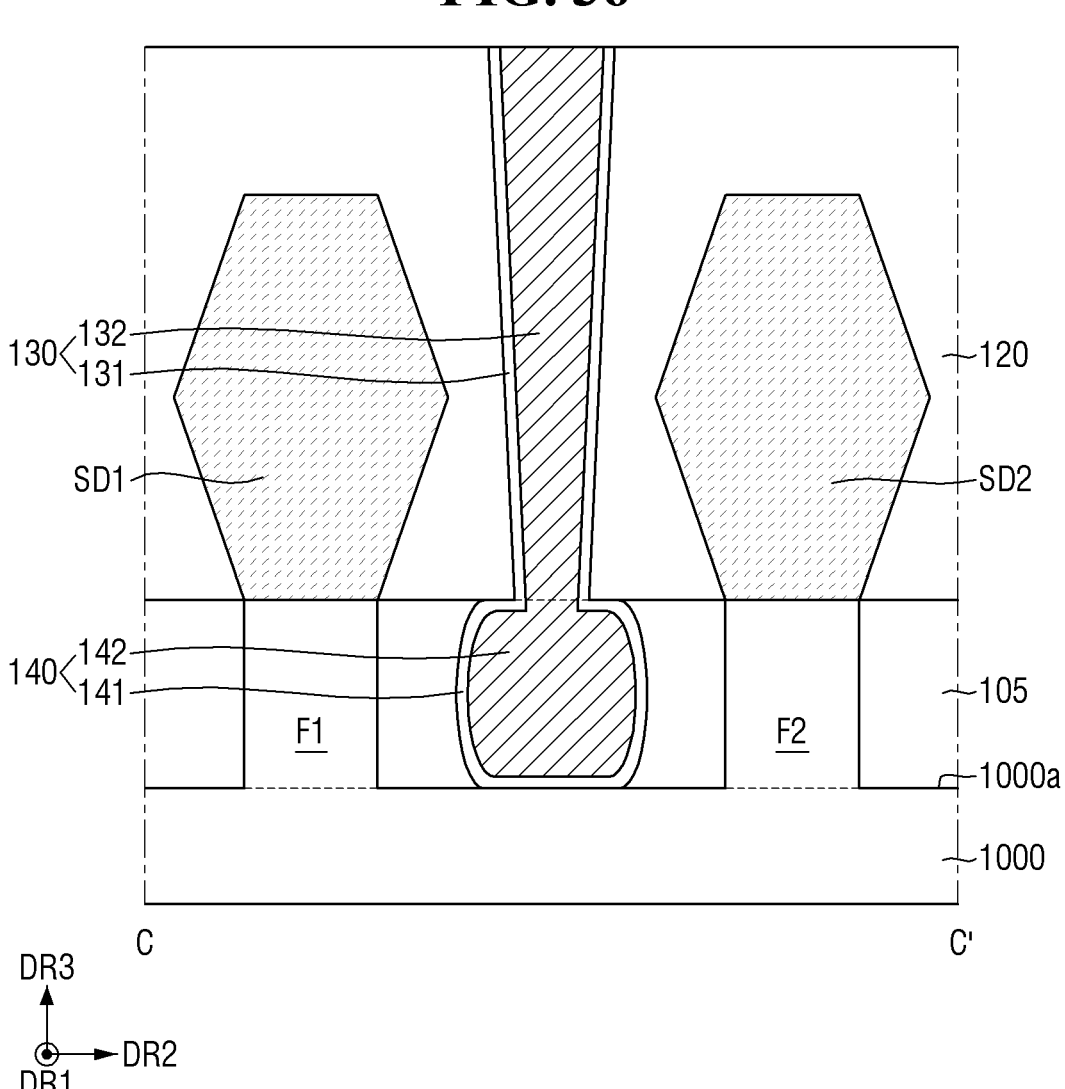

Referring to FIG. 36, a first barrier layer 131 may be formed in the second trench T2. A second barrier layer 141 may be formed in the third trench T3. For example, the first barrier layer 131 may be formed along the sidewalls of the second trench T2. The second barrier layer 141 may be formed along a portion of the top surface of the third trench T3 and along the sidewalls and the bottom surface of the third trench T3. The first and second barrier layers 131 and 141 may be continuously or concurrently formed. The first and second barrier layers 131 and 141 may be formed by the same process. For example, the first and second barrier layers 131 and 141 may be conformally formed. The first and second barrier layers 131 and 141 may include the same material.

A first filling layer 132 may be formed on the first barrier layer 131, in the remaining second trench T2 after the formation of the first barrier layer 131. A second filling layer 142 may be formed on the second barrier layer 141, in the remaining third trench T3 after the formation of the second barrier layer 141. The first and second filling layers 132 and 142 may be continuously or concurrently formed. The first and second filling layers 132 and 142 may be formed by the same process. That is, the bottom surface of the first filling layer 132 may be in contact with the top surface of the second filling layer 142. The first and second filling layers 132 and 142 may include the same material.

Figure 37:
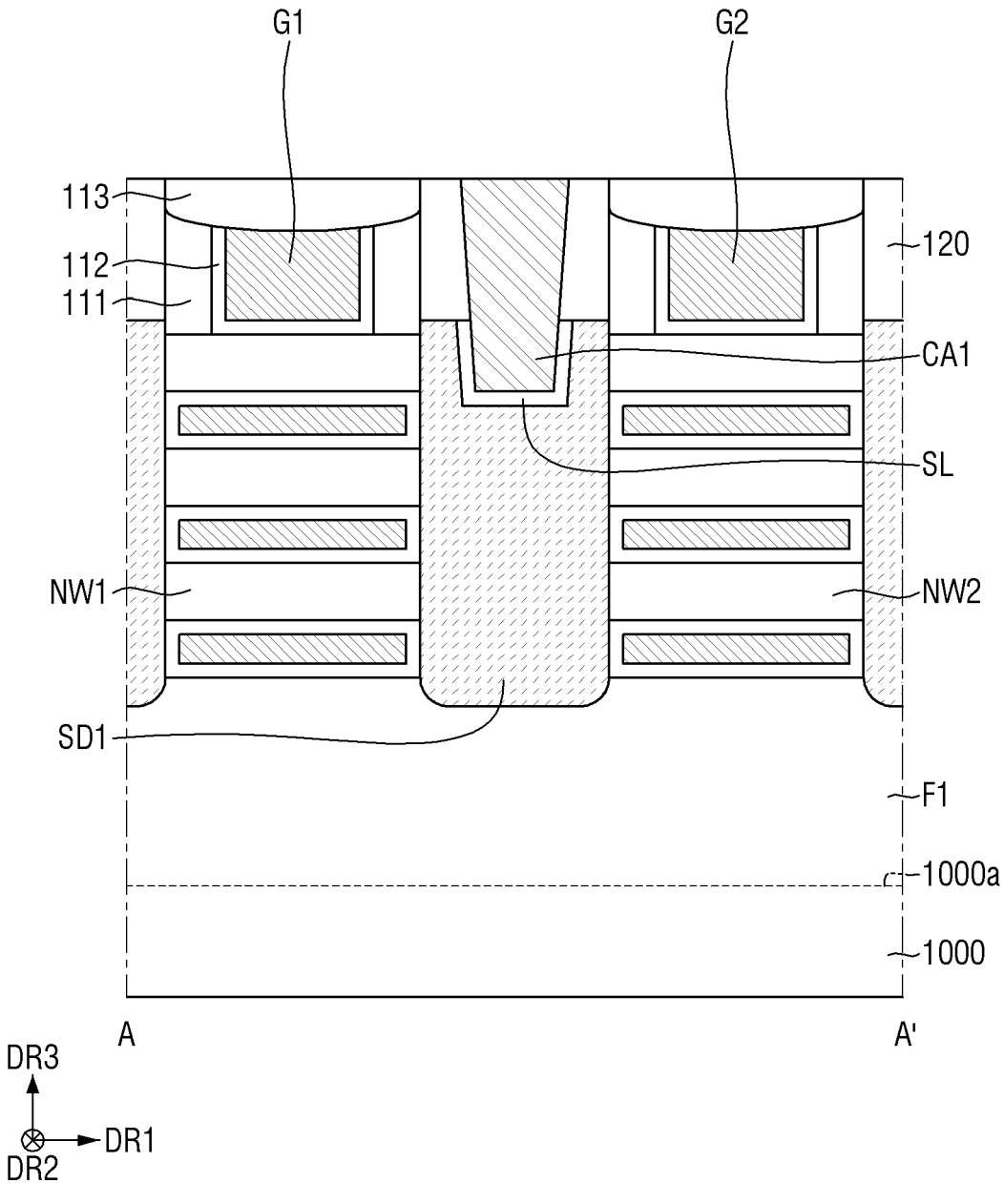
Figure 38:
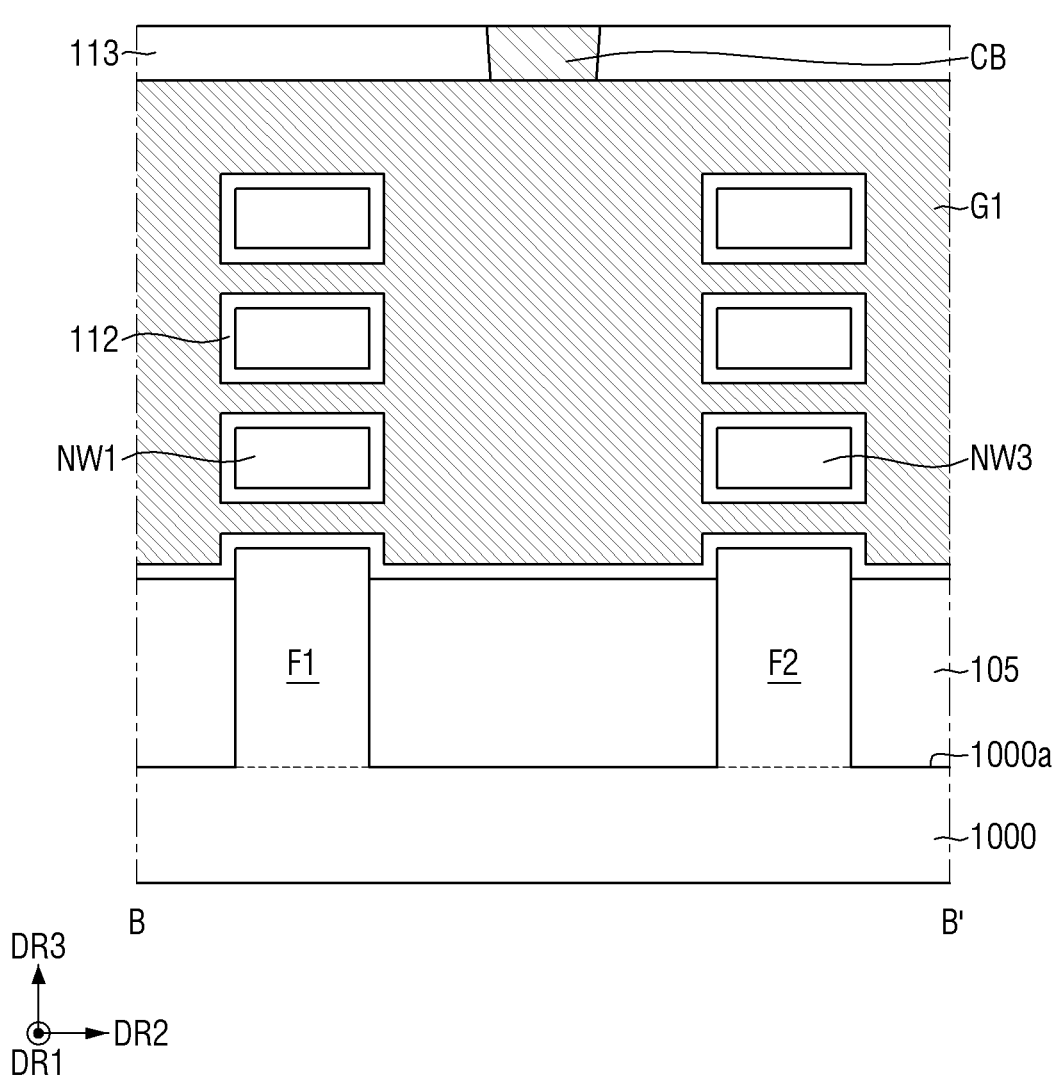
Figure 39:
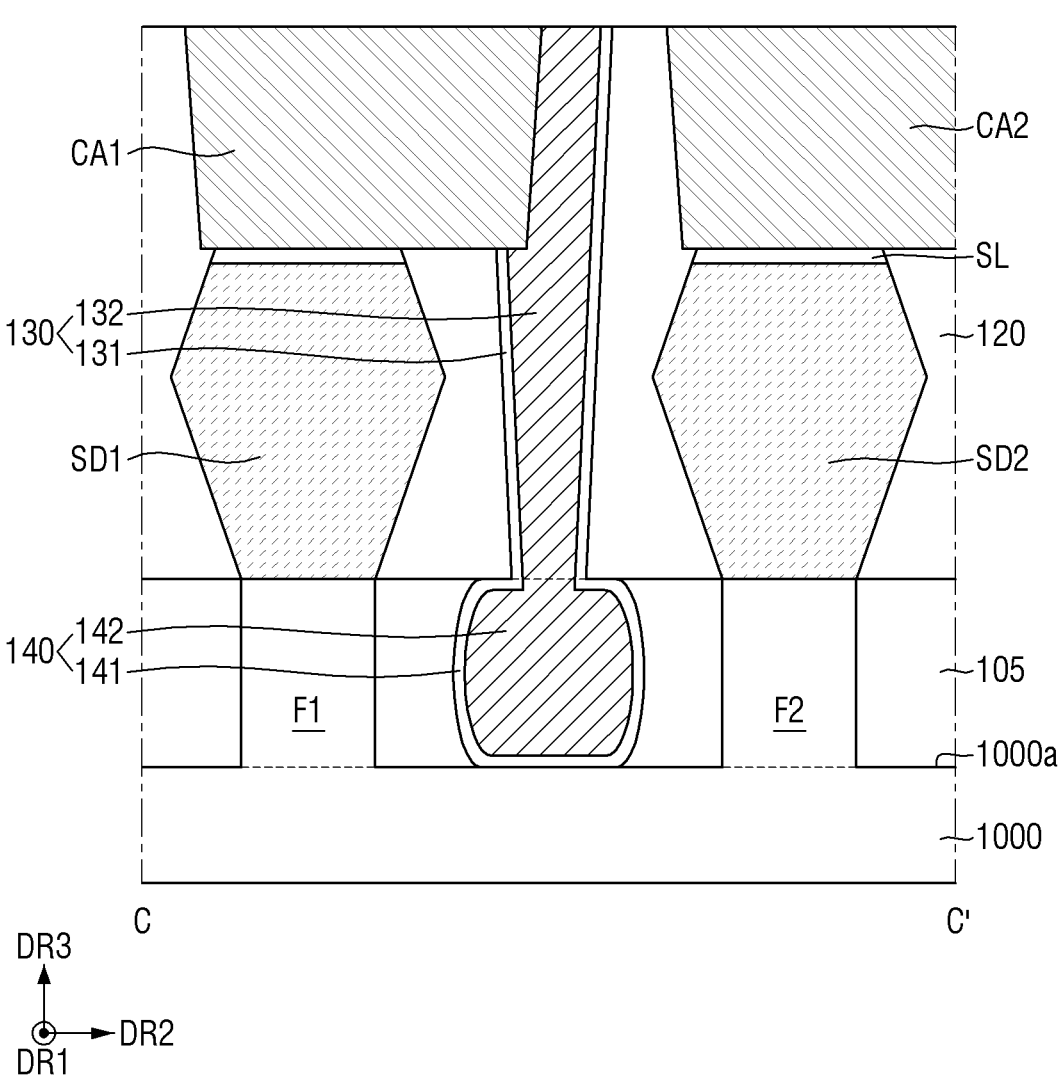

Referring to FIGS. 37 through 39, first and second source/drain contacts CA1 and CA2 may be formed in the first upper interlayer insulating layer 120. For example, the first source/drain contact CA1, which is connected to the first source/drain region SD1, may be formed between the first and second gate electrodes G1 and G2. For example, the first source/drain contact CA1 may be formed in a region where the first through via 130 has been partially etched. The first source/drain contact CA1 may be connected to the first through via 130.

The second source/drain contact CA2, which is connected to the second source/drain contact SD2, may be formed between the first and second gate electrodes G1 and G2. The second source/drain contact CA2 may be spaced apart from the first source/drain contact CA1 in the second horizontal direction DR2. The second source/drain contact CA2 may be spaced apart from the first through via 130 in the second horizontal direction DR2.

A silicide layer SL may be formed between the first source/drain region SD1 and the first source/drain contact CA1 and between the second source/drain region SD2 and the second source/drain contact CA2. A gate contact CB, which extends through (e.g., penetrates) the capping patterns 113 in the vertical direction DR3 and is thus connected to the first gate electrode G1, may be formed.

Figure 40:
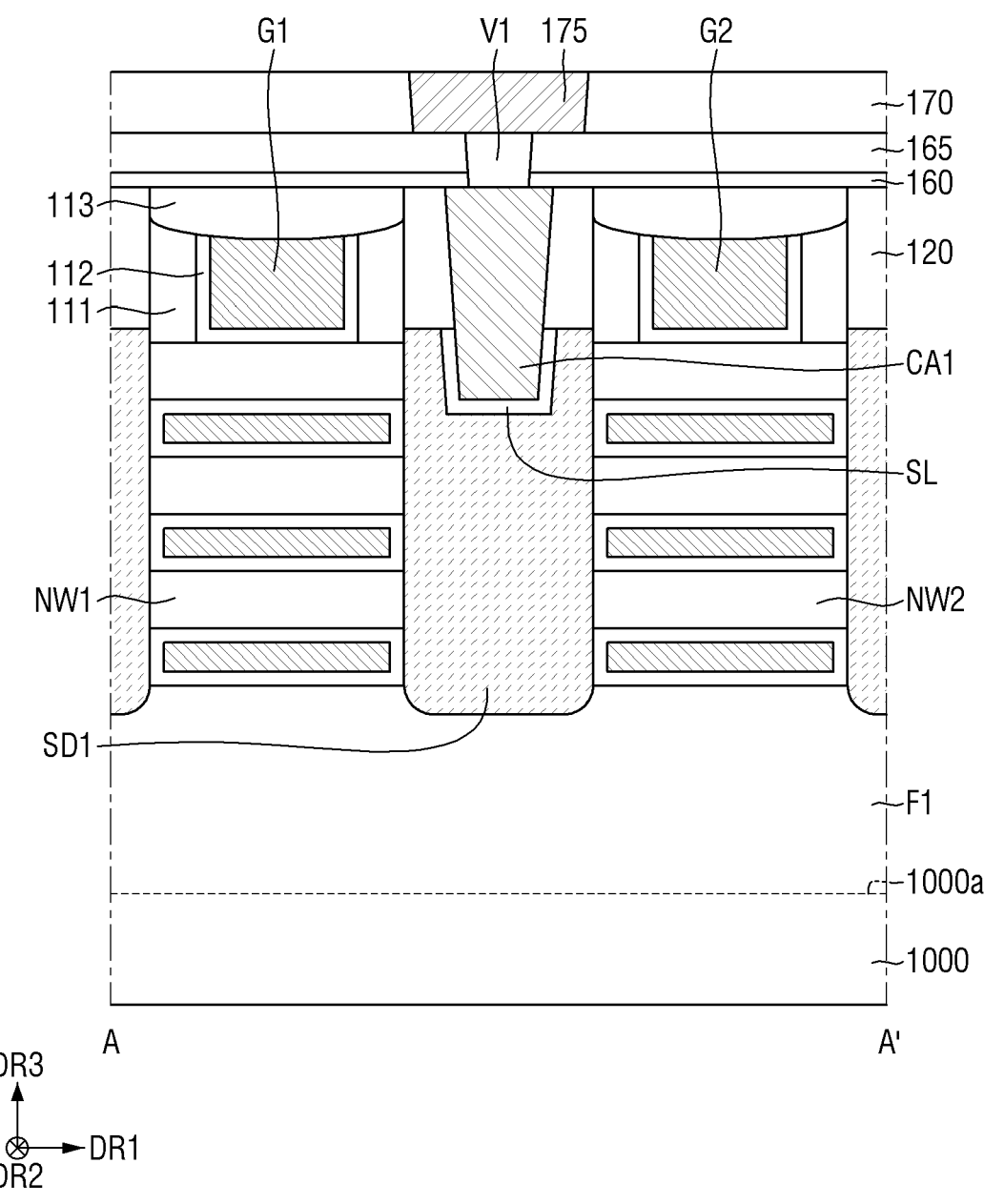
Figure 41:
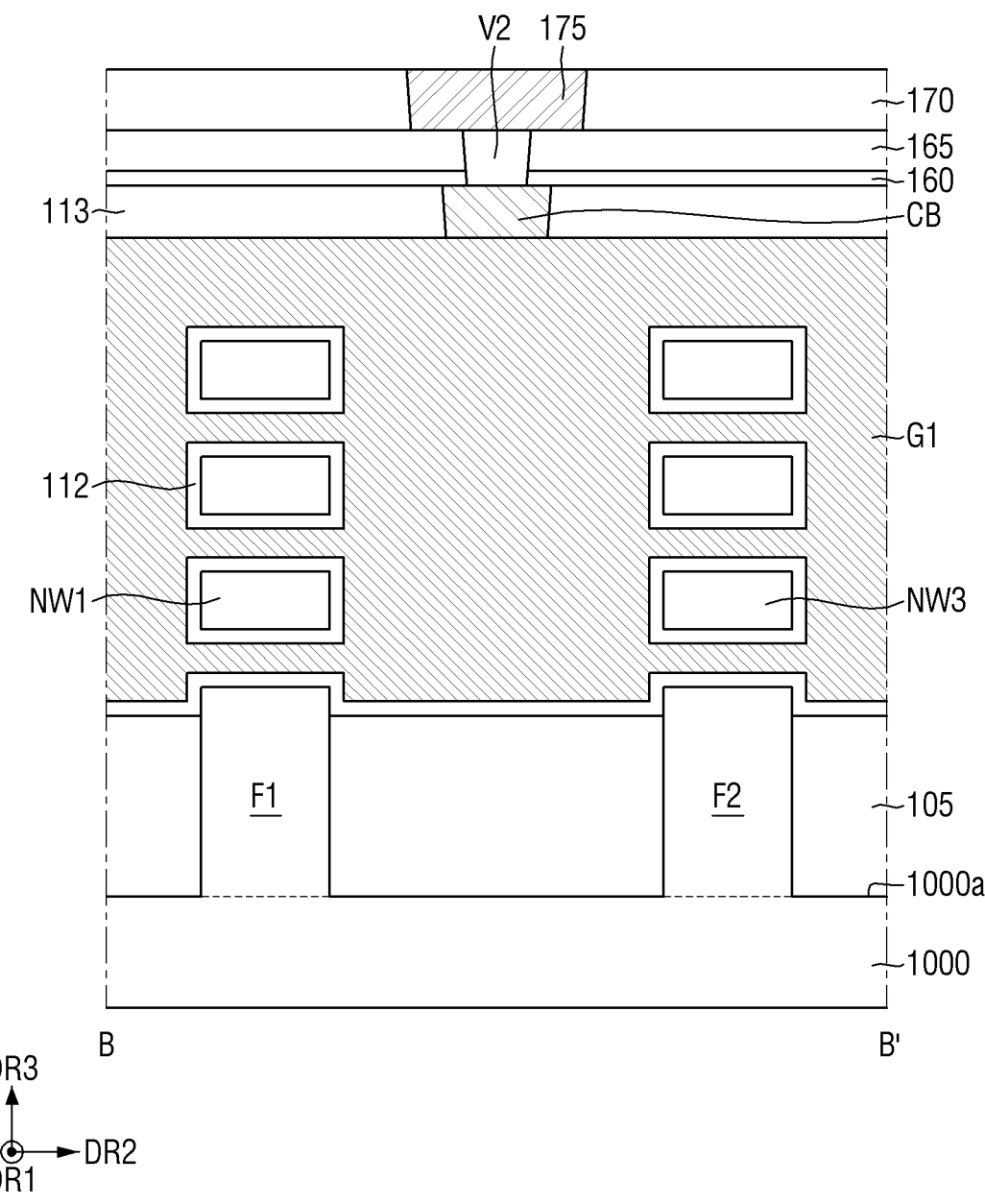
Figure 42:
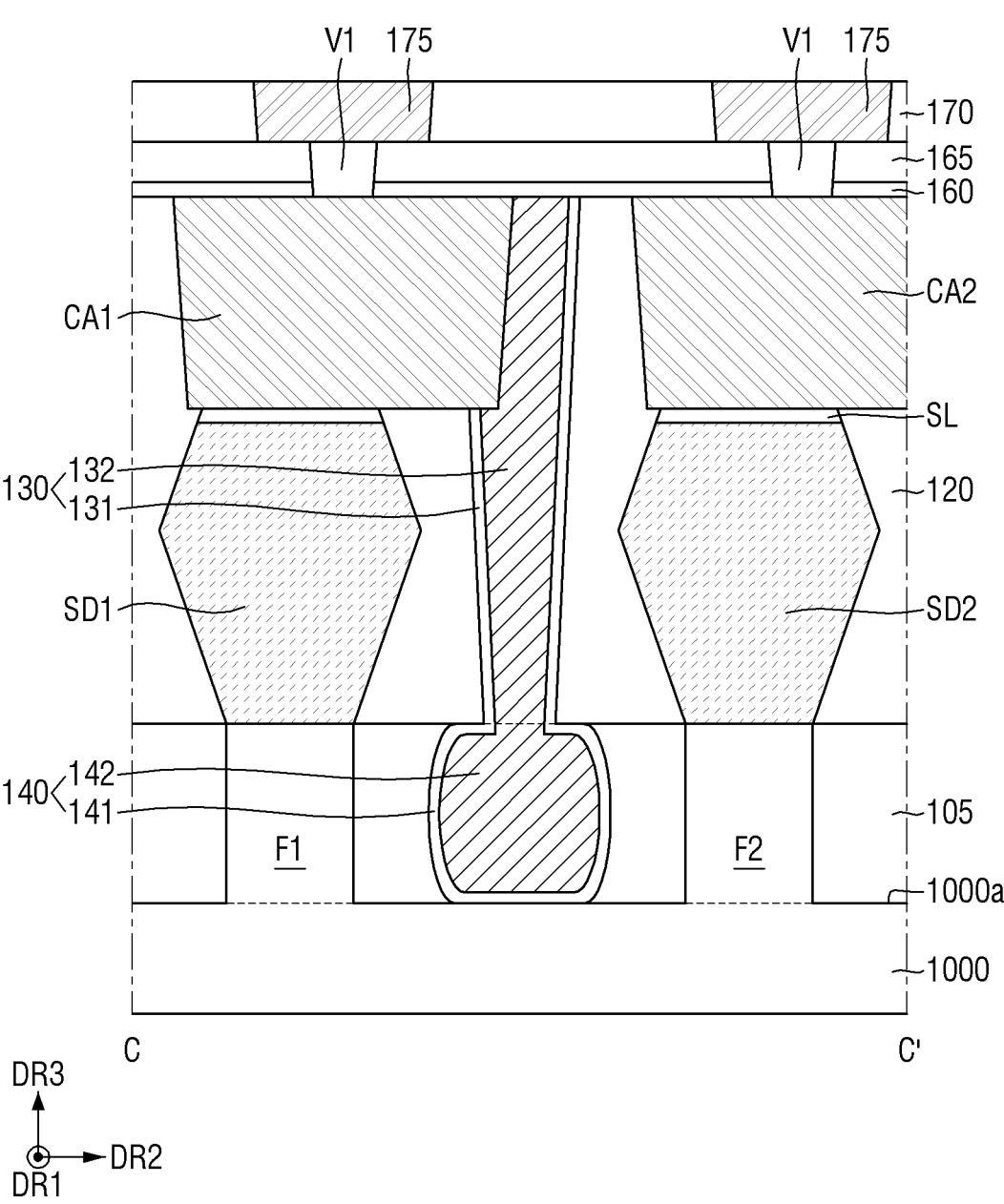

Referring to FIGS. 40 through 42, an etch stopper layer 160 and a second upper interlayer insulating layer 165 may be sequentially formed on the top surfaces of the first upper interlayer insulating layer 120, the capping patterns 113, the gate contact CB, the first and second source/drain contacts CA1 and CA2, and the first through via 130.

Thereafter, a first via V1, which extends through (e.g., penetrates) the second upper interlayer insulating layer 165 and the etch stopper layer 160 in the vertical direction DR3 and is thus connected to one of the first and second source/drain contacts CA1 and CA2, may be formed. Also, a second via V2, which extends through (e.g., penetrates) the second upper interlayer insulating layer 165 and the etch stopper layer 160 in the vertical direction DR3 and is thus connected to the gate contact CB that is connected to the first gate electrode G1, may be formed. Thereafter, a third upper interlayer insulating layer 170 and an upper wiring layer 175 may be formed on the second upper interlayer insulating layer 165.

Figure 43:
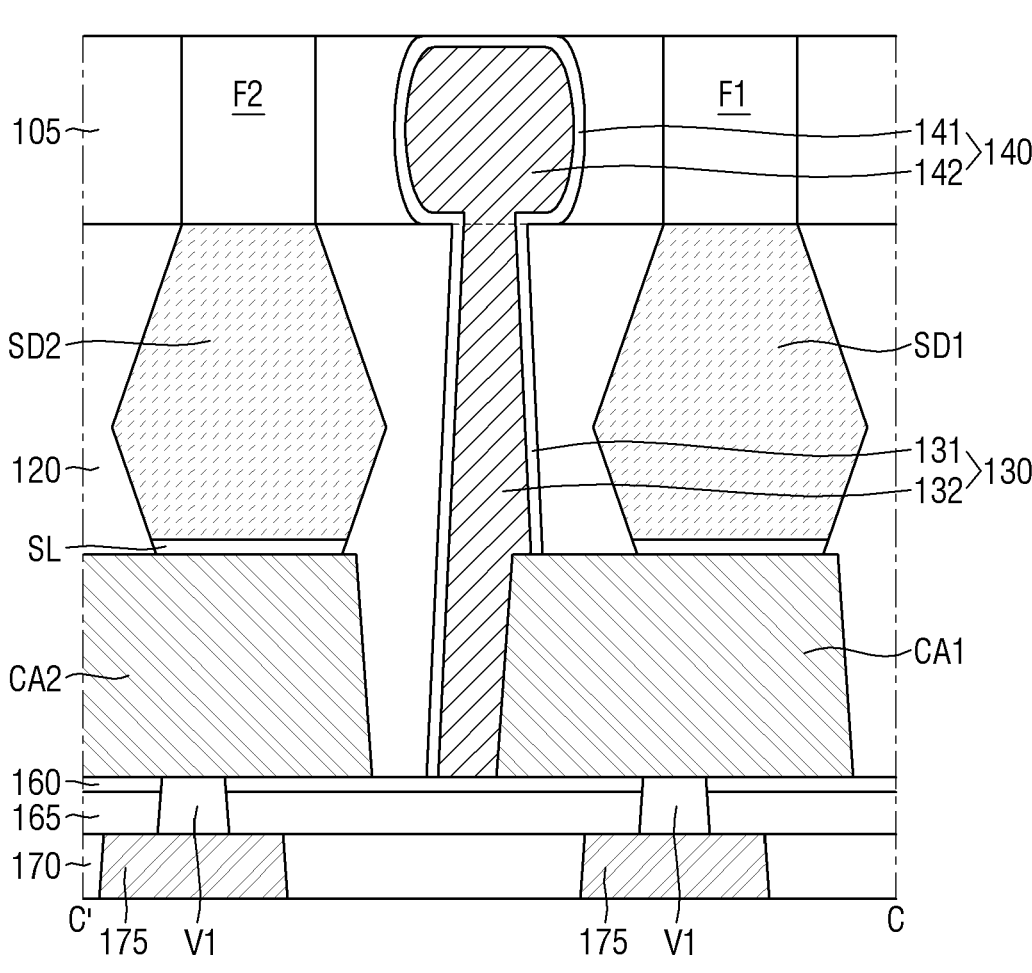
Figure 43:
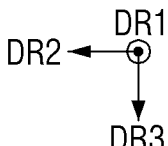

Referring to FIG. 43, the structure illustrated in FIG. 42 may be turned upside down. Thereafter, the substrate 1000 may be etched by a planarization process. For example, after the planarization process, portions of the second through via 140, the field insulating layer 105, the first active pattern F1, and the second active pattern F2 may be exposed.

Figure 44:
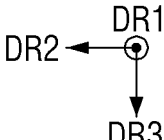

Referring to FIG. 44, a first lower interlayer insulating layer 100 may be formed on the exposed portions of the second through via 140, the field insulating layer 105, the first active pattern F1, and the second active pattern F2. Thereafter, a fourth trench T4, which extends through (e.g., penetrates) the first lower interlayer insulating layer 100 in the vertical direction DR3 and thus exposes a portion of the second through via 140, may be formed.

Figure 45:
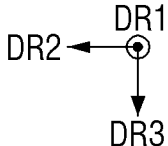

Referring to FIG. 45, a third barrier layer 151 may be formed along the sidewalls and the bottom surface of the fourth trench T4. Also, a third filling layer 152 may be formed on the third barrier layer 151. The third filling layer 152 may fill a remaining portion of the fourth trench T4 after the formation of the third barrier layer 151. In this manner, a third through via 150, which includes the third barrier layer 151 and the third filling layer 152, may be formed.

Thereafter, referring to FIGS. 2 through 4, a second lower interlayer insulating layer 180 may be formed on a bottom surface 100*b* of the first lower interlayer insulating layer 100. Thereafter, a lower wiring layer 185 may be formed in the second lower interlayer insulating layer 180. The lower wiring layer 185 may be connected to the third through via 150. Thereafter, the resulting structure may be turned upside down, thereby obtaining the semiconductor device of FIGS. 2 through 4.

A semiconductor device according to some embodiments of the present disclosure will hereinafter be described with reference to FIGS. 46 and 47, focusing mainly on the differences with the semiconductor device of FIGS. 1 through 5.

Figure 46:
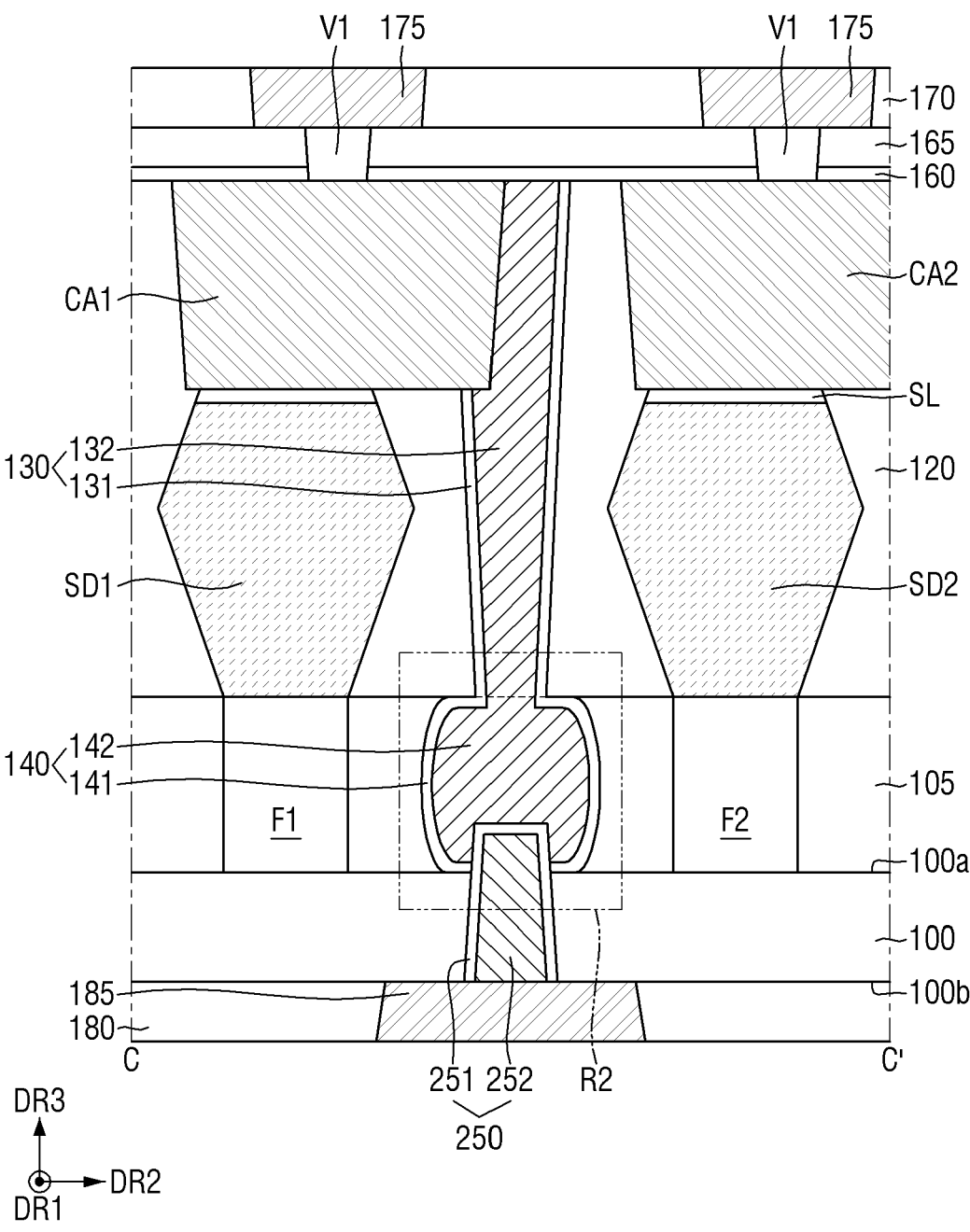
FIG. 46 is a cross-sectional view of a semiconductor device according to some embodiments of the present disclosure.

FIG. 46 is a cross-sectional view of a semiconductor device according to some embodiments of the present disclosure. FIG. 47 is an enlarged cross-sectional view of a region R2 of FIG. 46.

Figure 47:
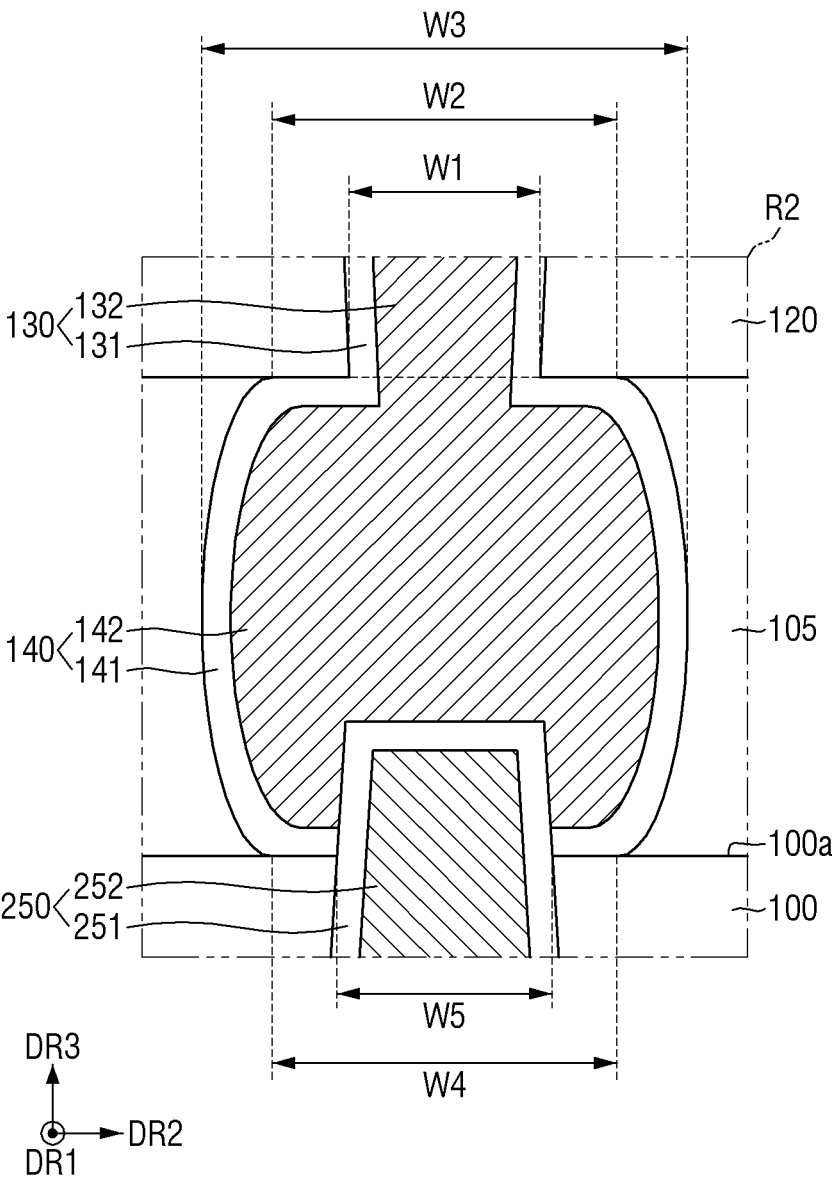
FIG. 47 is an enlarged cross-sectional view of a region R2 of FIG. 46.

Referring to FIGS. 46 and 47, at least a portion of a third through via 250 may be disposed in a second through via 140.

For example, at least a portion of the third through via 250 may extend into the second through via 140. The second through via 140 may extend around (e.g., surround) at least a portion of the sidewalls of the third through via 250. The top surface of the third through via 250 may be formed to be higher than a top surface 100*a* of a first lower interlayer insulating layer 100. For example, the top surface of the third through via 250 may be disposed between the top surface 100*a* of the first lower interlayer insulating layer 100 and the first upper interlayer insulating layer 120 in the vertical direction DR3. The top surface of the third through via 250 may be disposed farther than the top surface 100*a* of the first lower interlayer insulating layer 100 from the bottom surface 100*b* of the first lower interlayer insulating layer 100 in the vertical direction DR3. The top surface of the third through via 250 may also be formed to be higher than the bottom surface of the second through via 140. The top surface of the third through via 250 may be disposed between the bottom surface of the second through via 140 and the first upper interlayer insulating layer 120 in the vertical direction D3. The top surface of the third through via 250 may be disposed farther than the bottom surface of the second through via 140 from the bottom surface 100b of the first lower interlayer insulating layer 100 in the vertical direction DR3.

The width W4 of the bottom surface of the second through via 140 in the second horizontal direction DR2 may include a width of the third through via 250 in the second horizontal direction DR2.

The third through via 250 may include a third barrier layer 251 and a third filling layer 252. The third through via 250 may include the third barrier layer 251 along sidewalls and a top surface of the third through via 250. The third barrier layer 251 may include (e.g., constitute) the sidewalls (e.g., outer sidewalls) and the top surface of the third through via 250. For example, sidewalls of the third barrier layer 251 may be the sidewalls of the third through via 250. A top surface of the third barrier layer 251 may be the top surface of the third through via 250. At least a portion of the sidewalls of the third barrier layer 251 may be in contact with the second filling layer 142. The third filling layer 252 may fill the space between portions of the third barrier layer 251. The third filling layer 252 may be disposed between sidewalls (e.g., inner sidewalls) of the third barrier layer 251. The third filling layer 252 may include all the third through via 250 but the third barrier layer 251. For example, the third filling layer 252 may not be in contact with the second through via 140. The third filling layer 252 may be insulated from the first lower interlayer insulating layer 100 (e.g., by the third barrier layer 251). That is, the third filling layer 252 may not be in contact with the first lower interlayer insulating layer 100.

A semiconductor device according to some embodiments of the present disclosure will hereinafter be described with reference to FIGS. 48 and 49, focusing mainly on the differences with the semiconductor device of FIGS. 1 through 5.

FIG. 48 is a cross-sectional view of a semiconductor device according to some embodiments of the present disclosure. FIG. 49 is an enlarged cross-sectional view of a region R3 of FIG. 48.

Referring to FIGS. 48 and 49, second and third through vias 340 and 350 may be integrally formed. For example, the second and third through vias 340 and 350 may be connected to each other. The second and third through vias 340 and 350 may form a unitary structure.

For example, a first through via 330 may include a first barrier layer 331 and a first filling layer 332. The first through via 330 may include the first barrier layer 331 along sidewalls and a bottom surface of the first through via 330. The first barrier layer 331 may include (e.g., constitute) the sidewalls and the bottom surface of the first through via 330. For example, sidewalls of the first barrier layer 331 may be the sidewalls of the first through via 330. A bottom surface of the first barrier layer 331 may be the bottom surface of the first through via 330. For example, the first barrier layer 331 may be conformally formed. For example, the first barrier layer 331 may have a uniform thickness in a cross-sectional view. The first filling layer 332 may fill the space between portions (e.g., inner sidewalls) of the first barrier layer 331. For example, the first filling layer 332 may include all the first through via 330 but the first barrier layer 331.

For example, the second through via 340 may include a second barrier layer 341 and a second filling layer 342. The second through via 340 may include the second barrier layer 341 along sidewalls and a top surface of the second through via 340. The second through via 340 may include the second barrier layer 341 along a portion of a bottom surface of the second through via 340. The second barrier layer 341 may include (e.g., constitute) the top surface and the sidewalls of the second through via 340 and a portion of the bottom surface of the second through via 340. For example, sidewalls (e.g., outer sidewalls) of the second barrier layer 341 may be the sidewalls (e.g., outer sidewalls) of the second through via 340. A top surface of the second barrier layer 341 may be the top surface of the second through via 340. The portion of a bottom surface of the second barrier layer 341 may be the portion of the bottom surface of the second through via 340. For example, the second barrier layer 341 may be conformally formed. The second barrier layer 341 may have a uniform thickness in a cross-sectional view. The second barrier layer 341 may be in contact with a field insulating layer 105 and a portion of a top surface 100a of a first lower interlayer insulating layer 100. For example, the second barrier layer 341 may not be in contact with the first filling layer 332. The second filling layer 342 may fill the space between parts of the second barrier layer 341. For example, the top surface of the second filling layer 342 is not in contact with the first barrier layer 331. The top surface of the second filling layer 342 may be spaced apart from the first barrier layer 331 by the second barrier layer 341. For example, the second filling layer 342 may not be in contact with the first lower interlayer insulating layer 100 and the field insulating layer 105.

For example, the third through via 350 may include a third barrier layer 351 and a third filling layer 352. The third through via 350 may include a third barrier layer 351 along sidewalls of the third through via 350. The third barrier layer 351 may include (e.g., constitute) the sidewalls of the third through via 350. For example, sidewalls (e.g., outer sidewalls) of the third barrier layer 351 may be the sidewalls (e.g., outer sidewalls) of the third through via 350. For example, the third barrier layer 351 may be conformally formed. The third barrier layer 351 may have a uniform thickness in a cross-sectional view. For example, the third barrier layer 351 may be in contact with the second barrier layer 341. The third barrier layer 351 and the second barrier layer 341 may be continuously formed. For example, the third barrier layer 351 and the second barrier layer 341 may be connected to each other. The third barrier layer 351 and the second barrier layer 341 may form a unitary structure. The third filling layer 352 may fill the space between portions (e.g., inner sidewalls) of the third barrier layer 351. The third filling layer 352 may include all the third through via 350 but the third barrier layer 351. For example, the top surface of the third filling layer 352 may be in contact with the bottom surface of the second filling layer 342. The third filling layer 352 and the second filling layer 342 may be continuously formed. For example, the third filling layer 352 and the second filling layer 342 may be connected to each other. The third filling layer 352 and the second filling layer 342 may form a unitary structure. For example, the third filling layer 352 are not in contact with the first lower interlayer insulating layer 100 and the field insulating layer 105.

A method of fabricating the semiconductor device of FIG. 48 will hereinafter be described with reference to FIGS. 48 through 56, focusing mainly on the differences with the method of FIGS. 6 through 45.

FIGS. 50 through 56 are cross-sectional views illustrating intermediate steps of a method of fabricating a semiconductor device according to some embodiments of the present disclosure.

Figure 50:
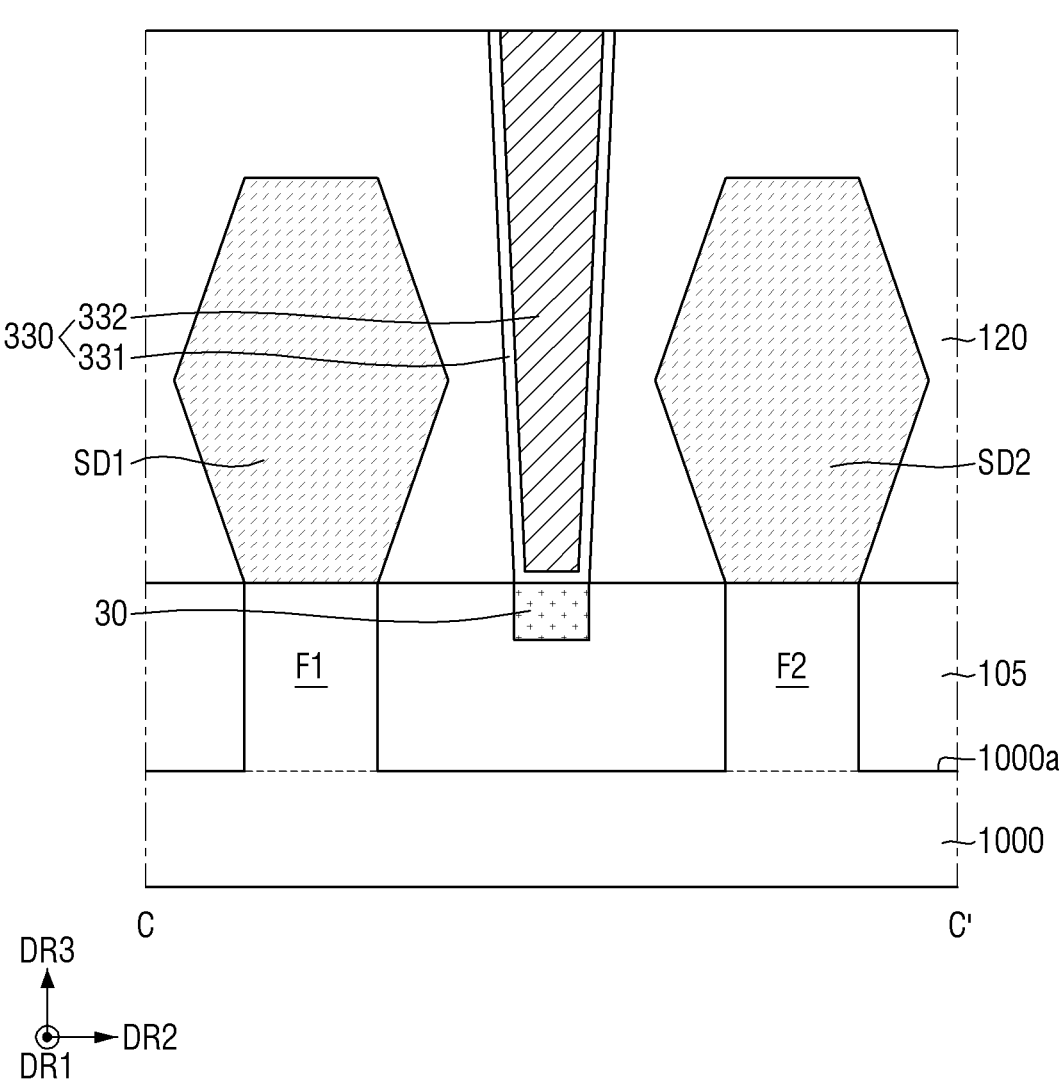

Referring to FIG. 50, after the steps illustrated in FIGS. 6 through 33, a first barrier layer 331 may be formed along the sidewalls and the bottom surface of the second trench T2 of FIG. 33. The first barrier layer 331 may be in contact with a sacrificial layer 30. Thereafter, a first filling layer 332 may be formed on the first barrier layer 331. The first filling layer 332 may be disposed in a remaining space of the second trench T2 after the formation of the first barrier layer 331.

Figure 51:
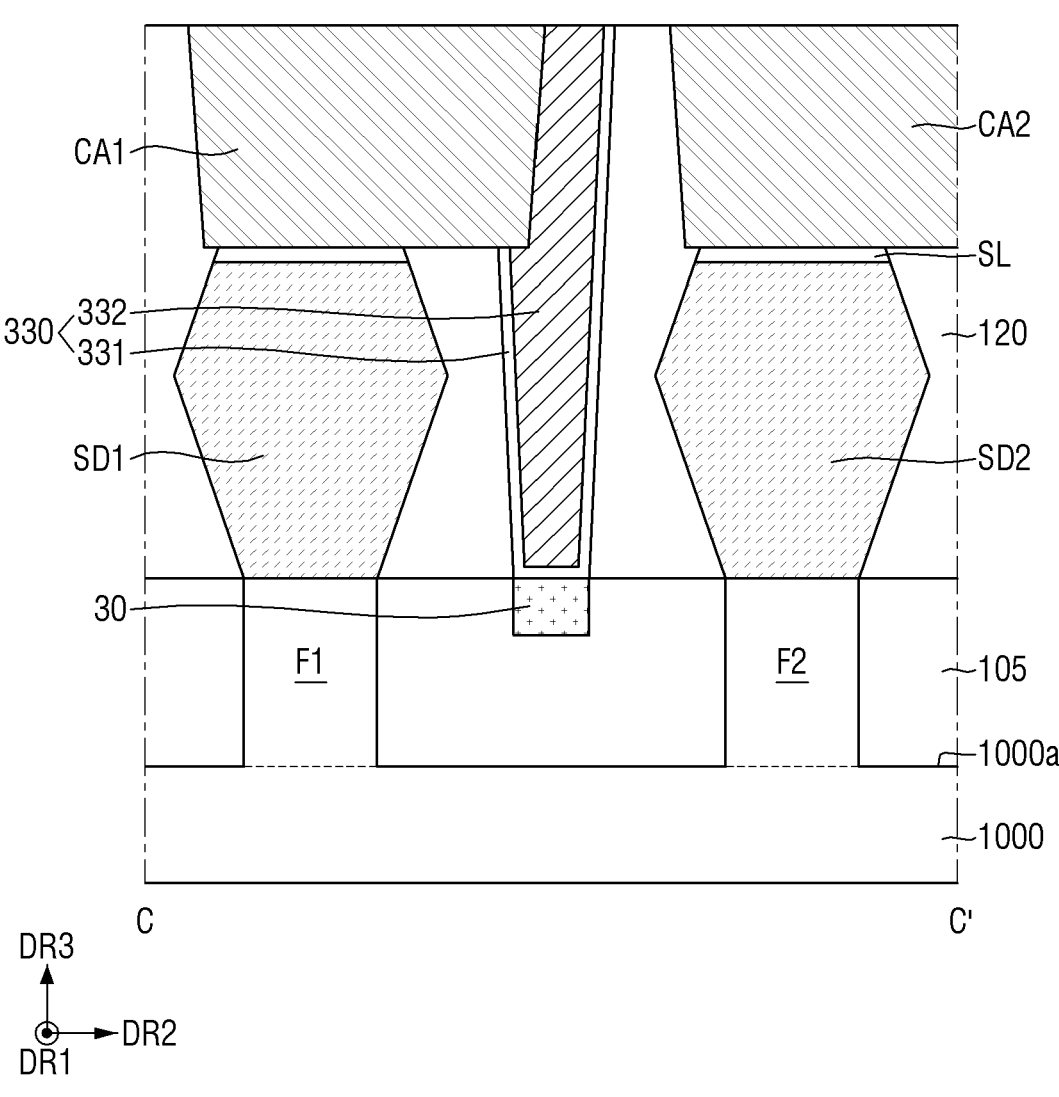

Referring to FIG. 51, first and second source/drain contacts CA1 and CA2 may be formed in a first upper interlayer insulating layer 120. For example, the first source/drain contact CAL which is connected to a first source/drain region SD1, between the first and second gate electrodes G1 and G2, may be formed on the first source/drain region SD1. For example, the first source/drain contact CA1 may be formed in a region where a portion of a first through via 330 has been etched. The first source/drain contact CA1 may be connected to the first through via 330.

The second source/drain contact CA2, which is connected to a second source/drain region SD2, may be formed on the second source/drain region SD2. The second source/drain contact CA2 may be spaced apart from the first source/drain contact CA1 in a second horizontal direction DR2. The second source/drain contact CA2 may be spaced apart from the first through via 330 in the second horizontal direction DR2. A silicide layer SL may be formed between the first source/drain region SD1 and the first source/drain contact CA1 and between the second source/drain region SD2 and the second source/drain contact CA2.

Figure 52:
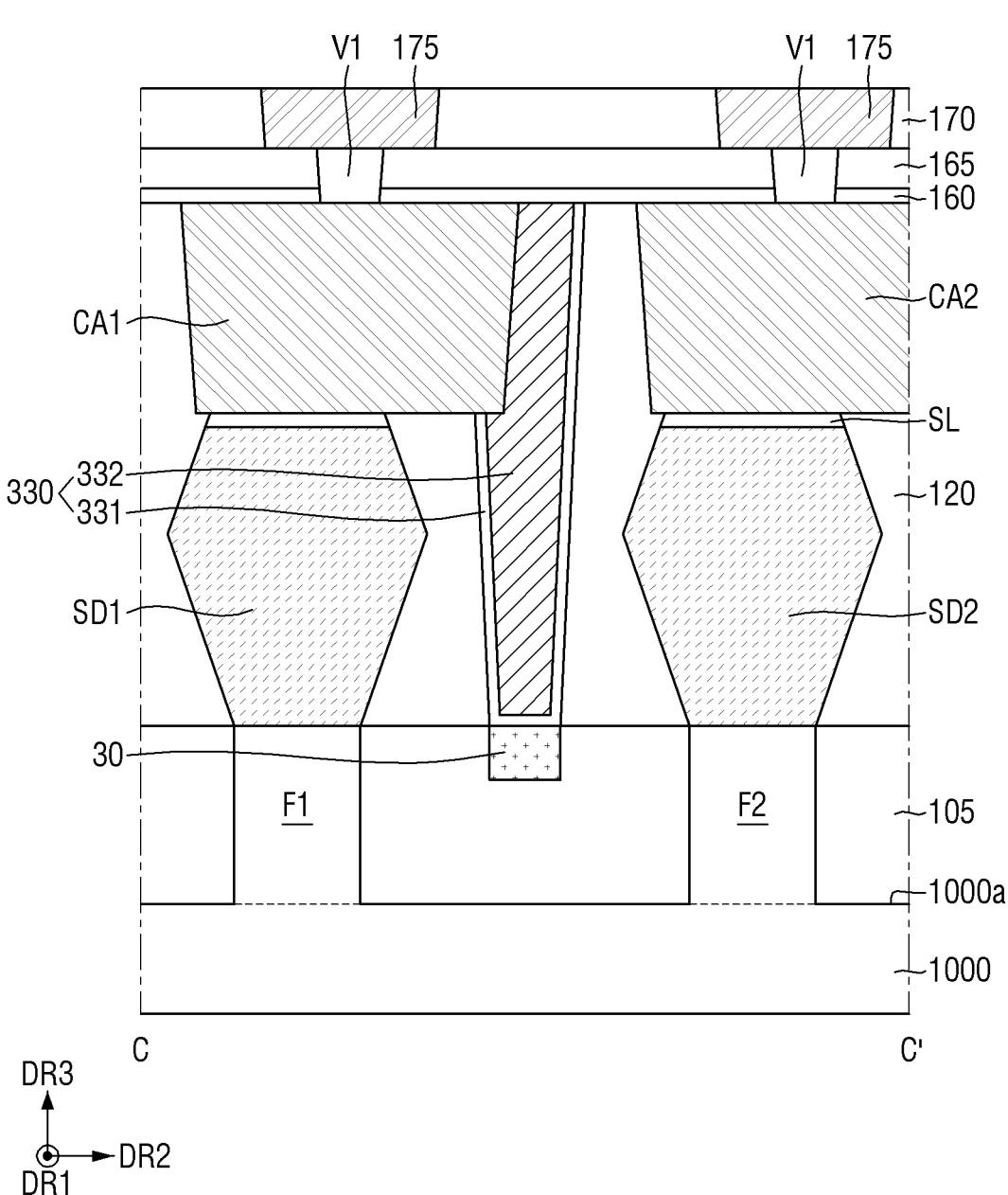

Referring to FIG. 52, an etch stopper layer 160 and a second upper interlayer insulating layer 165 may be sequentially formed on the top surfaces of the first upper interlayer insulating layer 120, the first and second source/drain contacts CA1 and CA2, and the first through via 330. Thereafter, a first via V1, which extends through (e.g., penetrates) the second upper interlayer insulating layer 165 and the etch stopper layer 160 in the vertical direction DR3 and is thus connected to one of the first and second source/drain contacts CA1 and CA2, may be formed. Thereafter, a third upper interlayer insulating layer 170 and an upper wiring layer 175 may be formed on the second upper interlayer insulating layer 165.

Figure 53:
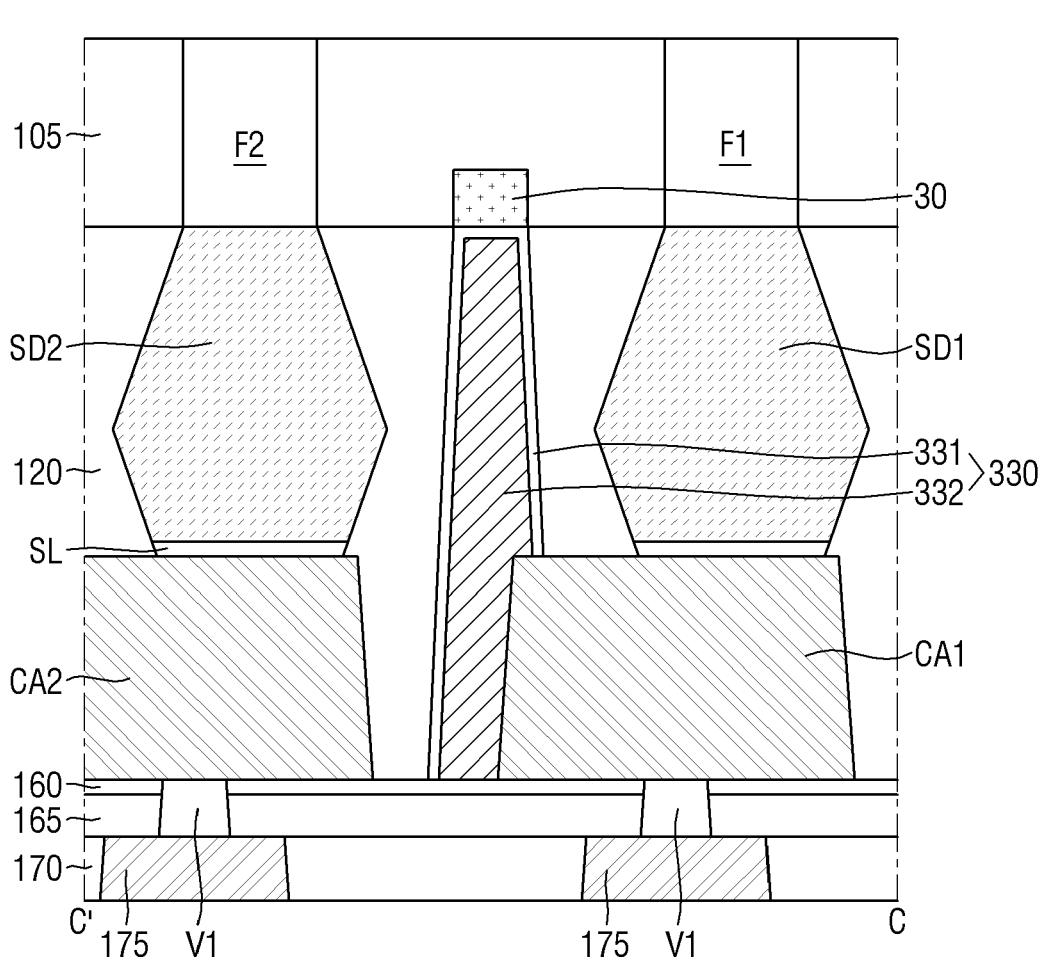
Figure 53:
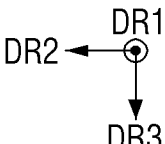

Referring to FIG. 53, after the step illustrated in FIG. 52, the resulting structure may be turned upside down. Thereafter, a substrate 1000 may be etched by a planarization process. For example, after the planarization process, portions of a field insulating layer 105, a first active pattern F1, and a second active pattern F2 may be exposed.

Figure 54:
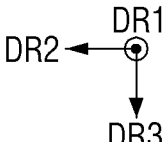

Referring to FIG. 54, a first lower interlayer insulating layer 100 may be formed on the field insulating layer 105, the first active pattern F1, and the second active pattern F2. Thereafter, a fifth trench T5, which extends through (e.g., penetrates) the first lower interlayer insulating layer 100 and the field insulating layer 105 in the vertical direction DR3 and thus exposes the sacrificial layer 30, may be formed. For example, the fifth trench T5 may overlap with the sacrificial layer 30 and the first through via 330 in the vertical direction DR3.

Referring to FIG. 55, the sacrificial layer 30 may be removed through the fifth trench T5. The field insulating layer 105 may be further etched through the fifth trench T5 and a region from which the sacrificial layer 30 has been removed, and as a result, a sixth trench T6 may be formed in the field insulating layer 105. That is, the sixth trench T6 may be formed below the fifth trench T5. As the sixth trench T6 is formed through the fifth trench T5, the sixth trench T6 may be aligned with the fifth trench T5 in the vertical direction DR3. The sixth trench T6 may be overlapped with the fifth trench T5 in the vertical direction DR3. The sixth trench T6 may be formed by a wet etching process.

For example, a portion of the first upper interlayer insulating layer 120 and the first barrier layer 331 may be exposed through the sixth trench T6. The sixth trench T6 may have a jar shape in a cross-sectional view. For example, the width, in the second horizontal direction DR2, of a middle portion of the sixth trench T6 may be greater than the widths, in the second horizontal direction DR2, of the top and bottom surfaces of the sixth trench T6. The middle portion of the sixth trench T6 may refer to a portion between the top and bottom surfaces of the sixths trench T6 in the vertical direction DR3.

Referring to FIG. 56, a second barrier layer 341 may be formed in the sixth trench T6. A third barrier layer 351 may be formed in the fifth trench T5. For example, the second barrier layer 341 may be formed along a portion of the top surface of the sixth trench T6 and the sidewalls and the bottom surface of the sixth trench T6. The third barrier layer 351 may be formed along the sidewalls of the fifth trench T5. The second and third barrier layers 341 and 351 may be continuously or concurrently formed. For example, the second and third barrier layers 341 and 351 may be connected to each other. The second and third barrier layers 341 and 351 may form a unitary structure. The second and third barrier layers 341 and 351 may be formed by the same process. For example, the second and third barrier layers 341 and 351 may be conformally formed. For example, the second and third barrier layers 341 and 351 may have uniform thicknesses in a cross-sectional view. The second and third barrier layers 341 and 351 may include the same material.

A second filling layer 342 may be formed on the second barrier layer 341. The second filling layer 342 may fill a remaining space of the sixth trench T6 after the formation of the second barrier layer 341. As a result, a second through via 340 may include the second barrier layer 341 and the second filling layer 342. A third filling layer 352 may be formed on the third barrier layer 351. The third filling layer 352 may fill a remaining space of the fifth trench T5 after the formation of the third barrier layer 351. As a result, a third through via 350 may include the third barrier layer 351 and the third filling layer 352.

Referring to FIG. 48, a second lower interlayer insulating layer 180 may be formed on a bottom surface 100b of the first lower interlayer insulating layer 100. Thereafter, a lower wiring layer 185 may be formed in the second lower interlayer insulating layer 180. The lower wiring layer 185 may be connected to the third through via 350. The resulting structure may be turned upside down, thereby obtaining the semiconductor device of FIG. 48.

A method of fabricating the semiconductor device of FIG. 48 will hereinafter be described with reference to FIGS. 57 through 59, focusing mainly on the differences with the method of FIGS. 1 through 5.

FIGS. 57 through 59 are cross-sectional views illustrating intermediate steps of a method of fabricating a semiconductor device according to some embodiments of the present disclosure.

Referring to FIGS. 57 through 59, the semiconductor device according to some embodiments of the present disclosure may include a FinFET. For example, the semiconductor device according to some embodiments of the present disclosure may include a first lower interlayer insulating layer 100, first and second active patterns F41 and F42, a field insulating layer 105, first and second gate electrodes G41 and G42, gate spacers 411, a gate insulating layer 412, capping patterns 413, first and second source/drain regions
SD41 and SD42, a first upper interlayer insulating layer 120,
first, second, and third through vias 130, 140, and 150, first
and second source/drain contacts CA1 and CA2, a gate
contact CB, a silicide layer SL, an etch stopper layer 160, a
second upper interlayer insulating layer 165, first and second
vias V1 and V2, a third upper interlayer insulating layer 170,
an upper wiring layer 175, a second lower interlayer insu-
lating layer 180, and a lower wiring layer 185. Descriptions
of elements or features that have already been described
with reference to FIGS. 1 through 5 will be omitted.

The first and second active patterns F41 and F42 may
extend in a first horizontal direction DR1 on a top surface
100a of the first lower interlayer insulating layer 100. For
example, the second active pattern F42 may be spaced apart
from the first active pattern F41 in a second horizontal
direction DR2. The first and second active patterns F41 and
F42 may protrude in a vertical direction DR3 from the top
surface 100a of the first lower interlayer insulating layer
100. A first gate electrode G41 may extend in the second
horizontal direction DR2 on the first active pattern F41, the
second active pattern F42, and the field insulating layer 105.
A second gate electrode G42 may extend in the second
horizontal direction DR2 on the first active pattern F41, the
second active pattern F42, and the field insulating layer 105.
The second gate electrode G42 may be spaced apart from the
first gate electrode G41 in the first horizontal direction DR1.

The gate spacers 411 may extend in the second horizontal
direction DR2 along both sidewalls of each of the first and
second gate electrodes G41 and G42. The gate insulating
layer 412 may be disposed between the field insulating layer
105 and the first and second gate electrodes G41 and G42.
The gate insulating layer 412 may be disposed between the
first gate electrode G41 and the first and second active
patterns F41 and F42. The gate insulating layer 412 may also
be disposed between the second gate electrode G42 and the
first and second active patterns F41 and F42. The gate
insulating layer 412 may also be disposed between the first
and second gate electrodes G41 and G42 and the gate
spacers 411. The capping patterns 413 may extend in the
second horizontal direction DR2 on the first and second gate
electrodes G41 and G42.

The first source/drain region SD41 may be disposed on
both sides of each of the first and second gate electrodes G41
and G42, on the first active pattern F41. The second source/
drain region SD42 may be disposed on both sides of each of
the first and second gate electrodes G41 and G42, on the
second active pattern F42.

It will be understood that, although the terms "first",
"second", "third", and so on may be used herein to illustrate
various elements, components, regions, layers and/or sec-
tions, these elements, components, regions, layers and/or
sections should not be limited by these terms. These terms
are used to distinguish one element, component, region,
layer or section from another element, component, region,
layer or section. Thus, a first element, component, region,
layer or section described below could be termed a second
element, component, region, layer or section, without
departing from the scope of the present disclosure.

In addition, it will also be understood that when a first
element or layer is referred to as being present "on" or
"beneath" a second element or layer, the first element may
be disposed directly on or beneath the second element or
may be disposed indirectly on or beneath the second element
with a third element or layer being disposed between the first
and second elements or layers. It will be understood that
when an element or layer is referred to as being "connected to", "coupled to", or "in contact with" another element or
layer, it may be directly on, connected to, coupled to, or in
contact with the other element or layer, or one or more
intervening elements or layers may be present. In contrast,
when an element is referred to as being "directly coupled,"
"directly connected," or "directly responsive" to, or
"directly on," another element, there are no intervening
elements present.

Further, as used herein, when a layer, film, region, plate,
or the like may be disposed "on" or "on a top" of another
layer, film, region, plate, or the like, the former may directly
contact the latter or still another layer, film, region, plate, or
the like may be disposed between the former and the latter.
As used herein, when a layer, film, region, plate, or the like
is disposed "directly on" or "directly on a top" of another
layer, film, region, plate, or the like, the former directly
contacts the latter and still another layer, film, region, plate,
or the like is not disposed between the former and the latter.
Further, as used herein, when a layer, film, region, plate, or
the like may be disposed "below" or "under" another layer,
film, region, plate, or the like, the former may directly
contact the latter or still another layer, film, region, plate, or
the like may be disposed between the former and the latter.
As used herein, when a layer, film, region, plate, or the like
is disposed "directly below" or "directly under" another
layer, film, region, plate, or the like, the former directly
contacts the latter and still another layer, film, region, plate,
or the like is not disposed between the former and the latter.

Embodiments of the present disclosure have been
described above with reference to the accompanying draw-
ings, but the present disclosure is not limited thereto and
may be implemented in various different forms. It will be
understood that the present disclosure can be implemented
in other specific forms without changing the technical spirit
or gist of the present disclosure. Therefore, it should be
understood that the embodiments set forth herein are illus-
trative in all respects and not limiting.

What is claimed is:

1. A semiconductor device comprising:
a first lower interlayer insulating layer;
an active pattern that extends in a first horizontal direction
on a top surface of the first lower interlayer insulating
layer;
a field insulating layer that extends around the active
pattern on the top surface of the first lower interlayer
insulating layer;
a gate electrode that extends in a second horizontal
direction on the active pattern and the field insulating
layer, wherein the first horizontal direction intersects
with the second horizontal direction;
a source/drain region on the active pattern, wherein the
source/drain region is adjacent a side surface of the gate
electrode;
an upper interlayer insulating layer on the source/drain
region and on the field insulating layer;
a first through via that extends through the upper inter-
layer insulating layer in a vertical direction to a top
surface of the field insulating layer;
a second through via in the field insulating layer, wherein
sidewalls of the second through via are in contact with
the field insulating layer, and wherein the second
through via is connected to the first through via; and
a third through via in the first lower interlayer insulating
layer, wherein the third through via is connected to the
second through via, wherein a width of a top surface of the second through via is greater than a width of a bottom surface of the first through via in the second horizontal direction, wherein a width of a bottom surface of the second through via is greater than a width of a top surface of the third through via in the second horizontal direction, and wherein a width of a middle portion of the second through via between the top surface of the second through via and the bottom surface of the second through via is greater than each of the width of the top surface of the second through via and the width of the bottom surface of the second through via in the second horizontal direction.

2. The semiconductor device of claim 1, wherein the second through via is spaced apart from the active pattern in the second horizontal direction.

3. The semiconductor device of claim 1, wherein each of the first through via, the second through via, and the third through via overlaps with one another in the vertical direction.

4. The semiconductor device of claim 1, wherein the top surface of the second through via is on a same plane as the top surface of the field insulating layer.

5. The semiconductor device of claim 1, wherein a top surface of the first through via is on a same plane as a top surface of the upper interlayer insulating layer.

6. The semiconductor device of claim 1, further comprising:

a source/drain contact in the upper interlayer insulating layer, wherein the source/drain contact is on the side surface of the gate electrode, and wherein the source/drain contact is connected to the source/drain region and the first through via.

7. The semiconductor device of claim 1, further comprising:

a second lower interlayer insulating layer on a bottom surface of the first lower interlayer insulating layer; and a lower wiring layer in the second lower interlayer insulating layer, wherein the lower wiring layer is connected to the third through via.

8. The semiconductor device of claim 1, wherein the first through via includes a first barrier layer along sidewalls of the first through via, wherein the first through via includes a first filling layer between portions of the first barrier layer, wherein the second through via includes a second barrier layer along the sidewalls and the bottom surface of the second through via, wherein the second through via includes a second filling layer between portions of the second barrier layer, and wherein a bottom surface of the first filling layer is in contact with a top surface of the second filling layer.

9. The semiconductor device of claim 8, wherein each of the first barrier layer and the second barrier layer includes a conductive material.

10. The semiconductor device of claim 1, wherein the third through via includes a third barrier layer along sidewalls and the top surface of the third through via, wherein the third through via includes a third filling layer between portions of the third barrier layer, and wherein the third filling layer is spaced apart from the second through via.

11. The semiconductor device of claim 1, wherein the second through via extends around at least a portion of the sidewalls of the third through via.

12. The semiconductor device of claim 1, wherein the first through via includes a first barrier layer along sidewalls and the bottom surface of the first through via, wherein the first through via includes a first filling layer between portions of the first barrier layer, wherein the second through via includes a second barrier layer along the sidewalls and the top surface of the second through via, wherein the second through via includes a second filling layer between portions of the second barrier layer, wherein the third through via includes a third barrier layer along sidewalls of the third through via, wherein the third through via includes a third filling layer between portions of the third barrier layer, wherein a top surface of the second filling layer is spaced apart from the first barrier layer, and wherein a bottom surface of the second filling layer is in contact with a top surface of the third filling layer.

13. A semiconductor device comprising:

a first lower interlayer insulating layer;

an active pattern that extends in a first horizontal direction on a top surface of the first lower interlayer insulating layer;

a field insulating layer that extends around sidewalls of the active pattern on the top surface of the first lower interlayer insulating layer;

a gate electrode that extends in a second horizontal direction on the active pattern and the field insulating layer, wherein the first horizontal direction intersects with the second horizontal direction;

a source/drain region on the active pattern, wherein the source/drain region is adjacent a side surface of the gate electrode;

an upper interlayer insulating layer on the source/drain region and on the field insulating layer;

a source/drain contact in the upper interlayer insulating layer, wherein the source/drain contact is adjacent the side surface of the gate electrode, and wherein the source/drain contact is connected to the source/drain region;

a first through via that extends through the upper interlayer insulating layer in a vertical direction to a top surface of the field insulating layer, wherein the first through via is connected to the source/drain contact; and a second through via in the field insulating layer, wherein the second through via is spaced apart from the active pattern in the second horizontal direction, and wherein the second through via is connected to the first through via, wherein a width of a top surface of the second through via is greater than a width of a bottom surface of the first through via in the second horizontal direction, wherein a width of a middle portion of the second through via is greater than each of the width of the top surface of the second through via and a width of a bottom surface of the second through via in the second horizontal direction, and wherein the middle portion of the second through via is between the top surface of the second through via and the bottom surface of the second through via.

14. The semiconductor device of claim 13, further comprising:

a third through via in the first lower interlayer insulating layer, wherein the third through via is connected to the second through via, and wherein a width of a top surface of the third through via is less than the width of the bottom surface of the second through via in the second horizontal direction.

15. The semiconductor device of claim 14, further comprising:

a second lower interlayer insulating layer on a bottom surface of the first lower interlayer insulating layer; and a lower wiring layer in the second lower interlayer insulating layer, wherein the lower wiring layer is connected to the third through via.

16. The semiconductor device of claim 14, wherein the top surface of the third through via is farther than the top surface of the first lower interlayer insulating layer from a bottom surface of the first lower interlayer insulating layer in the vertical direction.

17. The semiconductor device of claim 14, wherein the second through via and the third through via form a unitary structure.

18. The semiconductor device of claim 13, wherein at least a portion of the bottom surface of the second through via is in contact with the top surface of the first lower interlayer insulating layer.

19. The semiconductor device of claim 13, wherein the first through via and the second through via form a unitary structure.

20. A semiconductor device comprising:

a first lower interlayer insulating layer;

an active pattern that extends in a first horizontal direction on a top surface of the first lower interlayer insulating layer;

a field insulating layer that extends around sidewalls of the active pattern on the top surface of the first lower interlayer insulating layer;

a gate electrode extending in a second horizontal direction on the active pattern and the field insulating layer, wherein the first horizontal direction intersects with the second horizontal direction;

a source/drain region on the active pattern and adjacent a side surface of the gate electrode;

an upper interlayer insulating layer on the source/drain region and on the field insulating layer;

a source/drain contact in the upper interlayer insulating layer, wherein the source/drain contact is adjacent the side surface of the gate electrode, and wherein the source/drain contact is connected to the source/drain region;

a first through via that extends through the upper interlayer insulating layer in a vertical direction a top surface of the field insulating layer, wherein the first through via is connected to the source/drain contact, and wherein a top surface of the first through via is on a same plane as a top surface of the upper interlayer insulating layer;

a second through via in the field insulating layer, wherein the second through via is spaced apart from the active pattern in the second horizontal direction, and wherein the second through via is connected to the first through via;

a third through via in the first lower interlayer insulating layer, wherein the third through via is connected to the second through via;

a second lower interlayer insulating layer on a bottom surface of the first lower interlayer insulating layer; and a lower wiring layer in the second lower interlayer insulating layer, wherein the lower wiring layer is connected to the third through via, wherein the first through via and the second through via form a unitary structure, wherein a width of a top surface of the second through via is greater than a width of a bottom surface of the first through via in the second horizontal direction, wherein a width of a bottom surface of the second through via is greater than a width of a top surface of the third through via in the second horizontal direction, wherein a width of a middle portion of the second through via is greater than each of the width of the top surface of the second through via and the width of the bottom surface of the second through via in the second horizontal direction, and wherein the middle portion of the second through via is between the top surface of the second through via and the bottom surface of the second through via.

* * * * *